(12) United States Patent
Hsiung et al.

(10) Patent No.: US 11,942,371 B2
(45) Date of Patent: Mar. 26, 2024

(54) ETCH PROFILE CONTROL OF VIA OPENING

(71) Applicant: TAIWAN SEMICONDUCTOR MANUFACTURING CO., LTD., Hsinchu (TW)

(72) Inventors: Te-Chih Hsiung, Taipei (TW); Jyun-De Wu, New Taipei (TW); Peng Wang, Hsinchu (TW); Huan-Just Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 37 days.

(21) Appl. No.: 17/225,798

(22) Filed: Apr. 8, 2021

(65) Prior Publication Data

US 2022/0102219 A1 Mar. 31, 2022

Related U.S. Application Data

(60) Provisional application No. 63/084,992, filed on Sep. 29, 2020.

(51) Int. Cl.
*H01L 21/8234* (2006.01)
*H01L 21/768* (2006.01)
(Continued)

(52) U.S. Cl.
CPC ........... *H01L 21/823475* (2013.01); *H01L 21/76802* (2013.01); *H01L 21/76877* (2013.01);
(Continued)

(58) Field of Classification Search
CPC ....... H01L 21/823475; H01L 21/76802; H01L 21/76877; H01L 23/5226; H01L 29/401
See application file for complete search history.

(56) References Cited

U.S. PATENT DOCUMENTS

| 6,335,293 B1* | 1/2002 | Luo | H01J 37/3244 |
| | | | 715/825 |
| 8,785,283 B2* | 7/2014 | Chen | H01L 23/485 |
| | | | 438/620 |

(Continued)

FOREIGN PATENT DOCUMENTS

| KR | 20020025351 A | 4/2002 |
| KR | 20190109352 A | 9/2019 |

(Continued)

*Primary Examiner* — Bac H Au
(74) *Attorney, Agent, or Firm* — Maschoff Brennan

(57) ABSTRACT

A method comprises forming a gate dielectric cap over a gate structure; forming source/drain contacts over the semiconductor substrate, with the gate dielectric cap laterally between the source/drain contacts; depositing an etch-resistant layer over the gate dielectric cap; depositing a contact etch stop layer over the etch-resistant layer and an interlayer dielectric (ILD) layer over the contact etch stop layer; performing a first etching process to form a via opening extending through the ILD layer and terminating prior to reaching the etch-resistant layer; performing a second etching process to deepen the via opening such that one of the source/drain contacts is exposed, wherein the second etching process etches the etch-resistant layer at a slower etch rate than etching the contact etch stop layer; and depositing a metal material to fill the deepened via opening.

20 Claims, 59 Drawing Sheets

(51) Int. Cl.
  *H01L 23/522* (2006.01)
  *H01L 29/40* (2006.01)
  *H01L 29/423* (2006.01)
  *H01L 29/786* (2006.01)
(52) U.S. Cl.
  CPC ........ *H01L 23/5226* (2013.01); *H01L 29/401* (2013.01); *H01L 29/42392* (2013.01); *H01L 29/78696* (2013.01)

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 10,121,873 | B2 | 11/2018 | Liao et al. |
| 10,468,297 | B1* | 11/2019 | Tung ................ H01L 21/76832 |
| 10,685,873 | B2 | 6/2020 | Tung et al. |
| 10,998,421 | B2 | 5/2021 | Chang et al. |
| 11,145,544 | B2 | 10/2021 | Kelly |
| 11,227,918 | B2 | 1/2022 | Liu et al. |
| 11,488,859 | B2* | 11/2022 | Yeh ................ H01L 21/823431 |
| 11,581,218 | B2* | 2/2023 | Hsiung ............ H01L 21/76825 |
| 2001/0005634 | A1* | 6/2001 | Kajiwara .......... H01L 21/76897 |
| | | | 257/E21.654 |
| 2002/0142610 | A1* | 10/2002 | Chien ............... H01L 21/76897 |
| | | | 257/E21.507 |
| 2005/0167839 | A1* | 8/2005 | Wetzel ................ H01L 23/5329 |
| | | | 257/E21.579 |
| 2009/0137127 | A1* | 5/2009 | Hoshi ................ H01L 21/31138 |
| | | | 700/121 |
| 2009/0163029 | A1* | 6/2009 | Tsutsumi .......... H01L 21/31116 |
| | | | 257/E21.577 |
| 2010/0173491 | A1* | 7/2010 | Iba .................... H01L 21/31144 |
| | | | 257/E21.585 |
| 2016/0104645 | A1* | 4/2016 | Hung .................. H01L 27/0886 |
| | | | 438/586 |
| 2016/0111325 | A1* | 4/2016 | JangJian .......... H01L 21/76802 |
| | | | 257/774 |
| 2016/0190287 | A1* | 6/2016 | Hsu .................... H01L 29/66795 |
| | | | 438/299 |
| 2017/0053804 | A1* | 2/2017 | Lu ..................... H01L 21/76832 |
| 2017/0288031 | A1 | 10/2017 | Ho et al. |
| 2018/0040733 | A1* | 2/2018 | Chang ............... H01L 29/66795 |
| 2018/0138176 | A1* | 5/2018 | Shen .................. H01L 29/0847 |
| 2018/0261596 | A1* | 9/2018 | Jun ..................... H01L 29/0653 |
| 2018/0315648 | A1* | 11/2018 | Ke ..................... H01L 21/76811 |
| 2019/0035638 | A1* | 1/2019 | Fan .................... H01L 21/0338 |
| 2019/0229062 | A1* | 7/2019 | Shin .................. H01L 21/76804 |
| 2019/0305107 | A1 | 10/2019 | Chen et al. |
| 2019/0333915 | A1 | 10/2019 | Lee et al. |
| 2020/0135871 | A1 | 4/2020 | Tsai et al. |
| 2020/0144105 | A1 | 5/2020 | You et al. |
| 2022/0102204 | A1* | 3/2022 | Hsiung ............. H01L 21/76831 |
| 2022/0102211 | A1* | 3/2022 | Hsiung ............. H01L 29/66795 |
| 2022/0102507 | A1* | 3/2022 | Hsiung ............. H01L 29/0665 |
| 2022/0102511 | A1* | 3/2022 | Hsiung ............. H01L 29/66795 |

FOREIGN PATENT DOCUMENTS

| | | |
|---|---|---|
| KR | 20200008532 A | 1/2020 |
| TW | 201816859 | 5/2018 |
| TW | 202008468 | 2/2020 |
| TW | 202017034 A | 5/2020 |

\* cited by examiner

ETCH PROFILE CONTROL OF VIA OPENING

PRIORITY CLAIM AND CROSS-REFERENCE

This application claims priority to U.S. Provisional Application Ser. No. 63/084,992, filed Sep. 29, 2020, which is herein incorporated by reference.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
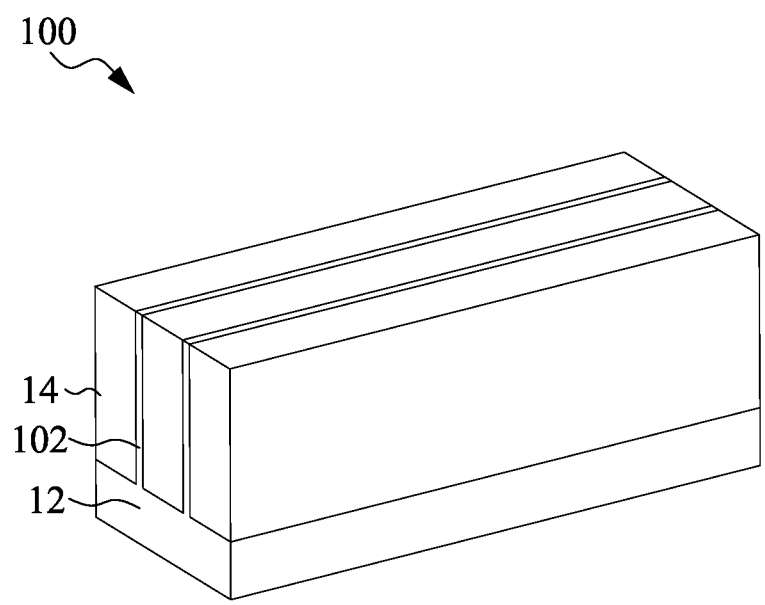
FIGS. 1-19B illustrate perspective views and cross-sectional views of intermediate stages in the formation of an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating transistors (e.g., fin field-effect transistors (FinFETs), gate-all-around (GAA) transistors) and source/drain vias over source/drain contacts of the transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFETs, on account of their fin-like structure. A FinFET has a gate structure formed on three sides of a channel region (e.g., wrapping around an upper portion of a channel region in a semiconductor fin). Also presented herein are embodiments of a type of multi-gate transistor referred to as a GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration.

After a front-end-of-line (FEOL) processing for fabricating transistors is completed, source/drain contacts are formed over source/drain regions of the transistors. Source/drain vias are then formed over the source/drain contacts to electrically connecting the source/drain contacts to subsequently formed interconnect metal lines. Formation of the source/drain vias generally includes depositing an interlayer dielectric (ILD) layer over the source/drain contacts, forming via openings extending through the ILD layer by using anisotropic etching, and then depositing one or more metal layers in the via openings to serve as the source/drain vias. In order to prevent excessively over-etching the source/drain contacts during the anisotropic etching process, an additional etch stop layer (also called middle contact etch stop layer (MCESL)) is formed over the source/drain contacts prior to formation of the ILD layer. The MCESL has a different etch selectivity than the ILD layer, and thus the MCESL can slow down the etching process of forming via openings, which in turn prevents excessively over-etching the source/drain contacts.

After the via openings are etched through the ILD layer, another etching process (sometimes called liner removal (LRM) etching because the MCESL may serve as a liner lining top surfaces of source/drain contacts) is performed to punch through the MCESL. The etching duration time of LRM etching is set to allow a controlled over-etch amount so as to break through the MCESL in every target location throughout the wafer. However, the LRM etching may result in a tiger tooth-like recess in a gate dielectric cap next to the source/drain contact. This is because the gate dielectric cap and the MCESL are both made of nitride-based materials (e.g., silicon nitride) without significant etch selectivity. The tiger tooth-like recess in the gate dielectric cap may cause an increased risk of a leakage current (e.g., leakage current from source/drain via to gate structure and/or gate contact). Therefore, the present disclosure in various embodiments provides an additional oxide-based layer on the gate dielectric caps. The oxide layer has a different material composition and hence a different etch selectivity than the nitride-based gate dielectric caps and/or MCESL. The oxide-based layer thus allows for slowing down the LRM etching process when via openings reach the oxide-based layer. Slowing down the LRM etching can prevent the tiger tooth-like pattern in the via opening, which in turn reduces the risk of leakage current. Moreover, slowing down the LRM etching allows for forming via openings with a more vertical profile, which in turn results in an increased contact area and hence a decreased contact resistance between the source/drain vias and the underlying source/drain contacts.

FIGS. 1 through 19B illustrate perspective views and cross-sectional views of intermediate stages in the formation of an integrated circuit structure 100 in accordance with some embodiments of the present disclosure. The formed transistors may include a p-type transistor (such as a p-type FinFET) and an n-type transistor (such as an n-type FinFET) in accordance with some exemplary embodiments. Throughout the various views and illustrative embodiments, like reference numbers are used to designate like elements. It is understood that additional operations can be provided before, during, and after the processes shown by FIGS. 1-19B, and some of the operations described below can be replaced or eliminated, for additional embodiments of the method. The order of the operations/processes may be interchangeable.

FIG. 1 illustrates a perspective view of an initial structure. The initial structure includes a substrate 12. The substrate 12 may be a semiconductor substrate (also called wafer in some embodiments), which may be a silicon substrate, a silicon germanium substrate, or a substrate formed of other semiconductor materials. In accordance with some embodiments of the present disclosure, the substrate 12 includes a bulk silicon substrate and an epitaxy silicon germanium (SiGe) layer or a germanium layer (without silicon therein) over the bulk silicon substrate. The substrate 12 may be doped with a p-type or an n-type impurity. Isolation regions 14 such as shallow trench isolation (STI) regions may be formed to extend into the substrate 12. The portions of substrate 12 between neighboring STI regions 14 are referred to as semiconductor strips 102.

STI regions 14 may include a liner oxide (not shown). The liner oxide may be formed of a thermal oxide formed through a thermal oxidation of a surface layer of substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 14 may also include a dielectric material over the liner oxide, and the dielectric material may be formed using flowable chemical vapor deposition (FCVD), spin-on coating, or the like.

Figure 2:
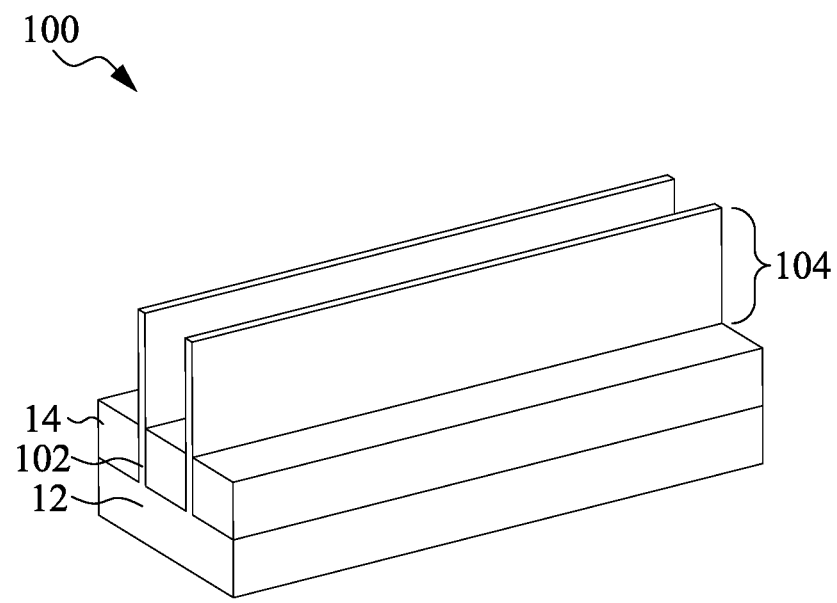

Referring to FIG. 2, the STI regions 14 are recessed, so that the top portions of semiconductor strips 102 protrude higher than the top surfaces of the neighboring STI regions 14 to form protruding fins 104. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the STI regions 14 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 104 may also be replaced with materials different from that of substrate 12. For example, if the protruding fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the protruding fins 104 serve for p-type transistors, the protruding fins 104 may be formed of Si, SiGe, SiGeB, Ge, or a III-V compound semiconductor such as InSb, GaSb, InGaSb, or the like.

Figure 3A:
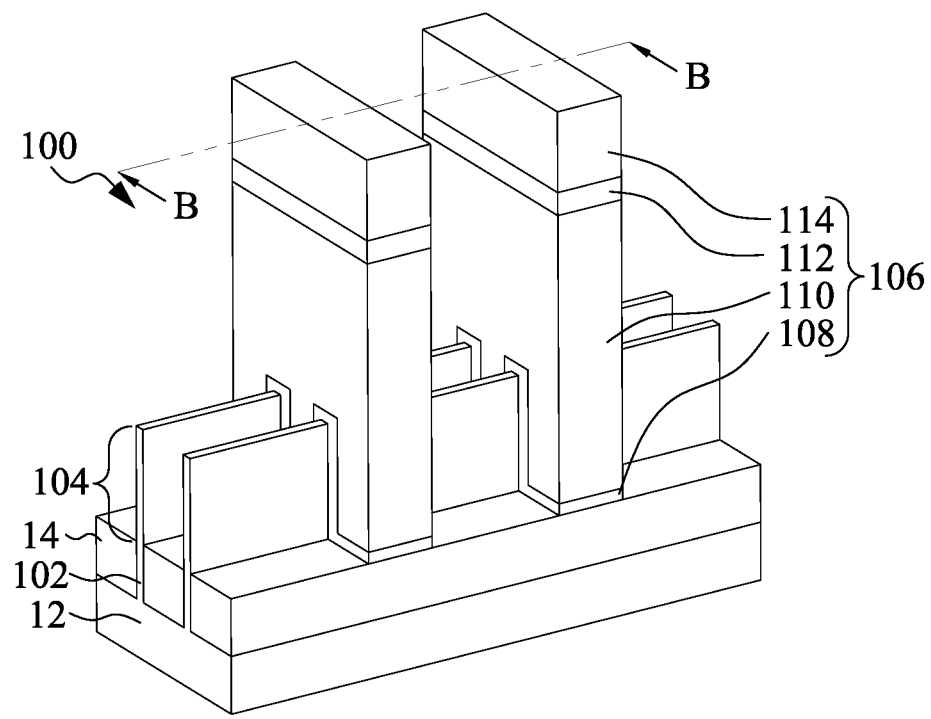
Figure 3B:
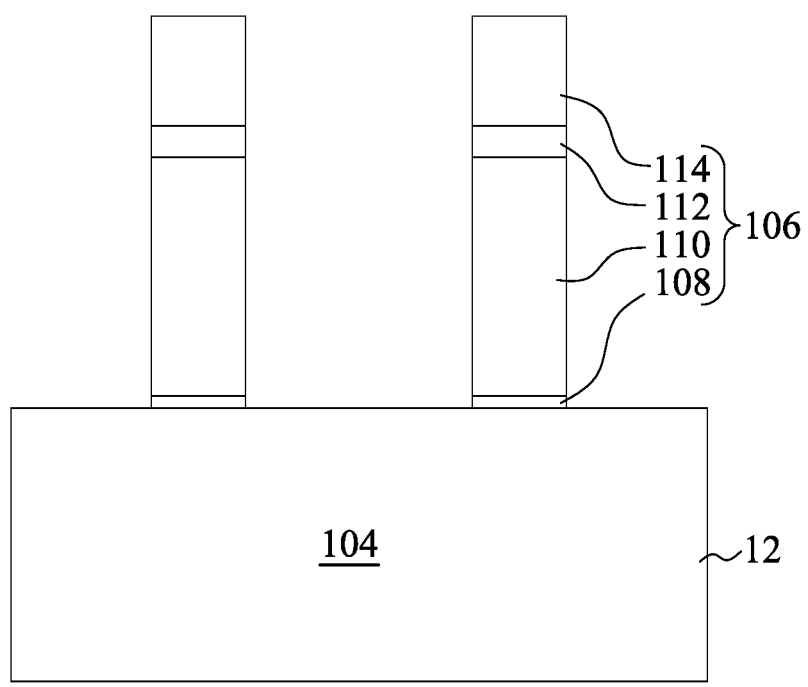

Referring to FIGS. 3A and 3B, dummy gate structures 106 are formed on the top surfaces and the sidewalls of protruding fins 104. FIG. 3B illustrates a cross-sectional view obtained from a vertical plane containing line B-B in FIG. 3A. Formation of the dummy gate structures 106 includes depositing in sequence a gate dielectric layer and a dummy gate electrode layer across the fins 104, followed by patterning the gate dielectric layer and the dummy gate electrode layer. As a result of the patterning, the dummy gate structure 106 includes a gate dielectric layer 108 and a dummy gate electrode 110 over the gate dielectric layer 108. The gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 110 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of protruding fins 104. Dummy gate structures 106 may have lengthwise directions perpendicular to the lengthwise directions of the respective protruding fins 104.

A mask pattern may be formed over the dummy gate electrode layer to aid in the patterning. In some embodiments, a hard mask pattern including bottom masks 112 over a blanket layer of poly silicon and top masks 114 over the bottom masks 112. The hard mask pattern is made of one or more layers of $SiO_2$, SiCN, SiON, $Al_2O_3$, SiN, or other suitable materials. In certain embodiments, the bottom masks 112 include silicon nitride, and the top masks 114 include silicon oxide. By using the mask pattern as an etching mask, the dummy electrode layer is patterned into the dummy gate electrodes 110, and the blanket gate dielectric layer is patterned into the gate dielectric layers 108.

Figure 4:
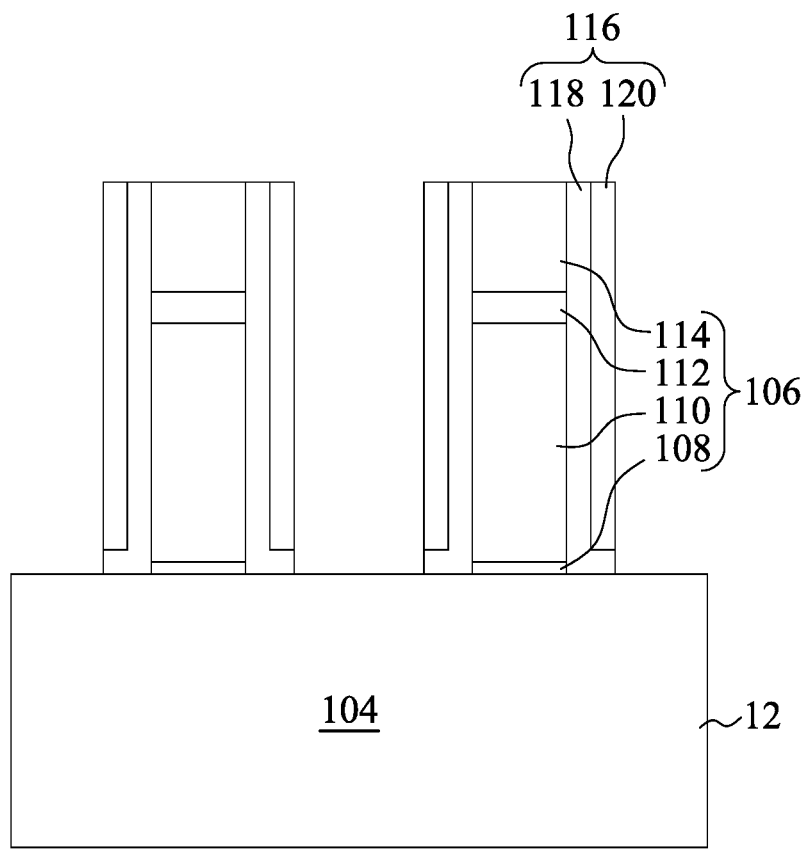

Next, as illustrated in FIG. 4, gate spacers 116 formed on sidewalls of the dummy gate structures 106. In some embodiments of the gate spacer formation step, a spacer material layer is deposited on the substrate 12. The spacer material layer may be a conformal layer that is subsequently etched back to form gate sidewall spacers 116. In some embodiments, the spacer material layer includes multiple layers, such as a first spacer layer 118 and a second spacer layer 120 formed over the first spacer layer 118. The first and second spacer layers 118 and 120 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 118 and 120 may be formed by depositing in sequence two different dielectric materials over the dummy gate structures 106 using processes such as, CVD process, a subatmospheric CVD (SACVD) process, a flowable CVD process, an ALD process, a PVD process, or other suitable process. An anisotropic etching process is then performed on the deposited spacer layers 118 and 120 to expose portions of the fins 104 not covered by the dummy gate structures 106 (e.g., in source/drain regions of the fins 104). Portions of the spacer layers 118 and 120 directly above the dummy gate structures 106 may be completely removed by this anisotropic etching process. Portions of the spacer layer 118 and 120 on sidewalls of the dummy gate structures 106 may remain, forming gate sidewall spacers, which are denoted as the gate spacers 116, for the sake of simplicity. In some embodiments, the first spacer layer 118 is formed of silicon oxide that has a lower dielectric constant than silicon nitride, and the second spacer layer 120 is formed of silicon nitride that has a higher etch resistance against subsequent etching processing (e.g., etching source/drain recesses in the fin 104) than silicon oxide. In some embodiments, the gate sidewall spacers 116 may be used to offset subsequently formed doped regions, such as source/drain regions. The gate spacers 116 may further be used for designing or modifying the source/drain region profile.

Figure 5:
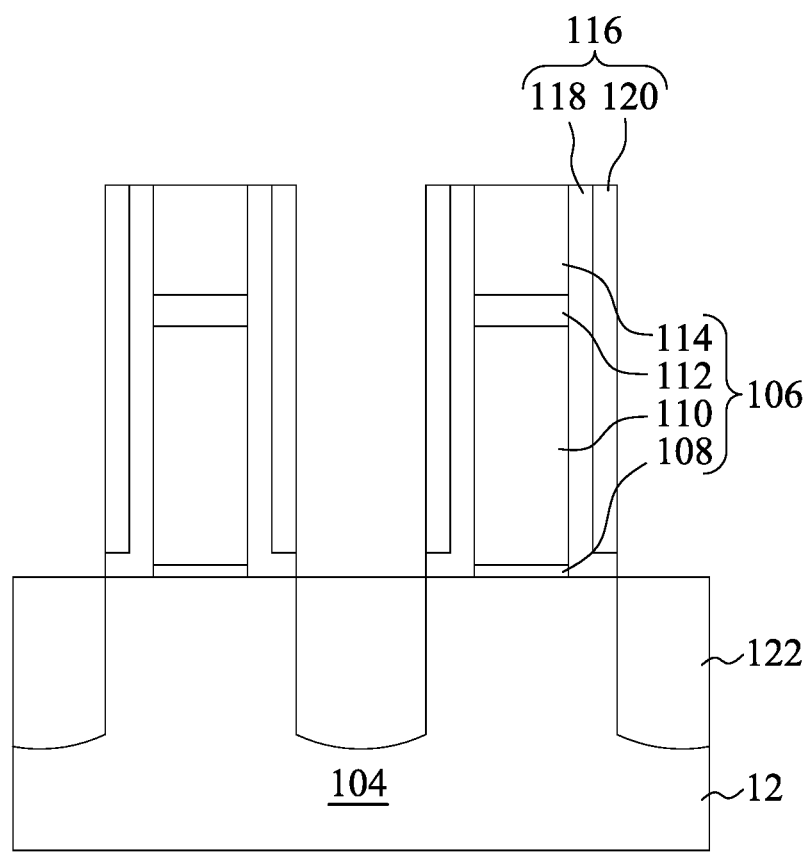

After formation of the gate sidewall spacers 116 is completed, source/drain epitaxial structures 122 are formed on source/drain regions of the fin 104 that are not covered by the dummy gate structures 106 and the gate sidewall spacers 116. The resulting structure is illustrated in FIG. 5. In some embodiments, formation of the source/drain epitaxial structures 122 includes recessing source/drain regions of the fin 104, followed by epitaxially growing semiconductor materials in the recessed source/drain regions of the fin 104.

The source/drain regions of the fin 104 can be recessed using suitable selective etching processing that attacks the semiconductor fin 104, but hardly attacks the gate spacers 116 and the top masks 114 of the dummy gate structures 106. For example, recessing the semiconductor fin 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a wet chemical etch, such as ammonium peroxide mixture (APM), $NH_4OH$, tetramethylammonium hydroxide (TMAH), combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the semiconductor fin 104. During the epitaxial growth process, the gate spacers 116 limit the one or more epitaxial materials to source/drain regions in the fin 104. In some embodiments, the lattice constants of the epitaxial structures 122 are different from the lattice constant of the semiconductor fin 104, so that the channel region in the fin 104 and between the epitaxial structures 122 can be strained or stressed by the epitaxial structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 104.

In some embodiments, the source/drain epitaxial structures 122 may include Ge, Si, GaAs, AlGaAs, SiGe, GaAsP, SiP, or other suitable material. The source/drain epitaxial structures 122 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 6:
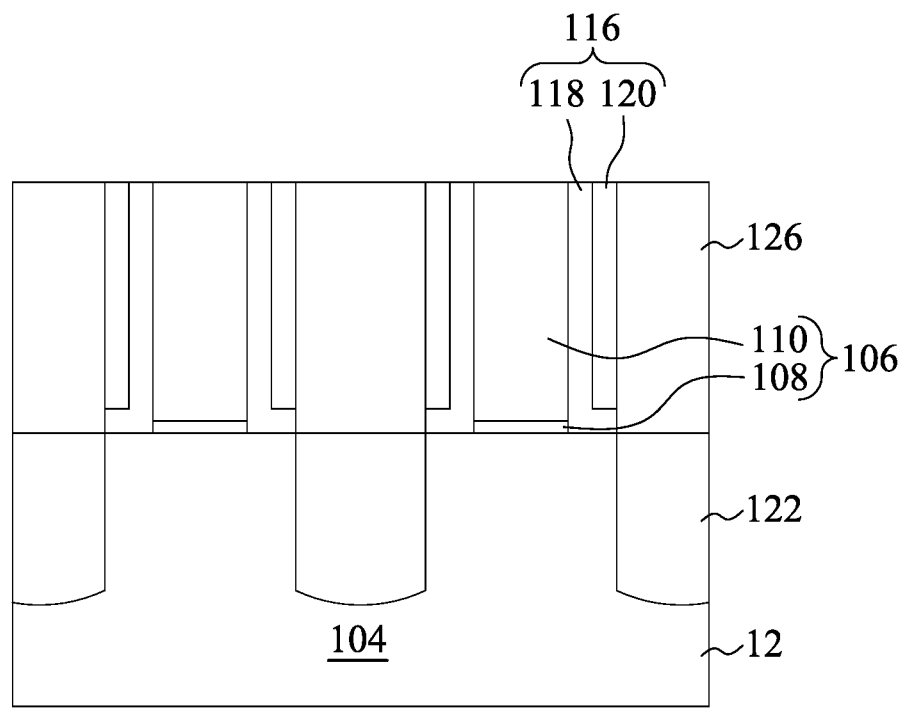

Next, in FIG. 6, an interlayer dielectric (ILD) layer 126 is formed on the substrate 12. In some embodiments, a contact etch stop layer (CESL) is optionally formed prior to forming the ILD layer 126. In some examples, the CESL includes a silicon nitride layer, silicon oxide layer, a silicon oxynitride layer, and/or other suitable materials having a different etch selectivity than the ILD layer 126. The CESL may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126. For example, a planarization process includes a chemical mechanical planarization (CMP) process which removes portions of the ILD layer 126 (and CESL layer, if present) overlying the dummy gate structures 106. In some embodiments, the CMP process also removes hard mask layers 112, 114 (as shown in FIG. 5) and exposes the dummy gate electrodes 110.

Figure 7:
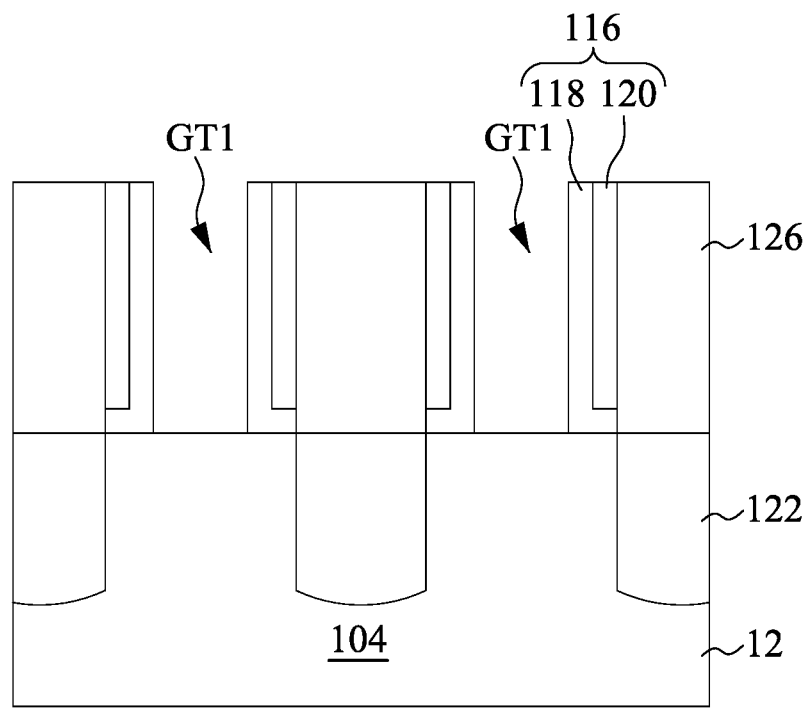

Next, as illustrates in FIG. 7, the remaining dummy gate structures 106 are removed, resulting in gate trenches GT1 between corresponding gate sidewall spacers 116. The dummy gate structures 106 are removed using a selective etching process (e.g., selective dry etching, selective wet etching, or a combination thereof) that etches materials in the dummy gate structures 106 at a faster etch rate than it etches other materials (e.g., gate sidewall spacers 116 and/or the ILD layer 126).

Figure 8:
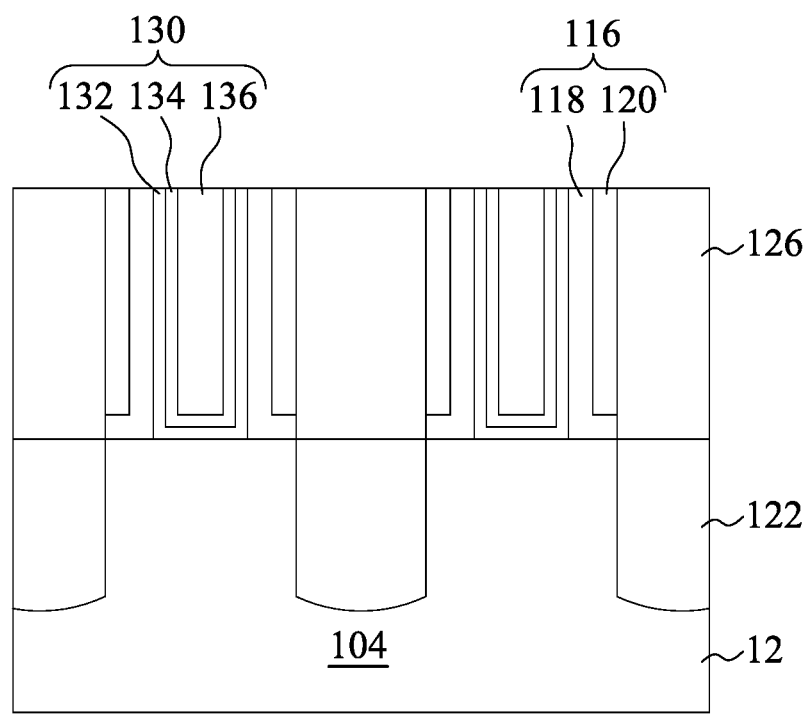

Thereafter, replacement gate structures 130 are respectively formed in the gate trenches GT1, as illustrated in FIG. 8. The gate structures 130 may be the final gates of FinFETs. The final gate structures each may be a high-k/metal gate stack, however other compositions are possible. In some embodiments, each of the gate structures 130 forms the gate associated with the three-sides of the channel region provided by the fin 104. Stated another way, each of the gate structures 130 wraps around the fin 104 on three sides. In various embodiments, the high-k/metal gate structure 130 includes a gate dielectric layer 132 lining the gate trench GT1, a work function metal layer 134 formed over the gate dielectric layer 132, and a fill metal 136 formed over the work function metal layer 134 and filling a remainder of gate trenches GT1. The gate dielectric layer 132 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 134 and/or fill metal layer 136 used within high-k/metal gate structures 130 may include a metal, metal alloy, or metal silicide. Formation of the high-k/metal gate structures 130 may include multiple deposition processes to form various gate materials, one or more liner layers, and one or more CMP processes to remove excessive gate materials.

In some embodiments, the interfacial layer of the gate dielectric layer 132 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 132 may include hafnium oxide ($HfO_2$). Alternatively, the gate dielectric layer 132 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 134 may include work function metals to provide a suitable work function for the high-k/metal gate structures 130. For an n-type FinFET, the work function metal layer 134 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 134 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 136 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 9:
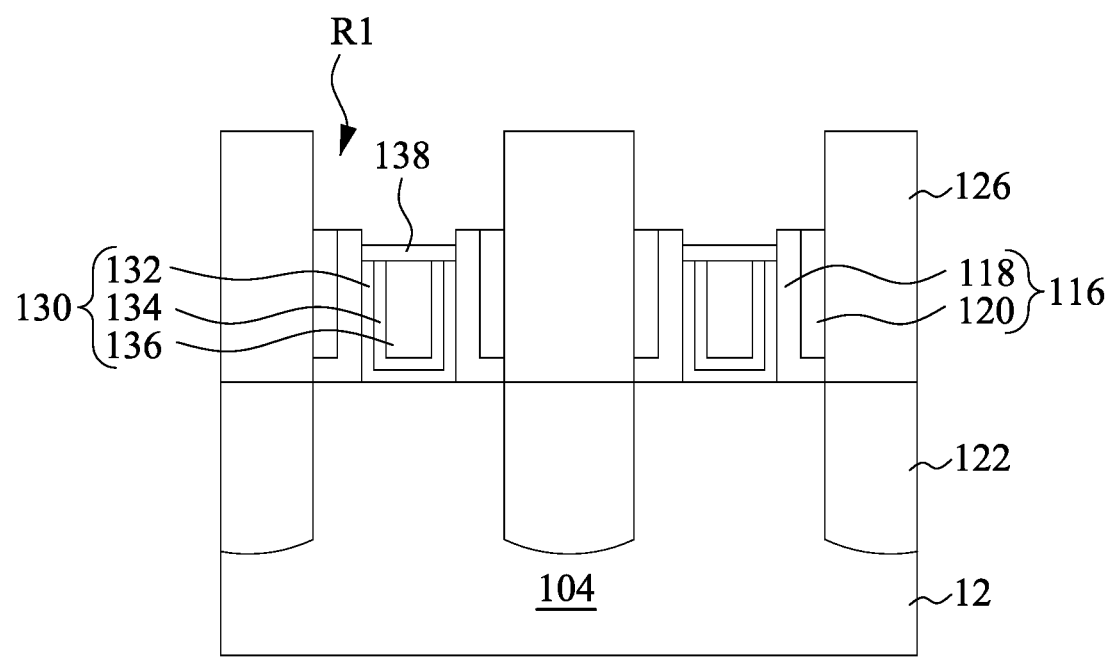

Reference is then made to FIG. 9. An etching back process is performed to etch back the replacement gate structures 130 and the gate spacers 116, resulting in recesses R1 over the etched-back gate structures 130 and the etched-back gate spacers 116. In some embodiments, because the materials of the replacement gate structures 130 have a different etch selectivity than the gate spacers 116, a first selective etching process may be initially performed to etch back the replacement gate structures 130 to lower the replacement gate structures 130 to fall below top ends of the gate spacers 116. Then, a second selective etching process may be performed to lower the gate spacers 116. As a result, the top surfaces of the replacement gate structures 130 may be at a different level than the top surfaces of the gate spacers 116. For example, in the depicted embodiment as illustrated in FIG. 9, the replacement gate structures 130's top surfaces are lower than the top surfaces of the gate spacers 116. However, in some other embodiments, the top surfaces of the replacement gate structures 130 may be level with or higher than the top surfaces of the gate spacers 116.

Then, metal caps 138 are formed respectively atop the replacement gate structures 130 by suitable process, such as CVD or ALD. In some embodiments, the metal caps 138 are formed on the replacement gate structures 130 using a bottom-up approach. For example, the metal caps 138 are selectively grown on the metal surface, such as the work function metal layer 134 and the fill metal 136, and thus the gate spacers 116 are substantially free from the growth of the metal caps 138. The metal caps 138 may be, by way of example and not limitation, substantially fluorine-free tungsten (FFW) films having an amount of fluorine contaminants less than 5 atomic percent and an amount of chlorine contaminants greater than 3 atomic percent. The FFW films or the FFW-comprising films may be formed by ALD or CVD using one or more non-fluorine based tungsten precursors such as, but not limited to, tungsten pentachloride ($WCl_5$), tungsten hexachloride ($WCl_6$). In some embodiments, portions of the metal caps 138 may extend over the gate dielectric layer 132, such that the metal caps 138 may also cover the exposed surface of the gate dielectric layers 132. Since the metal caps 138 are formed in a bottom-up manner, the formation thereof may be simplified by, for example, reducing repeated etching back processes which are used to remove unwanted metal materials resulting from conformal growth.

In some embodiments where the metal caps 138 are formed using a bottom-up approach, the growth of the metal caps 138 has a different nucleation delay on metal surfaces (i.e., metals in gate structures 130) as compared to dielectric surfaces (i.e., dielectrics in gate spacers 116). The nucleation delay on the metal surface is shorter than on the dielectric surface. The nucleation delay difference thus allows for selective growth on the metal surface. The present disclosure in various embodiments utilizes such selectivity to allow metal growth from gate structures 130 while inhibiting the metal growth from the spacers 116. As a result, the deposition rate of the metal caps 138 on the gate structures 130 is faster than on the spacers 116. In some embodiments, the resulting metal caps 138 have top surfaces lower than top surfaces of the etched-back gate spacers 116. However, in some embodiments, the top surfaces of the metal caps 138 may be level with or higher than the top surfaces of the etched-back gate spacers 116.

Figure 10:
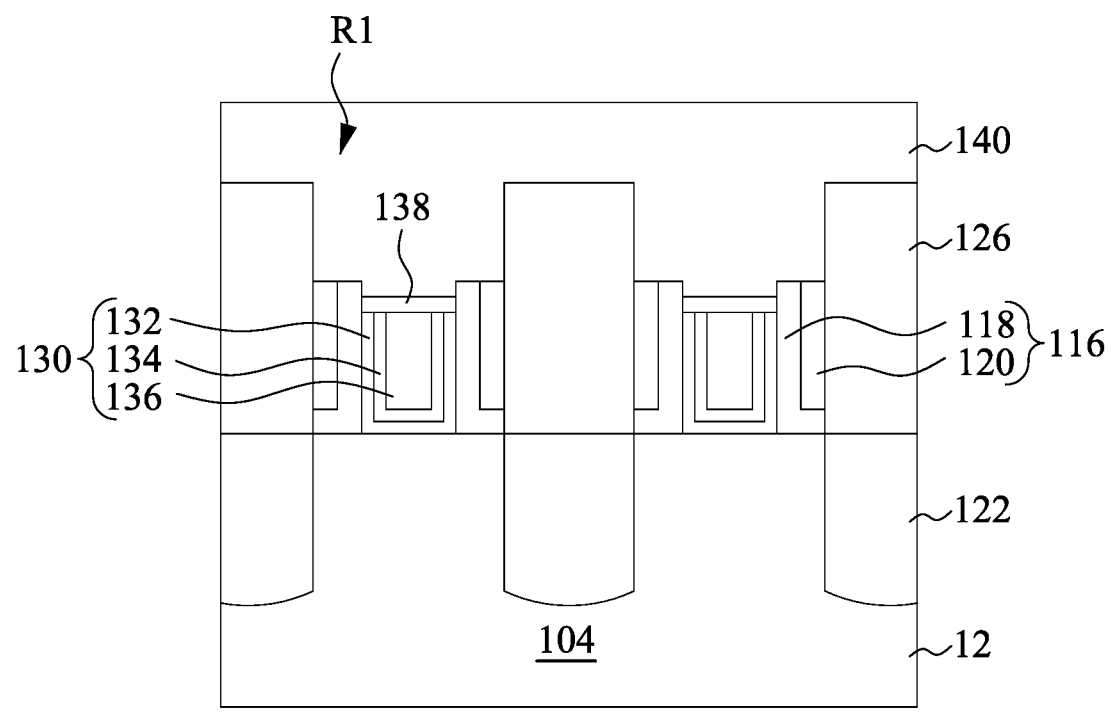
Figure 11:
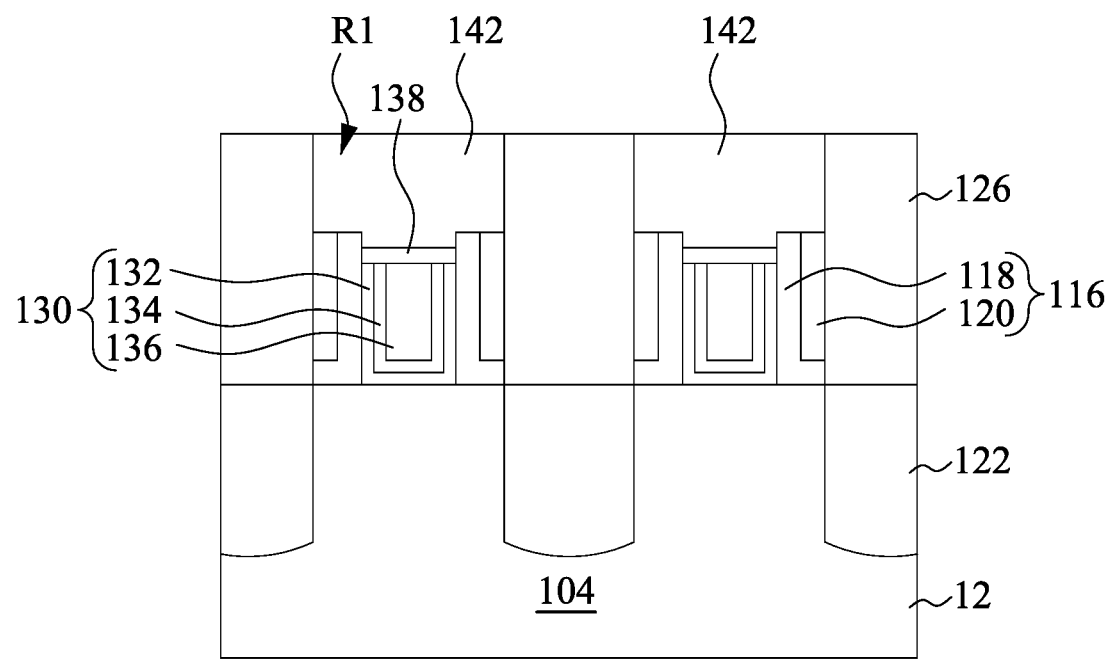

Next, a dielectric cap layer 140 is deposited over the substrate 12 until the recesses R1 are overfilled, as illustrated in FIG. 10. The dielectric cap layer 140 includes SiN, SiC, SiCN, SiON, SiCON, a combination thereof or the like, and is formed by a suitable deposition technique such as CVD, plasma-enhanced CVD (PECVD), ALD, remote plasma ALD (RPALD), plasma-enhanced ALD (PEALD), a combination thereof or the like. A CMP process is then performed to remove the cap layer outside the recesses R1, leaving portions of the dielectric cap layer 140 in the recesses R1 to serve as gate dielectric caps 142. The resulting structure is illustrated in FIG. 11.

Figure 12:
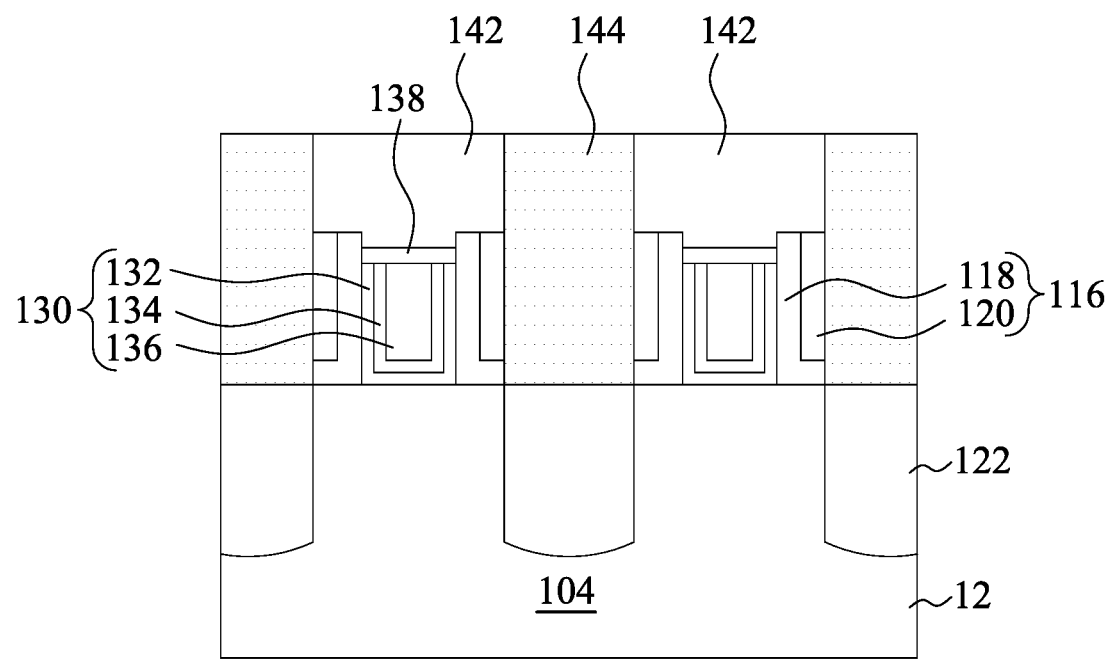

Referring to FIG. 12, source/drain contacts 144 are formed extending through the ILD layer 126 (and CESL, if present). Formation of the source/drain contacts 144 includes, by way of example and not limitation, performing one or more etching processes to form contact openings extending though the ILD layer 126 to expose the source/drain epitaxial structures 122, depositing one or more metal materials overfilling the contact openings, and then performing a CMP process to remove excessive metal materials outside the contact openings. In some embodiments, the one or more etching processes are selective etching that etches the ILD layer 126 at a faster etch rate than etching the gate dielectric caps 142 and the gate spacers 116. As a result, the selective etching is performed using the dielectric caps 142 and the gate spacers 116 as an etch mask, such that the contact openings and hence source/drain contacts 144 are formed self-aligned to the source/drain epitaxial structures 122 without using an additional photolithography process. In that case, the gate dielectric caps 142 allowing for forming the source/drain contacts 144 in a self-aligned manner can be called self-aligned-contact (SAC) caps 142.

Figure 13:
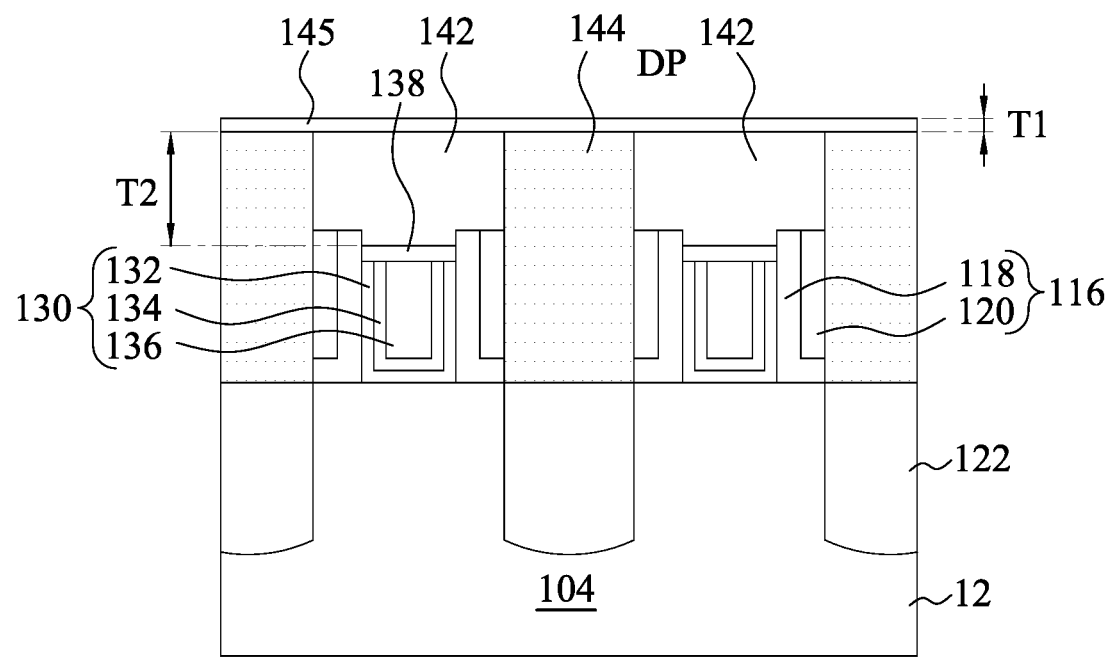

In FIG. 13, an etch-resistant layer 145 is formed over the gate dielectric caps 142 and the source/drain contacts 144. The etch-resistant layer 145 may be formed by an ALD process, a PECVD process, and/or other suitable deposition processes. In some embodiments, the etch-resistant layer 145 is made of a material different from a material of the gate dielectric caps 142 and a material of a subsequently formed MCESL. For example, the gate dielectric caps 142 and the subsequently formed MCESL are made of the same material (e.g. silicon nitride) without etch selectivity therebetween, and the etch-resistant layer 145 is made of an oxide-based material or other suitable dielectric materials different from silicon nitride. The oxide-based material includes, by way of example and not limitation, silicon oxide ($SiO_x$), TEOS (tetraethoxysilane; tetraethylorthosilicate; tetraethelorthosilicate; tetrethoxysilicide) oxide, a silicon-rich silicon oxide, or another suitable oxide-based dielectric materials. A silicon-rich silicon oxide is a silicon oxide which includes, for example, more than 50% silicon. Because of the material difference, the etch-resistant layer 145 has a different etch selectivity than the subsequently formed MCESL and the gate dielectric caps 142. As a result, the etch-resistant layer 145 can have a slower etch rate in a following LRM etching process than both the gate dielectric caps 142 and the MCESL, which allows for slowing down the LRM etching process, as will be discussed in greater detail below.

In some embodiments, the etch-resistant layer 145 has a thickness T1. In some embodiments, for 3 nm technology node the thickness T1 is in a range from about 1 Angstroms to about 50 Angstroms. In some further embodiments, a ratio of the thickness T1 to a maximal thickness T2 of the gate dielectric caps 142 is in a range from about 3:100 to about 60:100. If the thickness ratio T1/T2 is excessively small, the etch-resistant layer 145 may be too thin to slow down the subsequent LRM etching process. If the thickness ratio T1/T2 is excessively large, the etch-resistant layer 145 may be too thick to be punched through within an expected etching duration time. For other technology nodes, such as 20 nm node, 16 nm node, 10 nm node, 7 nm node, and/or 5 nm node, the thickness T1 of the etch-resistant layer 145 may be in a range from about 1 nm to about 20 nm.

Figure 14:
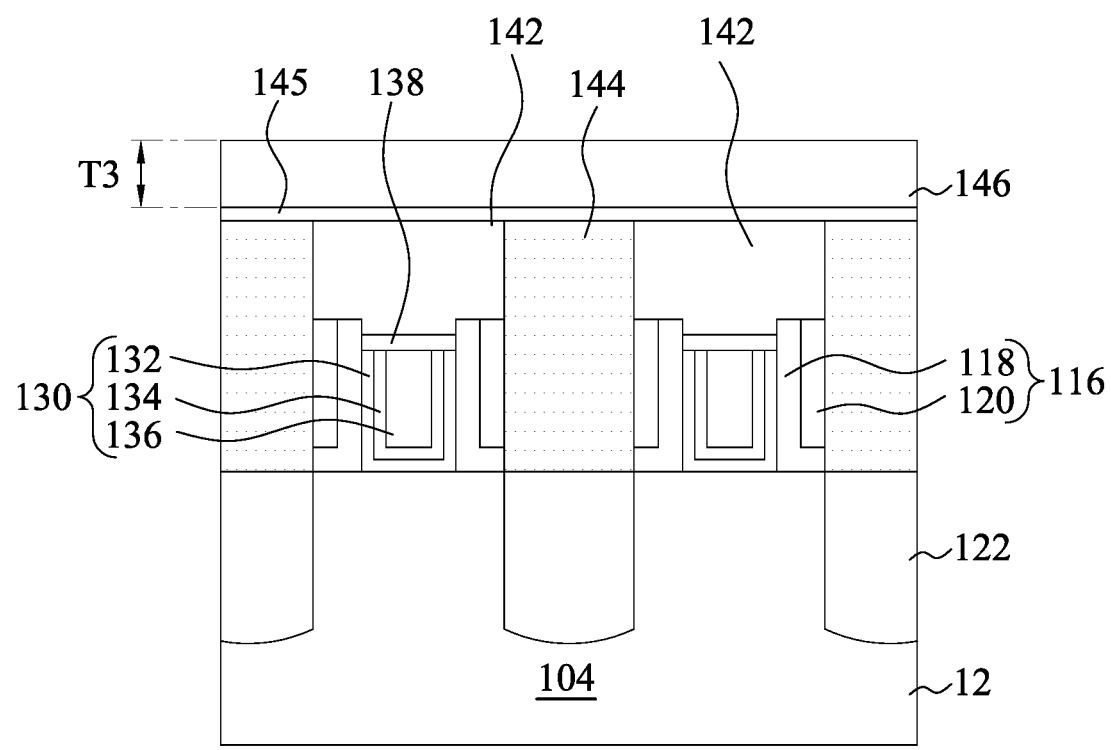
Figure 15:
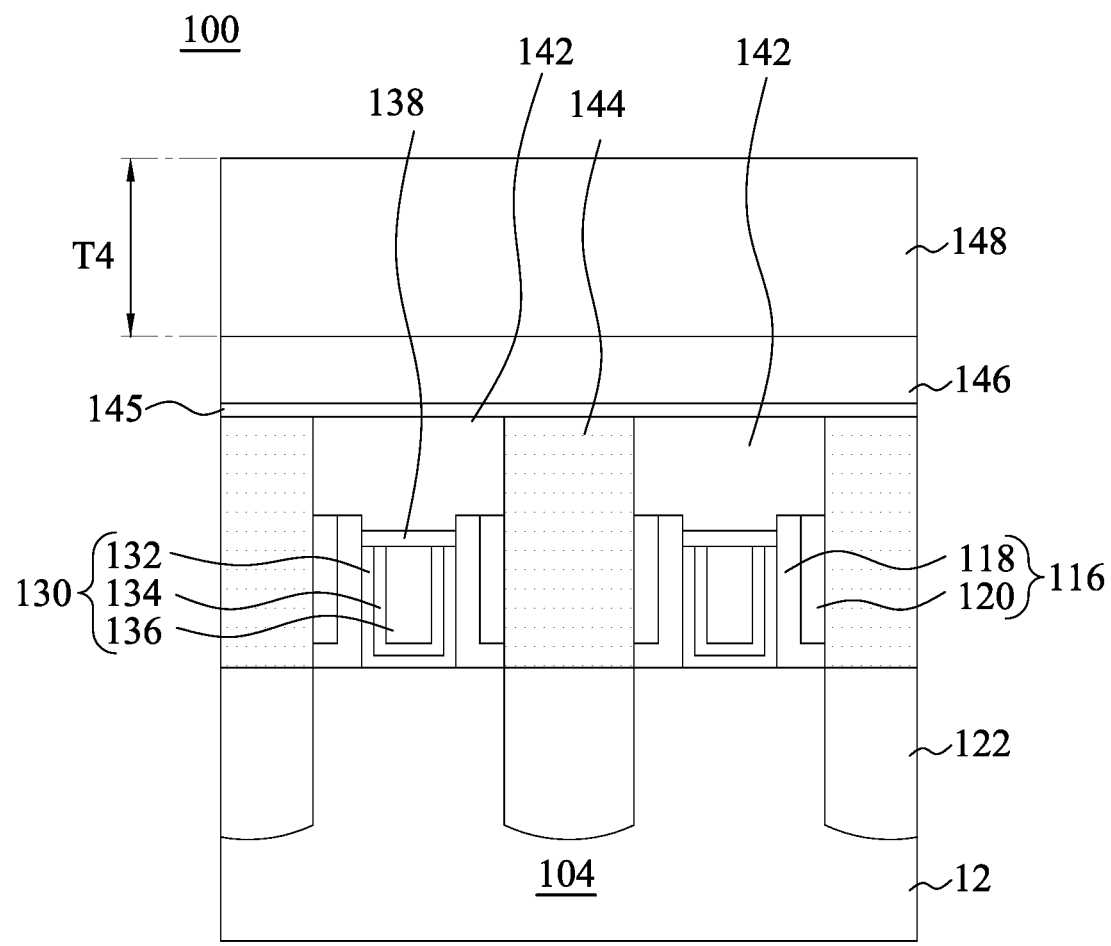

In FIG. 14, once the etch-resistant layer 145 has been formed over the gate dielectric caps 142, a middle contact etch stop layer (MCESL) 146 is then formed over the etch-resistant layer 145. The MCESL 146 may be formed by a PECVD process and/or other suitable deposition processes. In some embodiments, the MCESL 146 is a silicon nitride layer and/or other suitable materials having a different etch selectivity than a subsequently formed ILD layer (as illustrated in FIG. 15). In some embodiments, the gate dielectric caps 142 and the MCESL 146 are both silicon nitride, and thus the etch-resistant layer 145 (e.g., oxide-based layer) has a different etch selectivity than both the gate dielectric caps 142 and the MCESL 146. In some embodiments, the MCESL 146 has a thickness T3 greater than the thickness T1 of the etch-resistant layer 145. For example, the thickness T3 of the MCESL 146 is in a range from about 3 nm to about 20 nm.

Referring to FIG. 15, another ILD layer 148 is formed over the MCESL 146. In some embodiments, the ILD layer 148 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the MCESL 146 (e.g., silicon nitride). In certain embodiments, the ILD layer 148 is formed of silicon oxide ($SiO_x$). The ILD layer 148 may be deposited by a PECVD process or other suitable deposition technique. In some embodiments, the ILD layer 148 has a thickness T4 greater than the thickness T3 of the MCESL 146 and the thickness T1 of the etch-resistant layer 145. In some further embodiments, the thickness T4 of the ILD layer 148 is greater than a total thickness of the MCESL 146 and the etch-resistant layer 145. For example, the thickness T4 of the ILD layer 148 in a range from about 3 nm to about 100 nm.

Figure 16:
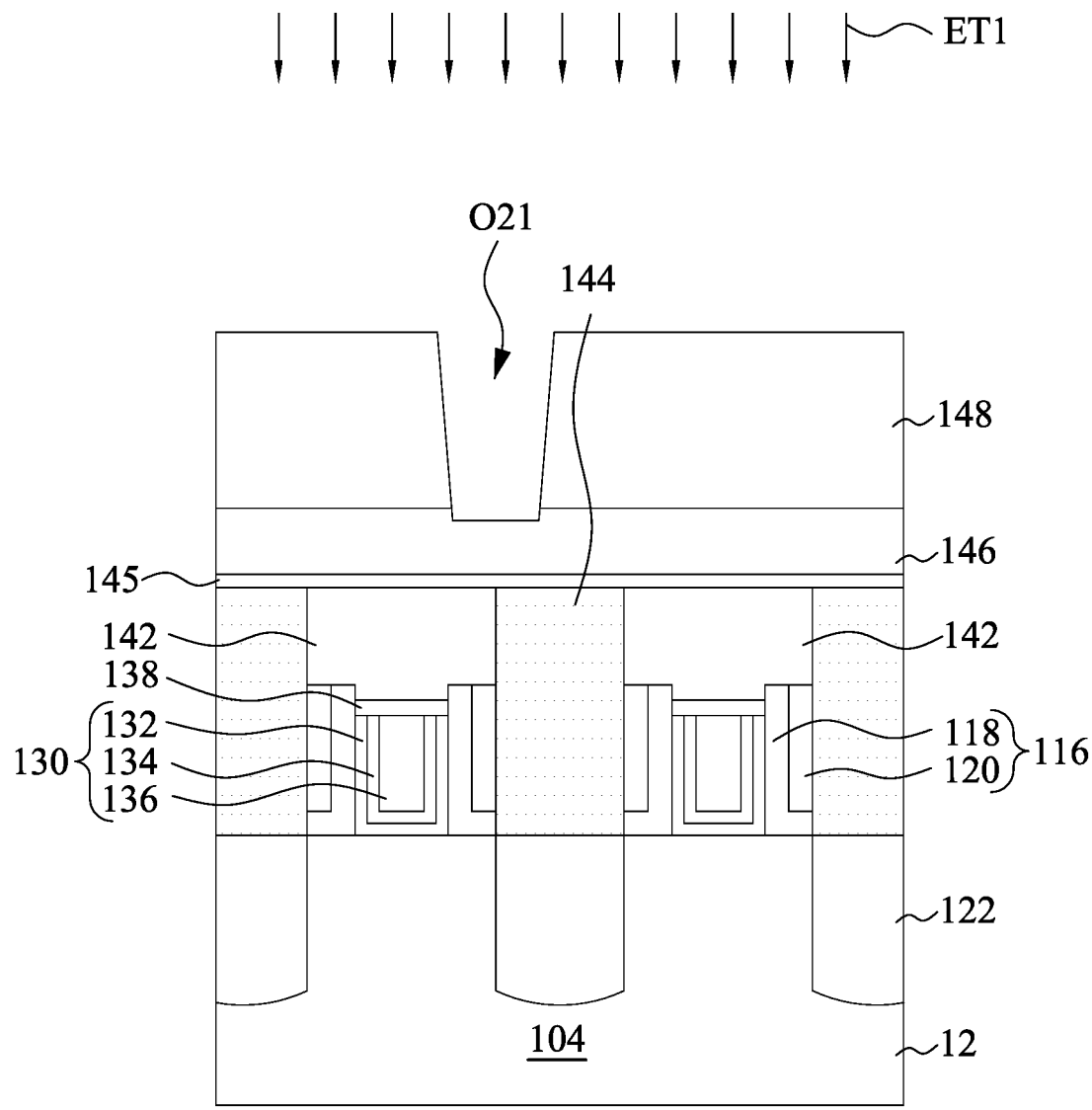

Referring to FIG. 16, the ILD layer 148 is patterned to form via opening O21 extending through the ILD layer 148 by using a first etching process (also called via etching process) ET1. In some embodiments, the via etching process ET1 is an anisotropic etching process, such as a plasma etching. Take plasma etching for example, the semiconductor substrate 12 having the structure illustrated in FIG. 15 is loaded into a plasma tool and exposed to a plasma environment generated by RF or microwave power in a gaseous mixture of a fluorine containing gas, such as $C_4F_8$, $C_5F_8$, $C_4F_6$, $CHF_3$ or similar species, an inert gas, such as argon or helium, an optional weak oxidant, such as $O_2$ or CO or similar species, for a duration time sufficient to etch through the ILD layer 148 and even recess an exposed portion of the MCESL 146 at a bottom of the via opening O21. A plasma generated in a gaseous mixture comprising $C_4F_6$, $CF_4$, $CHF_3$, $O_2$ and argon can be used to etch through the ILD layer 148 and recess the exposed portion of the MCESL 146 at the bottom of the via opening O21. The plasma etching environment has a pressure between about 10 and about 100 mTorr and the plasma is generated by RF power between about 50 and about 1000 Watts.

In some embodiments, the foregoing etchants and etching conditions of the via etching process ET1 are selected in such a way that MCESL 146 (e.g., SiN) exhibits a slower etch rate than the ILD layer 148 (e.g., $SiO_x$). In this way, the MCESL 146 can act as a detectable etching end point, which in turn prevents excessive over-etching and thus prevents punching or breaking through the MCESL 146. Stated differently, the via etching process ET1 is tuned to etch silicon oxide at a faster etch rate than etching silicon nitride. It has been observed that the etch rate of silicon nitride increases when the etching plasma is generated from a gaseous mixture containing a hydrogen ($H_2$) gas. As a result, the via etching process ET1 is performed using a hydrogen-free gaseous mixture in accordance with some embodiments of the present disclosure. Stated differently, the plasma in the via etching process ET1 is generated in a gaseous mixture without hydrogen ($H_2$) gas. In this way, etch rate of silicon nitride keeps low in the via etching process ET1, which in turn allows for etching silicon oxide (i.e., ILD material) at a faster etch rate than etching silicon nitride (i.e., MCESL and gate dielectric cap material).

In some embodiments, before the via etching process ET1, a photolithography process is performed to define an expected top-view pattern of the via opening O21. For example, the photolithography process may include spin-on coating a photoresist layer over ILD layer 148 as illustrated in FIG. 15, performing post-exposure bake processes, and developing the photoresist layer to form a patterned mask with the top-view pattern of the via opening O21. In some embodiments, patterning the photoresist to form the patterned mask may be performed using an electron beam (e-beam) lithography process or an extreme ultraviolet (EUV) lithography process.

Figure 17:
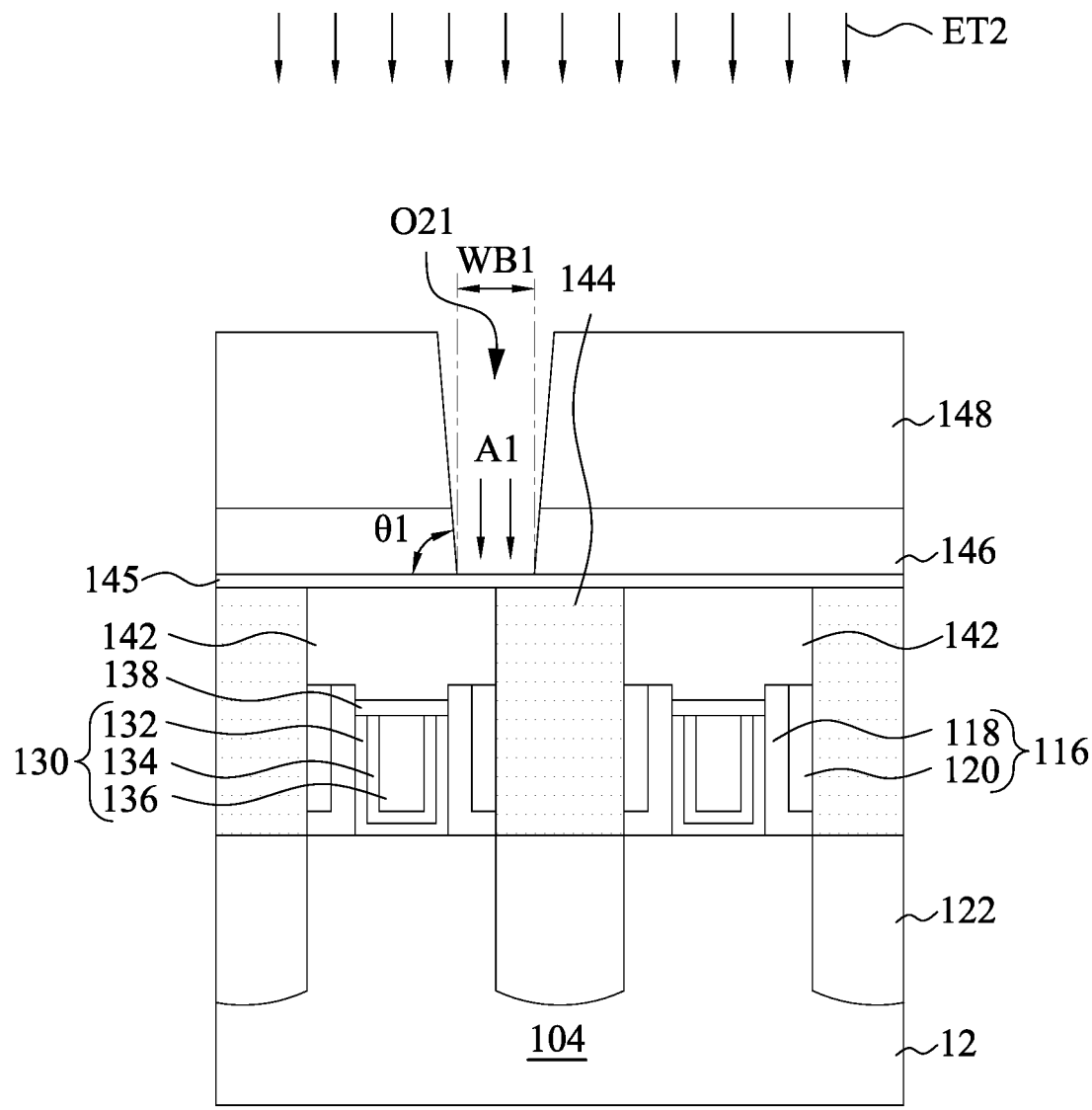
Figure 18:
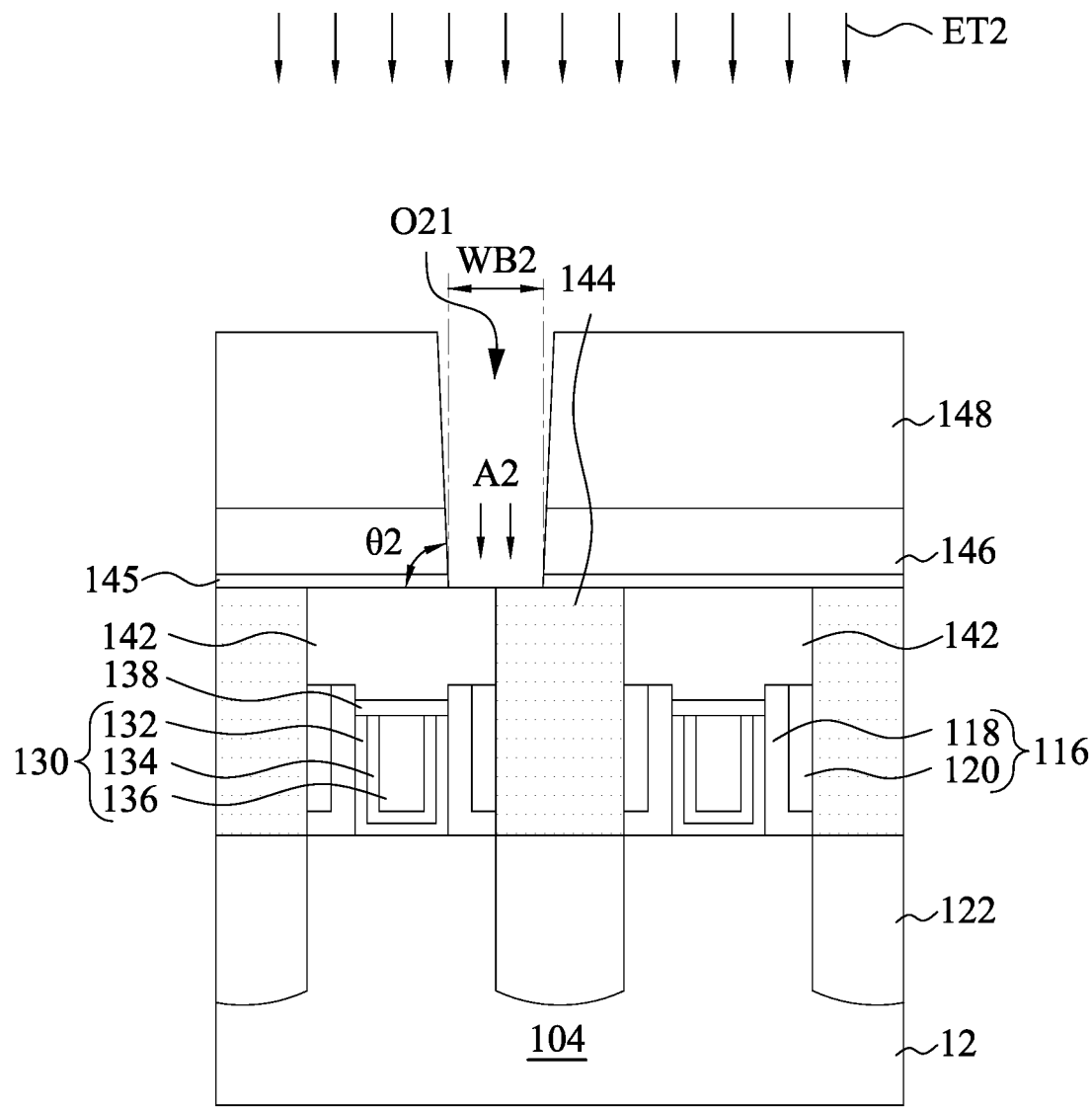

FIG. 17 illustrates a cross-sectional view of an initial stage of a second etching process (also called LRM etching process) ET2 in accordance with some embodiments of the present disclosure, and FIG. 18 illustrates a cross-sectional view of a final stage of the LRM etching process ET2 in accordance with some embodiments of the present disclosure. The etching time duration of the LRM etching process ET2 is controlled to break through (or called punching through) the MCESL 146 and the etch-resistant layer 145, thus deepening or extending the via opening O21 down to the source/drain contact 144. As a result of the LRM etching process ET2, the source/drain contact 144 gets exposed at a bottom of the deepened via opening O21.

In some embodiments, the LRM etching process ET2 is an anisotropic etching process, such as a plasma etching (e.g., inductively coupled plasma (ICP), capacitively coupled plasma (CCP), or the like), using a different etchant and/or etching conditions than the via etching process ET1. The etchant and/or etching conditions of the LRM etching process ET2 are selected in such a way that the etch-resistant layer 145 (e.g., oxide-based material) exhibits a slower etch rate than the MCESL 146 and the gate dielectric caps 142 (e.g., silicon nitride). Stated differently, the etch-resistant layer 145 has a higher etch resistance than the MCESL 146 and the gate dielectric caps 142 in the LRM etching process ET2. In this way, the etch-resistant layer 145 can slow down LRM etching process ET2, which in turn will slow down the vertical etch rate and hence the depth increasing in the via opening O21 when the via opening O21 reaches the etch-resistant layer 145. The slowed-down depth increasing thus prevents the tiger tooth-like pattern formed in the deepened via opening O21, which in turn reduces the risk of leakage current (e.g., leakage current from source/drain vias to gate structures). Moreover, because the etch-resistant layer 145 slows down the vertical etch rate but not the lateral etch rate at lower portions of the via opening O21 when the via opening O21 reaches the etch-resistant layer 145, the LRM etching process ET2 can laterally expand a lower portion of the via opening O21 during etching the etch-resistant layer 145, such that the bottom width of the via opening O21 can be increased, and the sidewall profile of via opening O21 can become more vertical or steeper than before the etch-resistant layer 145 is punched through, as illustrated in FIGS. 17-18. For example, the via opening O21 has a sidewall extending at an angle θ1 before the etch-resistant layer 145 gets etched as illustrated in FIG. 17. After the etch-resistant layer 145 is etched though, as illustrated in FIG. 18, the via opening O21 has a sidewall extending at an angle θ2 greater than the previous angle θ1. Moreover, the via opening O21 has a bottom width WB1 at a bottom of the via opening O21 before the etch-resistant layer 145 gets etched as illustrated in FIG. 17. After the etch-resistant layer 145 is etched through, as illustrated in FIG. 18, the via opening O21 has a bottom width WB2 greater than the previous bottom width WB1.

Take plasma etching as an example of the LRM etching process ET2, the semiconductor substrate 12 having the structure illustrated in FIG. 16 is loaded into a plasma tool and exposed to a plasma environment generated by RF or microwave power in a gaseous mixture of one or more of a fluorine-containing gas (e.g., $CHF_3$, $CF_4$, $C_2F_2$, $C_4F_6$, $C_xH_yF_z$ (x,y,z=0-9), or similar species), a hydrogen-containing gas (e.g., $H_2$), a nitrogen-containing gas (e.g., $N_2$), an oxygen-containing gas (e.g., $O_2$), and an inert gas (e.g., argon or helium), for a controlled over-etch time that is sufficient to etch through the MCESL 146 and the underlying etch-resistant layer 145 in every target location throughout the wafer. The plasma etching environment has a pressure between about 10 and about 100 mTorr and the plasma is generated by RF power between about 50 and about 1000 Watts.

Plasma generated from a hydrogen-containing gas mixture can etch nitride-based materials (e.g., silicon nitride) at a faster etch rate than etching oxide-based materials (e.g., silicon oxide), and thus the LRM etching process ET2 using a hydrogen-containing gas mixture etches the oxide-based etch-resistant layer 145 at a slower etch rate than etching the nitride-based MCESL 146. In this way, the etch-resistant layer 145 can slow down the LRM etching process ET2 when the via opening O21 extends down to the etch-resistant layer 145. In some embodiments, the LRM etching ET2 uses a gas mixture of $CHF_3$ gas and $H_2$ gas with a flow rate ratio of $CHF_3$ gas to $H_2$ gas from about 1:1 to about 1:100. In some embodiments, the LRM etching ET2 uses a gas mixture of $CF_4$ gas and $H_2$ gas with a flow rate ratio of $CF_4$ gas to $H_2$ gas from about 1:1 to about 1:100. An excessively high $H_2$ gas flow rate may lead to an excessively fast etch rate in etching the gate dielectric cap 142 when the gate dielectric cap 142 is exposed by the via opening O21, which in turn may lead to a non-negligible tiger tooth-like recess in the via opening O21. An excessively low $H_2$ gas flow rate may lead to insufficient etch selectivity between the etch-resistant layer 145 and MCESL 146. In some embodiments, a ratio of the etch rate of the etch-resistant layer 145 to the etch rate of the MCESL 146 and/or the gate dielectric caps 142 is in a range from about 5 to about 10.

In some embodiments where the etch-resistant layer 145 has thickness not greater than about 5 nm, the LRM etching process ET2 is a single-step etching using the high selective hydrogen-containing etchant that etches nitride-based materials at a faster etch rate than etching oxide-based materials. In some embodiments where the etch-resistant layer 145 has a thickness greater than about 5 nm, the LRM etching process ET2 is a dual-step etching that performs a high selective etching first, followed by a low selective etching. The high selective etching etches the MCESL 146 at a faster etch rate than etching the etch-resistant layer 145, and is performed for a controlled over-etch time that is sufficient to etch through the MCESL 146 and to reshape the via opening O21 to have a more vertical sidewall profile. The low selective etching etches the etch-resistant layer 145 and the MCESL 146 at a comparable etch rate, thus allowing for punching through the etch-resistant layer 145 in an shortened duration time. In some embodiments where the LRM etching process ET2 is a dual-step etching, the high selective etching for breaking through the nitride-based MCESL 146 uses an etchant such as a gas mixture of $CHF_3$ gas and $H_2$ gas with a flow rate ratio of $CHF_3/H_2$ from about 1:1 to about 1:100 or a gas mixture of $CF_4$ gas and $H_2$ gas with a flow rate ratio of $CF_4/H_2$ from about 1:1 to about 1:100, and the low selective etching for punching through the oxide-based etch-resistant layer 145 uses an etchant such as $CF_4/CH_3F/CH_2F_2/CHF_3/H_2$ with $N_2$ or $O_2/Ar$ gas to get the low selective etching.

At initial stage of the LRM etching process ET2, as illustrated in FIG. 17, the plasma etchant etches the MCESL 146 at a first vertical etch rate A1. At a following stage of the LRM etching process ET2, once the via opening O21 punches through the MCESL 146, the etch-resistant layer 145 gets exposed, and then the plasma etchant etches the etch-resistant layer 145 at a second vertical etch rate A2 slower than the first vertical etch rate A1, as illustrated in FIG. 18. As a result, the depth increasing in the via opening O21 can be slowed down by the etch-resistant layer 145, thus preventing a tiger tooth-like recess extending from a bottom of the via opening O21 into the gate dielectric cap 142. Moreover, the LRM etching process ET2 can laterally expand the lower portion of the via opening O21 during etching the etch-resistant layer 145, such that the via opening O21 has an increased bottom width and a more vertical sidewall profile, as illustrated in FIG. 18. More specifically, the sidewall profile of via opening O21 after etching through the etch-resistant layer 145 (as illustrated in FIG. 18) is steeper or more vertical than before etching the etch-resistant layer 145. Because of the increased bottom width of the via opening O21, the contact area between the source/drain contact 144 and the source/drain via subsequently formed in the via opening O21 can be increased, and hence the contact resistance can be reduced.

In some embodiments as illustrated in FIG. 18, the via opening O21 may expose a partial region of a target source/drain contact 144 and a partial region of a gate dielectric cap 142 next to the target source/drain contact 144. Such misalignment between the via opening O21 and the target source/drain contact 144 may be inadvertently formed due to inaccuracies of the via etching process ET1 and/or the LRM etching process ET2 (e.g., misalignment occurring during the photolithography process that is used to define the patterns of via openings O21 in a patterned photoresist coated over the ILD layer 148). However, even in this misalignment scenario, the gate dielectric cap 142 next to the target source/drain contact 144 would not be inadvertently over-etched to form a tiger tooth-like recess, because the depth increasing in the via opening O21 is slowed down during punching through the etch-resistant layer 145 as discussed previously. Given that the via opening O21 has no or negligible tiger tooth-like recess, the risk of leakage current (e.g., leakage current between the gate structure 130 and the source/drain via subsequently formed in the via opening O21) can be reduced.

In some embodiments as depicted in FIG. 18, the sidewalls of the via opening O21 extend linearly through an entire thickness of the ILD layer 148, an entire thickness of the MCESL 146, and an entire thickness of the etch-resistant layer 145, without a slope change. In some embodiments as depicted in FIG. 18, the via opening O21 may still have a tapered sidewall profile due to the nature of anisotropic etching of the LRM etching process ET2, but the tapered profile is more vertical as compared with the case where no etch-resistant layer 145 is used to slow down the LRM etching process ET2. In some other embodiments, the etching conditions of the LRM etching process ET2 and/or the previous via etching process ET1 may be fine-tuned to allow the via openings O21 having vertical sidewall profile.

Figure 19A:
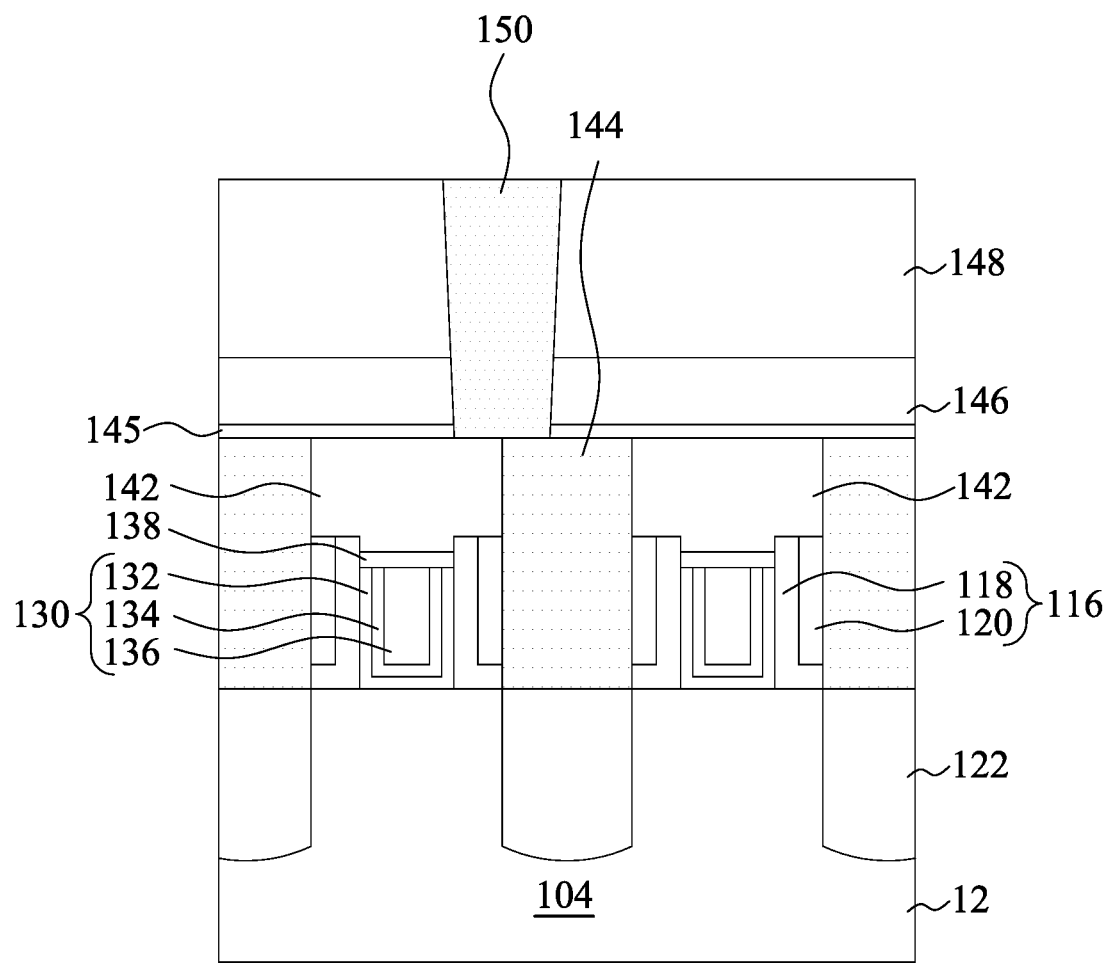

Referring to FIG. 19A, a source/drain via 150 is then formed in the via opening O21 to make physical and electrical connection to the target source/drain contact 144. The source/drain via 150 is formed using, by way of example and not limitation, depositing one or more metal materials overfilling the via opening O21, followed by a CMP process to remove excessive metal material(s) outside the via opening O21. As a result of the CMP process, the source/drain via 150 has a top surface substantially coplanar with the ILD layer 148. The source/drain via 150 may comprise metal materials such as copper, aluminum, tungsten, combinations thereof, or the like, and may be formed using PVD, CVD, ALD, or the like. In some embodiments, the source/drain via 150 may further comprise one or more barrier/adhesion layers (not shown) to protect the ILD layer 148, the MCESL 146, and/or the etch-resistant layer 145 from metal diffusion (e.g., copper diffusion). The one or more barrier/adhesion layers may comprise titanium, titanium nitride, tantalum, tantalum nitride, or the like, and may be formed using PVD, CVD, ALD, or the like.

The source/drain via 150 inherits the geometry of the via opening O21 with a vertical sidewall profile and no tiger tooth-like profile, and thus the source/drain via 150 also has a vertical sidewall profile and no tiger tooth-like profile. In greater detail, the sidewalls of the source/drain vias 150 extend linearly through an entire thickness of the ILD layer 148, an entire thickness of the MCESL 146, and an entire thickness of the etch-resistant layer 145, without a slope change.

Figure 19B:
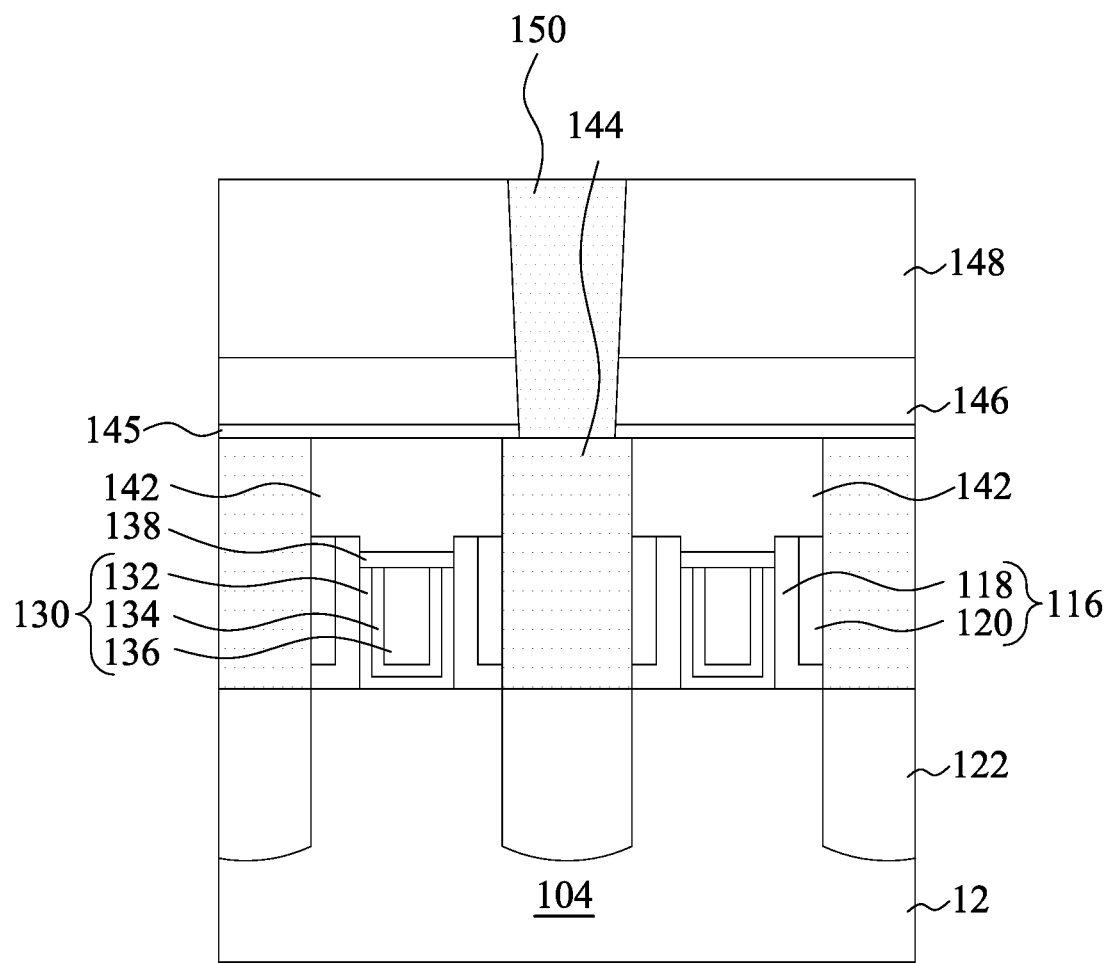

In some embodiments as illustrated in FIG. 19A, the source/drain via 150 may contact a partial region of the source/drain contact 144 and a partial region of the neighboring gate dielectric cap 142 because of inadvertent misalignment during the photolithography and etching processes of forming the source/drain via 150. However, in some other embodiments as illustrated in FIG. 19B, an entirety of the bottom surface of the source/drain via 150 can be in contact with the underlying source/drain contact 144 and spaced apart from the neighboring gate dielectric cap 142.

FIGS. 20-25 illustrate exemplary cross sectional views of various stages for manufacturing an integrated circuit structure 100a according to some other embodiments of the present disclosure. It is understood that additional operations can be provided before, during, and after processes shown by FIGS. 20-25, and some of the operations described below can be replaced or eliminated, for additional embodiments of the method. The order of the operations/processes may be interchangeable. The same or similar configurations, materials, processes and/or operation as described with FIGS. 1-19B may be employed in the following embodiments, and the detailed explanation may be omitted.

Figure 20:
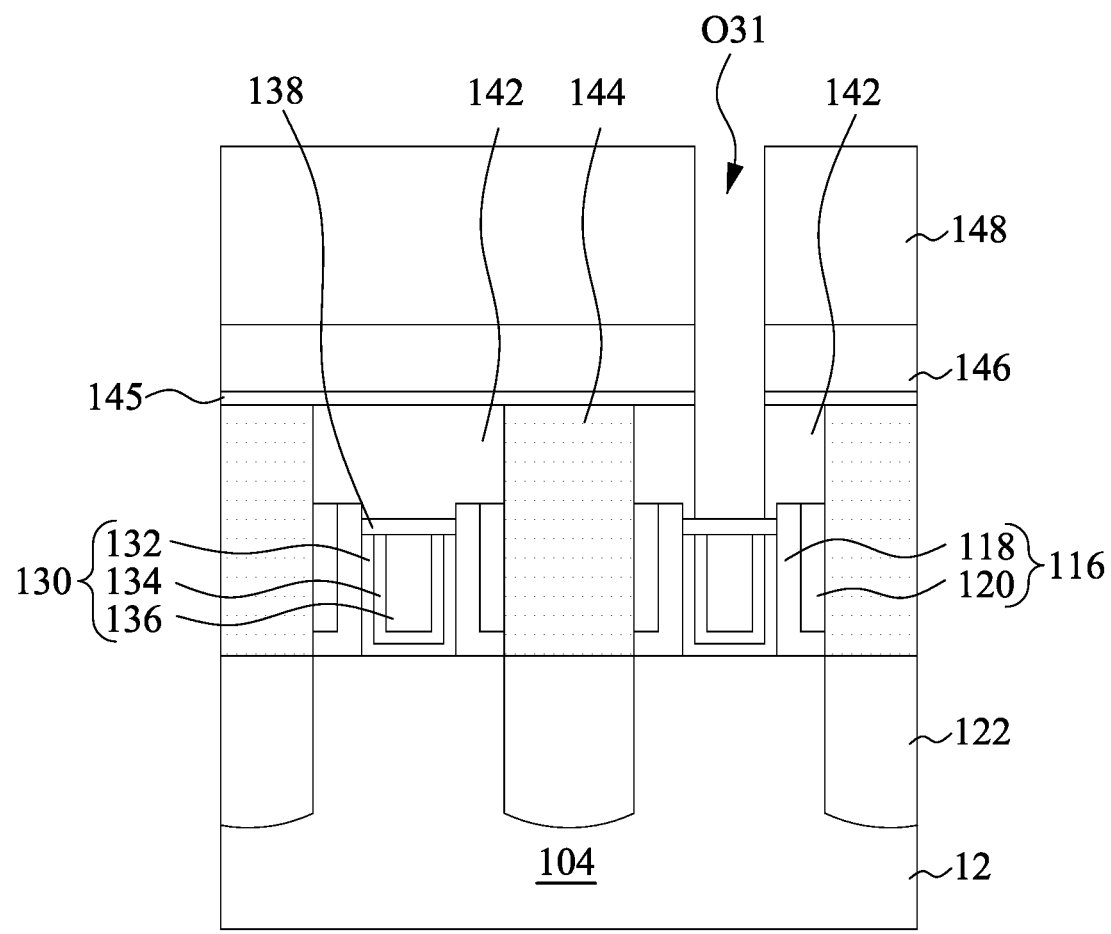
FIGS. 20-25 illustrate exemplary cross sectional views of various stages for manufacturing an integrated circuit structure according to some other embodiments of the present disclosure.

After the structure as shown in FIG. 15 is formed, the ILD layer 148 is patterned to form a gate contact opening O31 extending downward though the ILD layer 148, the MCESL 146, the etch-resistant layer 145 and the gate dielectric cap 142 to the gate metal cap 138. The resulting structure is illustrated in FIG. 20. The ILD layer 148 can be patterned by using suitable photolithography and etching techniques.

Figure 21:
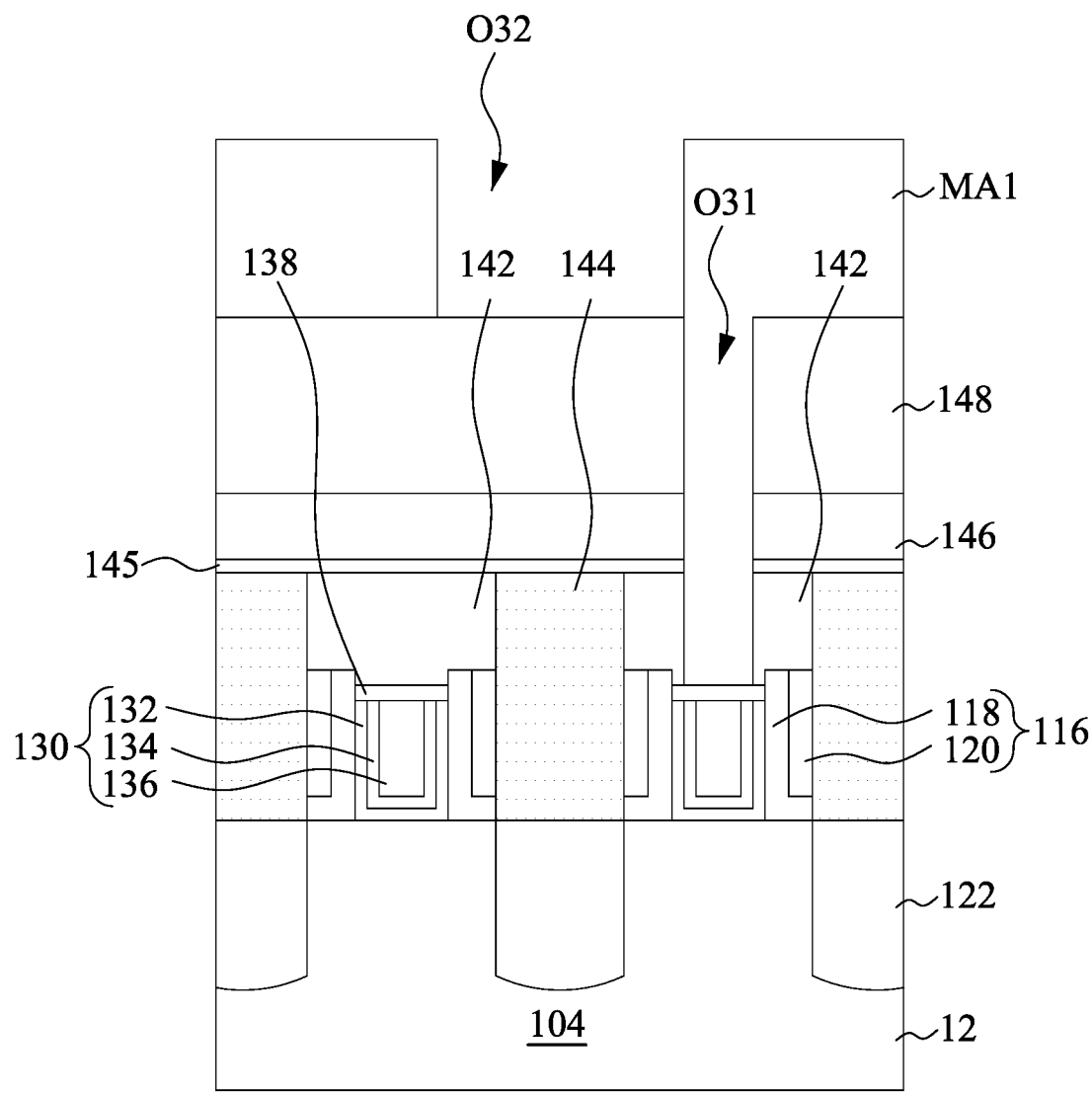

Next, as illustrated in FIG. 21, a patterned mask layer MA1 is formed over the substrate 12 to fill the gate contact opening O31. The patterned mask layer MA1 has an opening O32 directly above a target source/drain contact 144. In some embodiments, the patterned mask layer MA1 may be a photoresist mask formed by suitable photolithography process. For example, the photolithography process may include spin-on coating a photoresist layer over the structure as illustrated in FIG. 20, performing post-exposure bake processes, and developing the photoresist layer to form the patterned mask layer MA1. In some embodiments, patterning the resist to form the patterned mask element may be performed using an electron beam (e-beam) lithography process or an extreme ultraviolet (EUV) lithography process.

Figure 22:
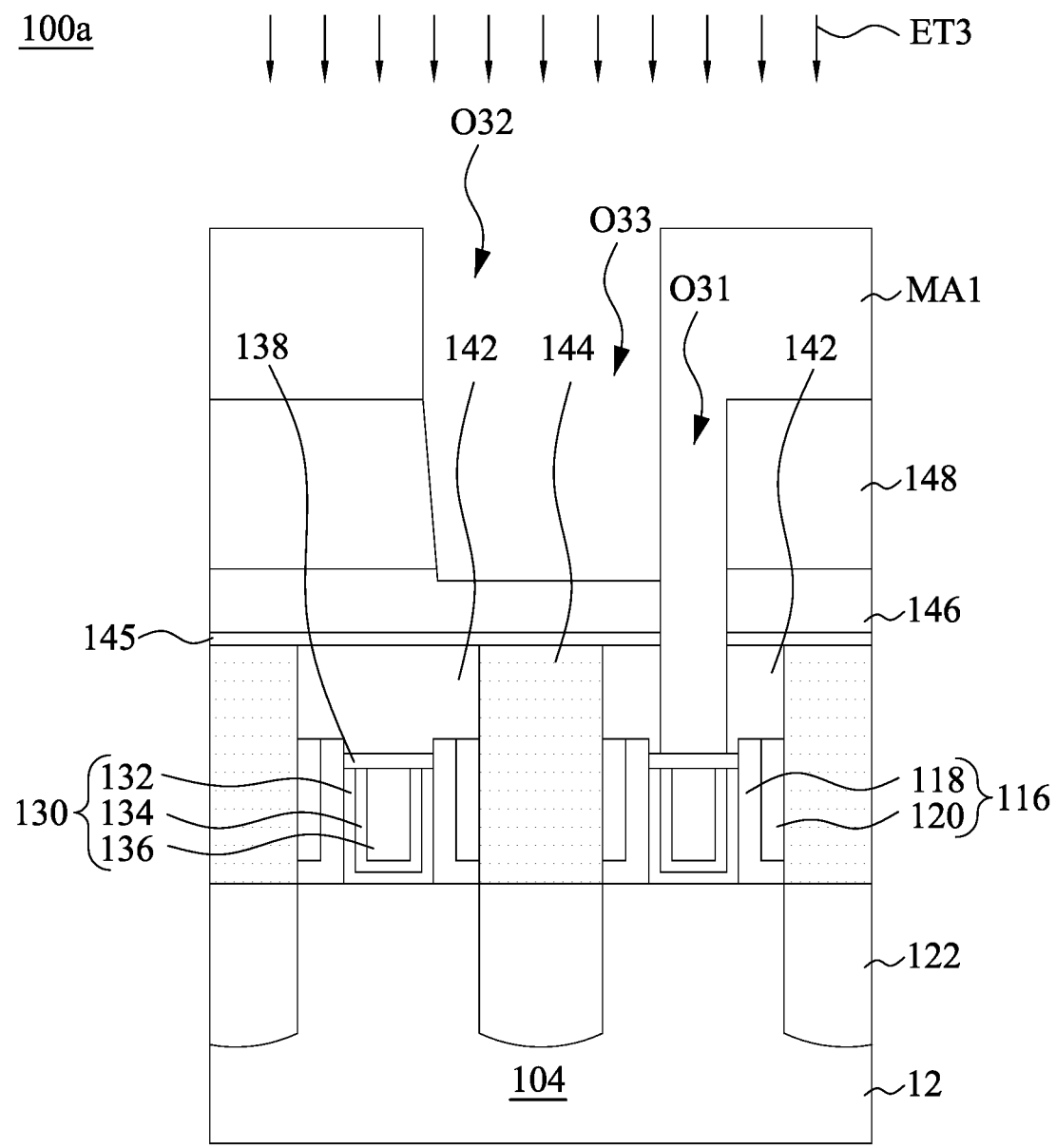

Referring to FIG. 22, with the patterned mask layer MA1 in place, a via etching process ET3 is performed to form a via opening O33 extending through the ILD layer 148. The etching duration time of the via etching process ET3 is controlled to stop before the MCESL 146 is punched through. Process details about the via etching process ET3 are discussed previously with respect to the via etching process ET1, and thus they are not repeated herein for the sake of brevity.

Figure 23:
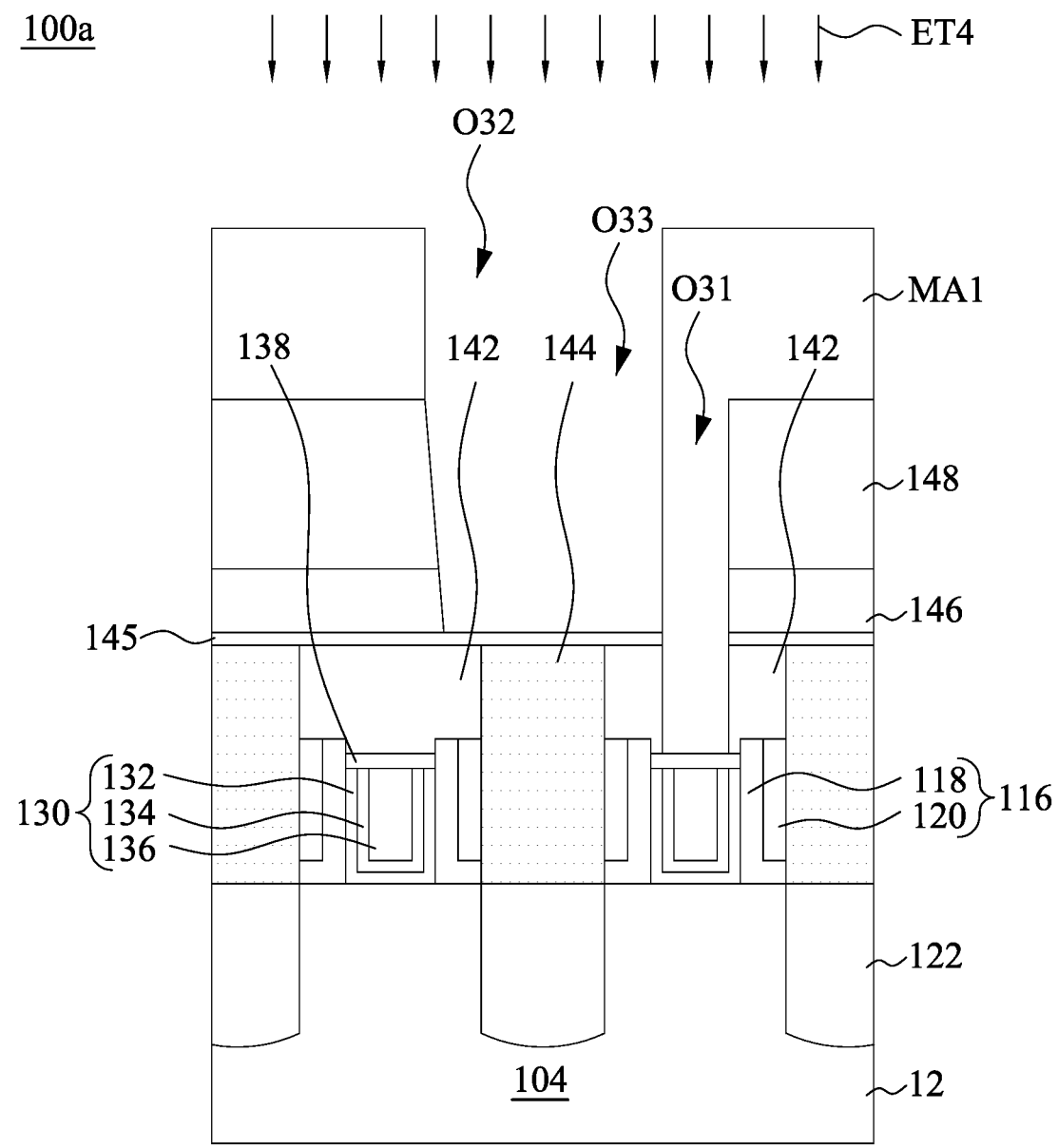
Figure 24:
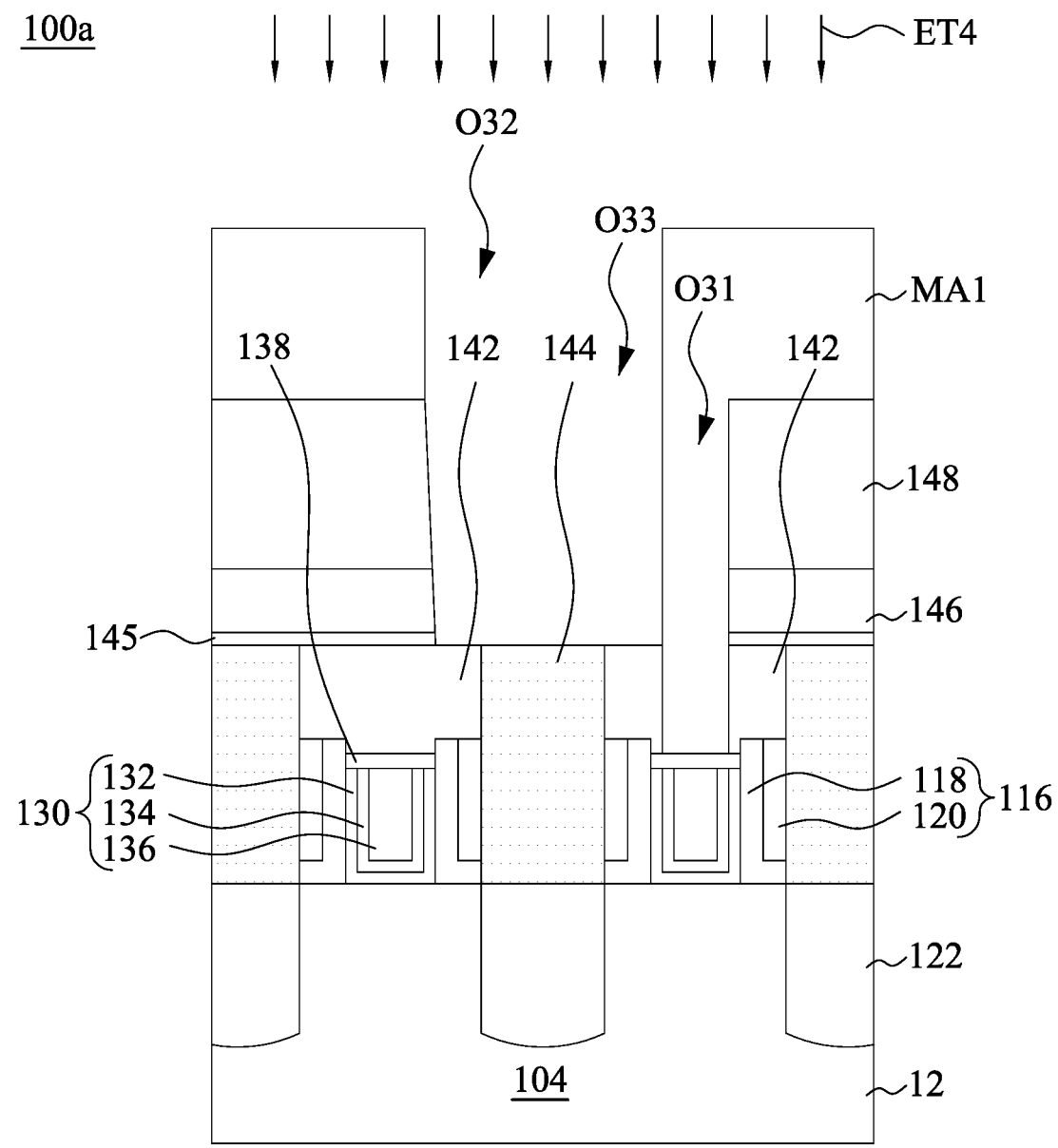

FIG. 23 illustrates a cross-sectional view of an initial stage of an LRM etching process ET4 in accordance with some embodiments of the present disclosure, and FIG. 24 illustrates a cross-sectional view of a final stage of the LRM etching process ET4 in accordance with some embodiments of the present disclosure. The etching time duration of the LRM etching process ET4 is controlled to break through the MCESL 146 and the etch-resistant layer 145, thus deepening or extending the via opening O33 down to the target source/drain contact 144. As a result of the LRM etching process ET4, the source/drain contact 144 gets exposed at a bottom of the deepened via opening O33. Process details about the LRM etching process ET4 are discussed previously with respect to the LRM etching process ET2, and thus they are not repeated herein for the sake of brevity.

The etchant and/or etching conditions of the LRM etching process ET4 are selected in such a way that the etch-resistant layer 145 (e.g., oxide-based material) exhibits a slower etch rate than the MCESL 146 and the gate dielectric caps 142 (e.g., silicon nitride). In this way, the etch-resistant layer 145 can slow down LRM etching process ET4, which in turn will slow down the vertical etch rate and hence the depth increasing in the via opening O33 when the via opening O33 reaches the etch-resistant layer 145. The slowed-down depth increasing thus prevents the tiger tooth-like pattern formed in the deepened via opening O33 (e.g., in portions of the gate dielectric caps 142 exposed by the via opening O33), which in turn reduces the risk of leakage current. Moreover, because the etch-resistant layer 145 slows down the vertical etch rate but not the lateral etch rate at lower portions of the via opening O33 when the via opening O33 reaches the etch-resistant layer 145, the LRM etching process ET4 can laterally expand a lower portion of the via opening O33 during etching the etch-resistant layer 145, such that the bottom width of the via opening O33 can be increased, and the sidewall profile of via opening O33 can become more vertical or steeper than before the etch-resistant layer 145 is punched through, as illustrated in FIGS. 23-24.

Figure 25:
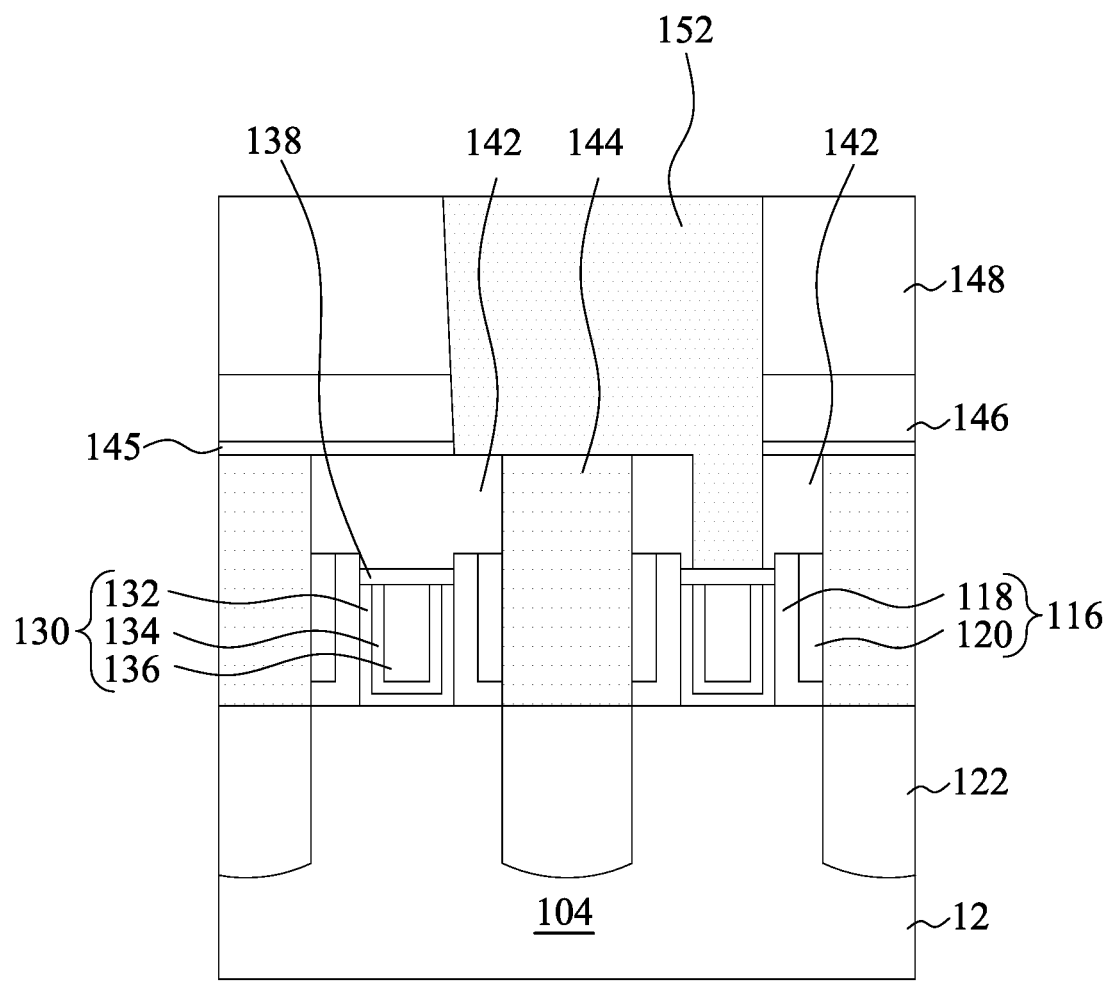

After the LRM etching process ET4 is completed, the patterned mask layer MA1 is removed from the gate contact opening O31 by ashing and/or wet stripping, and then a butted contact 152 is formed to fill both the deepened via opening O33 and the gate contact opening O31. The resulting structure is illustrated in FIG. 25. The gate structure 130 is electrically coupled to the source/drain epitaxial structure 122 through the source/drain contact 144, the butted contact 152, and the metal cap 138. Materials and fabrication process details about the butted contact 152 are similar to that about the source/drain vias 150, and thus they are not repeated herein for the sake of brevity.

FIGS. 26 through 45B illustrate perspective views and cross-sectional views of intermediate stages in the formation of an integrated circuit structure 200 in accordance with some embodiments of the present disclosure. The formed transistors may include a p-type transistor (such as a p-type GAA FET) and an n-type transistor (such as an n-type FAA FET) in accordance with some exemplary embodiments. Throughout the various views and illustrative embodiments, like reference numbers are used to designate like elements. It is understood that additional operations can be provided before, during, and after the processes shown by FIGS. 26 through 45B, and some of the operations described below can be replaced or eliminated, for additional embodiments of the method. The order of the operations/processes may be interchangeable.

FIGS. 26, 27, 29A, 30A, 31A, and 32A are perspective views of some embodiments of the integrated circuit structure 200 at intermediate stages during fabrication. FIGS. 29B, 30B, 31B, 32B, 33-35, 36A, and 37-45B are cross-sectional views of some embodiments of the integrated circuit structure 200 at intermediate stages during fabrication along a first cut (e.g., cut X-X in FIG. 29A), which is along a lengthwise direction of the channel and perpendicular to a top surface of the substrate. FIG. 36B is a cross-sectional view of some embodiments of the integrated circuit structure 200 at intermediate stages during fabrication along a second cut (e.g., cut Y-Y in FIG. 29A), which is in the gate region and perpendicular to the lengthwise direction of the channel.

Figure 26:
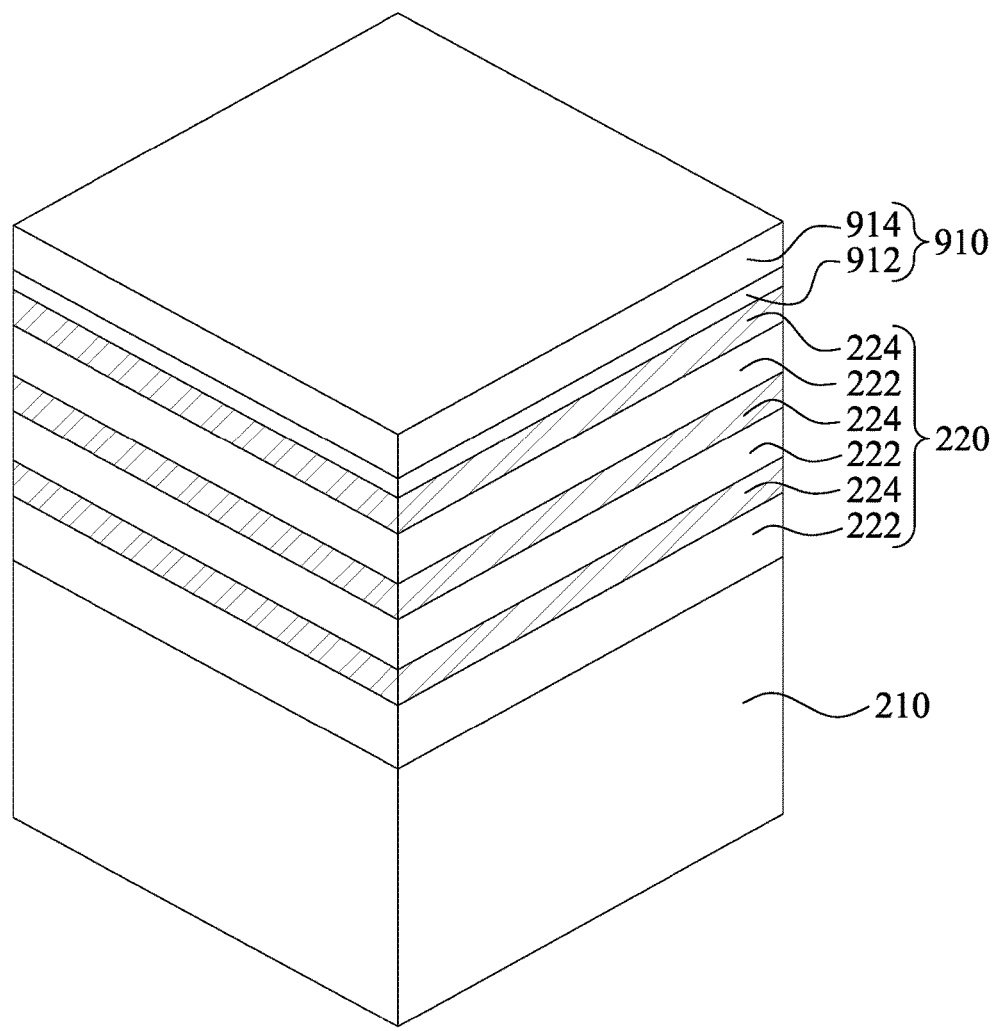
FIGS. 26-45B illustrate perspective views and cross-sectional views of intermediate stages in the formation of an integrated circuit structure in accordance with some embodiments of the present disclosure.

Referring to FIG. 26, an epitaxial stack 220 is formed over the substrate 210. In some embodiments, the substrate 210 may include silicon (Si). Alternatively, the substrate 210 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 220 includes epitaxial layers 222 of a first composition interposed by epitaxial layers 224 of a second composition. The first and second compositions can be different. In some embodiments, the epitaxial layers 222 are SiGe and the epitaxial layers 224 are silicon (Si). However, other embodiments are possible including those that provide for a first composition and a second composition having different oxidation rates and/or etch selectivity. In some embodiments, the epitaxial layers 222 include SiGe and where the epitaxial layers 224 include Si, the Si oxidation rate of the epitaxial layers 224 is less than the SiGe oxidation rate of the epitaxial layers 222.

The epitaxial layers 224 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 224 to define a channel or channels of a device is further discussed below.

It is noted that three layers of the epitaxial layers 222 and three layers of the epitaxial layers 224 are alternately arranged as illustrated in FIG. 26, which is for illustrative purposes only and not intended to be limiting beyond what is specifically recited in the claims. It can be appreciated that any number of epitaxial layers can be formed in the epitaxial stack 220; the number of layers depending on the desired number of channels regions for the transistor. In some embodiments, the number of epitaxial layers 224 is between 2 and 10.

As described in more detail below, the epitaxial layers 224 may serve as channel region(s) for a subsequently-formed multi-gate device and the thickness is chosen based on device performance considerations. The epitaxial layers 222 in channel regions(s) may eventually be removed and serve to define a vertical distance between adjacent channel region(s) for a subsequently-formed multi-gate device and the thickness is chosen based on device performance considerations. Accordingly, the epitaxial layers 222 may also be referred to as sacrificial layers, and epitaxial layers 224 may also be referred to as channel layers.

By way of example, epitaxial growth of the layers of the stack 220 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 224 include the same material as the substrate 210. In some embodiments, the epitaxially grown layers 222 and 224 include a different material than the substrate 210. As stated above, in at least some examples, the epitaxial layers 222 include an epitaxially grown silicon germanium (SiGe) layer and the epitaxial layers 224 include an epitaxially grown silicon (Si) layer. Alternatively, in some embodiments, either of the epitaxial layers 222 and 224 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 222 and 224 may be chosen based on providing differing oxidation and/or etching selectivity properties. In some embodiments, the epitaxial layers 222 and 224 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Figure 27:
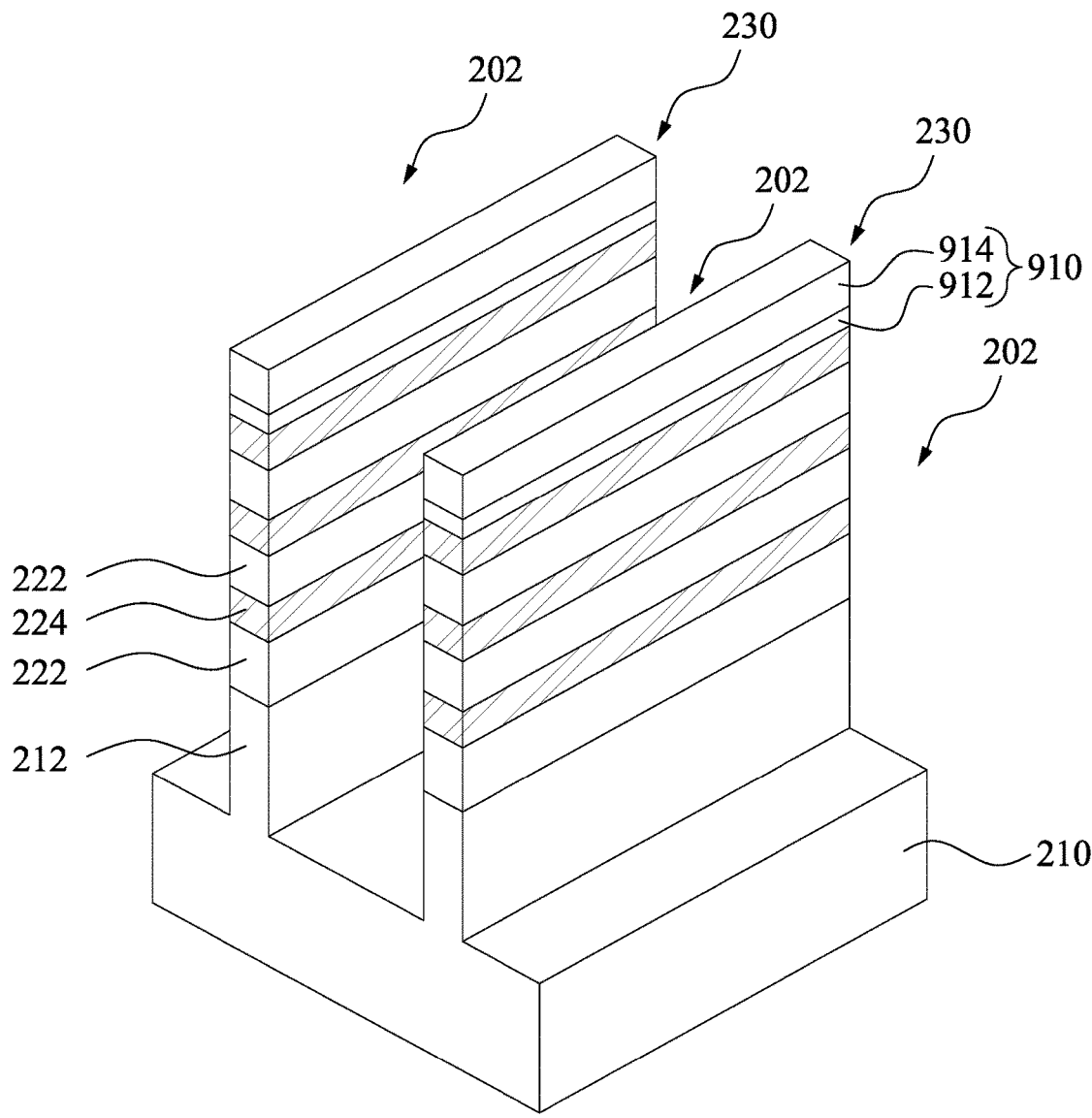

Referring to FIG. 27, a plurality of semiconductor fins 230 extending from the substrate 210 is formed. In various embodiments, each of the fins 230 includes a substrate portion 212 formed from the substrate 210 and portions of each of the epitaxial layers of the epitaxial stack including epitaxial layers 222 and 224. The fins 230 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 230 by etching initial epitaxial stack 220. The etching process can include dry etching, wet etching, reactive ion etching (RIE), and/or other suitable processes.

In the illustrated embodiment as illustrated in FIGS. 26 and 27, a hard mask (HM) layer 910 is formed over the epitaxial stack 220 prior to patterning the fins 230. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 220 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 230 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-200 nm. The patterned mask may then be used to protect regions of the substrate 210, and layers formed thereupon, while an etch process forms trenches 202 in unprotected regions through the HM layer 910, through the epitaxial stack 220, and into the substrate 210, thereby leaving the plurality of extending fins 230. The trenches 202 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 220 in the form of the fins 230.

Figure 28:
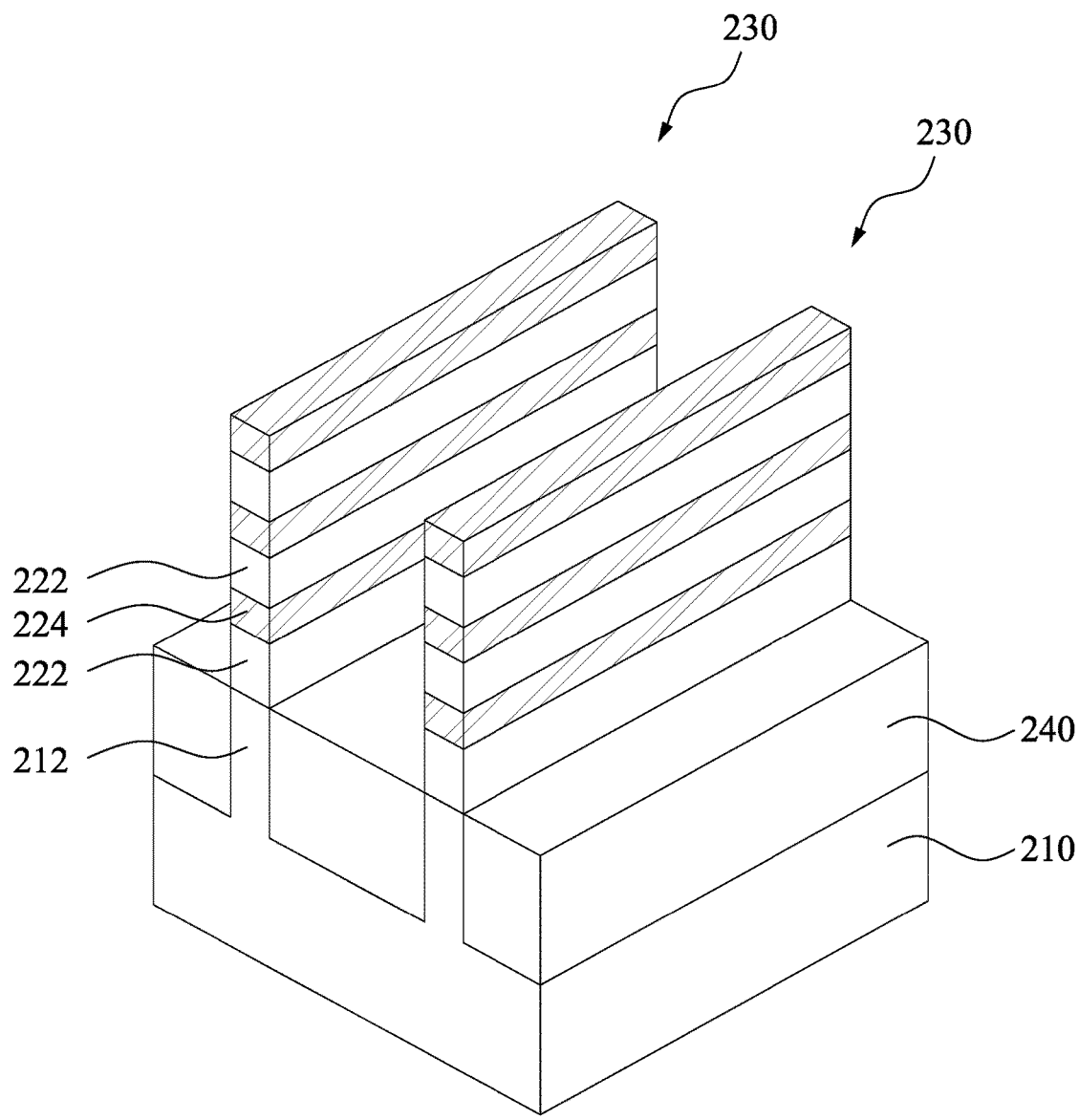

Next, as illustrated in FIG. 28, STI regions 240 are formed interposing the fins 230. Materials and process details about the STI regions 240 are similar to that of the STI regions 14 discussed previous, and thus they are not repeated for the sake of brevity.

Figure 29A:
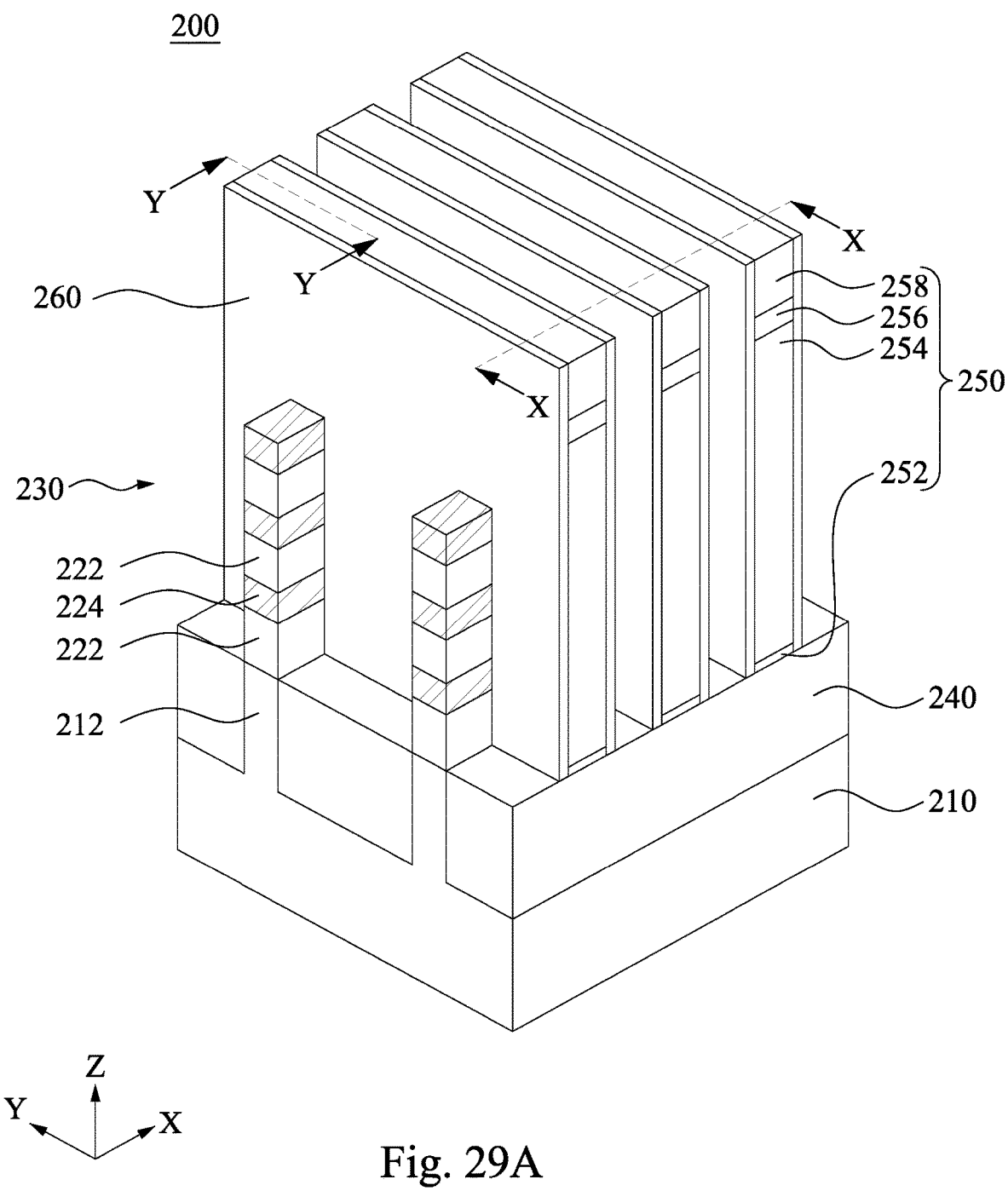
Figure 29B:
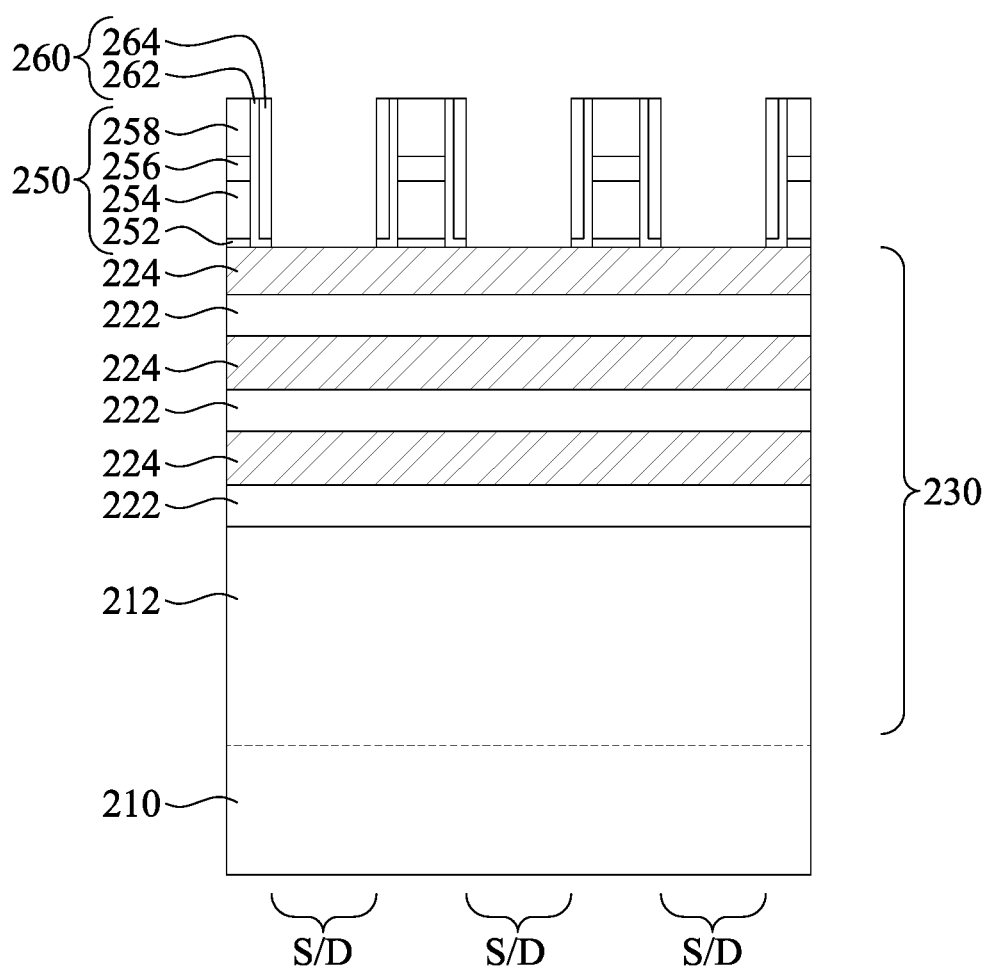

Reference is made to FIGS. 29A and 29B. Dummy gate structures 250 are formed over the substrate 210 and are at least partially disposed over the fins 230. The portions of the fins 230 underlying the dummy gate structures 250 may be referred to as the channel region. The dummy gate structures 250 may also define source/drain (S/D) regions of the fins 230, for example, the regions of the fins 230 adjacent and on opposing sides of the channel regions.

Dummy gate formation step first forms a dummy gate dielectric layer 252 over the fins 230. Subsequently, a dummy gate electrode layer 254 and a hard mask which may include multiple layers 256 and 258 (e.g., an oxide layer 256 and a nitride layer 258) are formed over the dummy gate dielectric layer 252. The hard mask is then patterned, followed by patterning the dummy gate electrode layer 254 by using the patterned hard mask as an etch mask. In some embodiments, after patterning the dummy gate electrode layer 254, the dummy gate dielectric layer 252 is removed from the S/D regions of the fins 230. The etch process may include a wet etch, a dry etch, and/or a combination thereof. The etch process is chosen to selectively etch the dummy gate dielectric layer 252 without substantially etching the fins 230, the dummy gate electrode layer 254, the oxide mask layer 256 and the nitride mask layer 258. Materials of the dummy gate dielectric layer and dummy gate electrode layer are similar to that of the dummy gate dielectric layer 108 and dummy gate electrode layer 110 discussed previously, and thus they are not repeated for the sake of brevity.

After formation of the dummy gate structures 250 is completed, gate spacers 260 are formed on sidewalls of the dummy gate structures 250. For example, a spacer material layer is deposited on the substrate 210. The spacer material layer may be a conformal layer that is subsequently etched back to form gate sidewall spacers. In the illustrated embodiment, a spacer material layer 260 is disposed conformally on top and sidewalls of the dummy gate structures 250. The spacer material layer 260 may include a dielectric material such as silicon oxide, silicon nitride, silicon carbide, silicon oxynitride, SiCN films, silicon oxycarbide, SiOCN films, and/or combinations thereof. In some embodiments, the spacer material layer 260 includes multiple layers, such as a first spacer layer 262 and a second spacer layer 264 (illustrated in FIG. 29B) formed over the first spacer layer 262. By way of example, the spacer material layer 260 may be formed by depositing a dielectric material over the gate structures 250 using suitable deposition processes. An anisotropic etching process is then performed on the deposited spacer material layer 260 to expose portions of the fins 230 not covered by the dummy gate structure 250 (e.g., in source/drain regions of the fins 230). Portions of the spacer material layer directly above the dummy gate structure 250 may be completely removed by this anisotropic etching process. Portions of the spacer material layer on sidewalls of the dummy gate structure 250 may remain, forming gate sidewall spacers, which are denoted as the gate spacers 260, for the sake of simplicity. It is noted that although the gate spacers 260 are multi-layer structures in the cross-sectional view of FIG. 29B, they are illustrated as single-layer structures in the perspective view of FIG. 29A for the sake of simplicity.

Figure 30A:
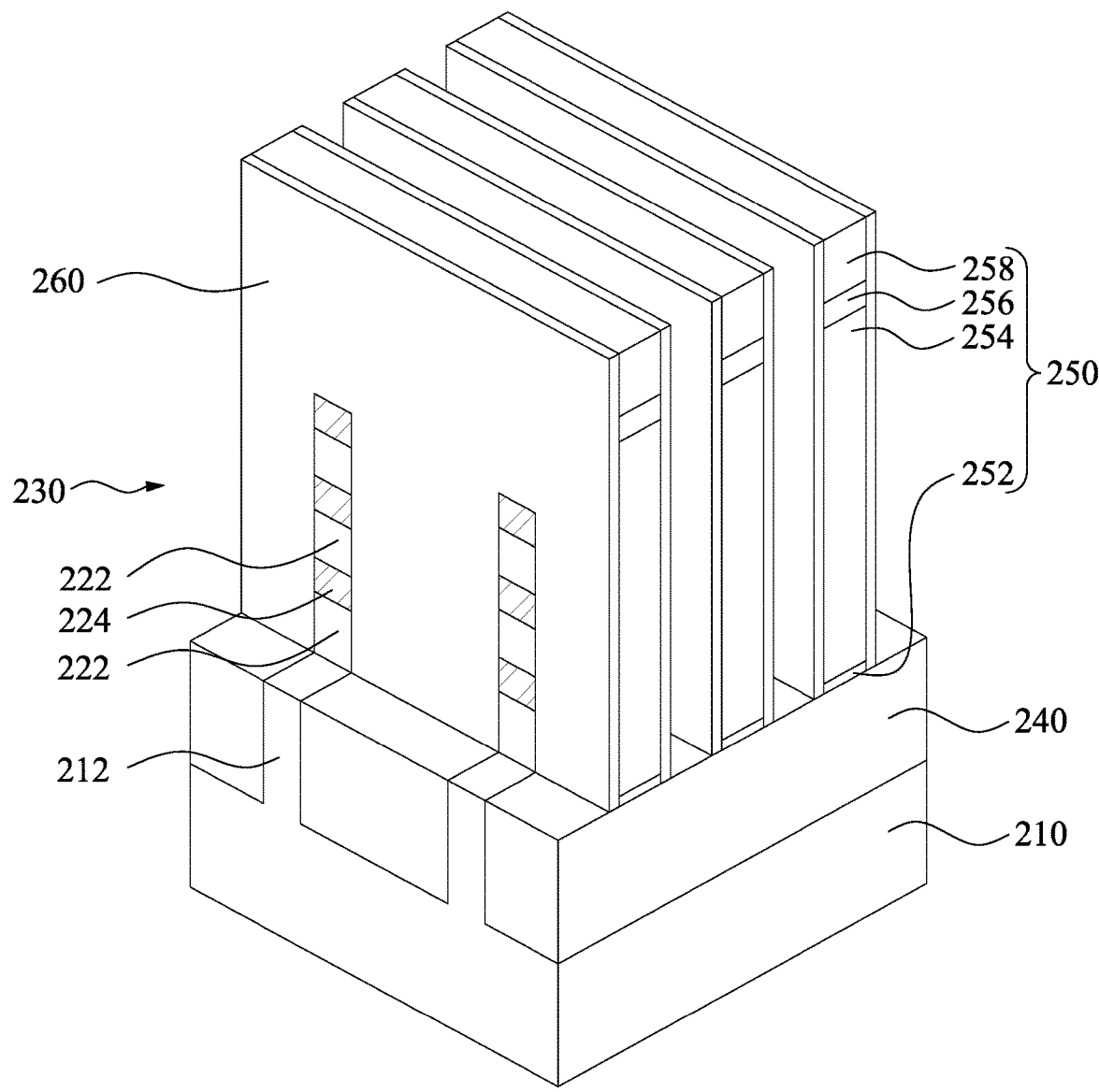
Figure 30B:
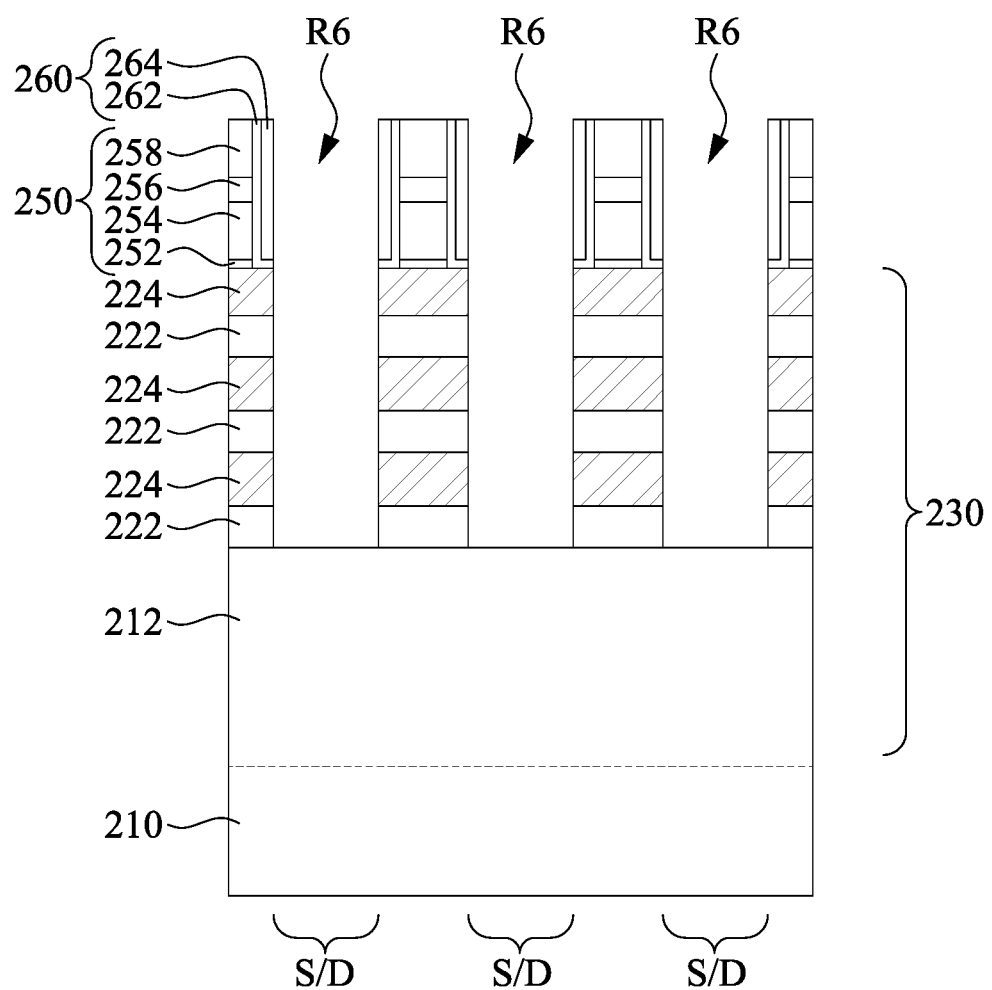

Next, as illustrated in FIGS. 30A and 30B, exposed portions of the semiconductor fins 230 that extend laterally beyond the gate spacers 260 (e.g., in source/drain regions of the fins 230) are etched by using, for example, an anisotropic etching process that uses the dummy gate structure 250 and the gate spacers 260 as an etch mask, resulting in recesses R6 into the semiconductor fins 230 and between corresponding dummy gate structures 250. After the anisotropic etching, end surfaces of the sacrificial layers 222 and channel layers 224 may be aligned with respective outermost sidewalls of the gate spacers 260, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 31A:
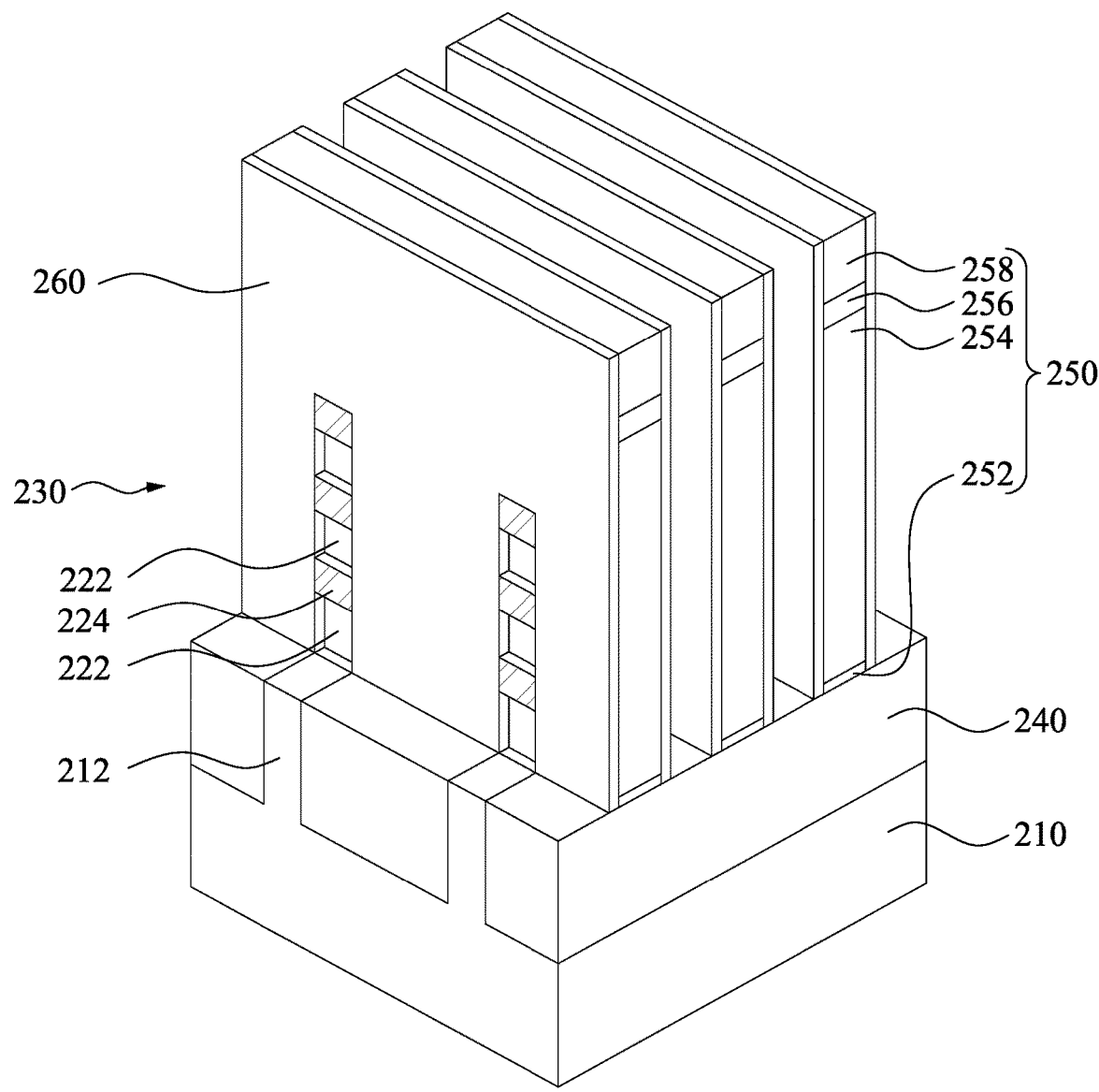
Figure 31B:
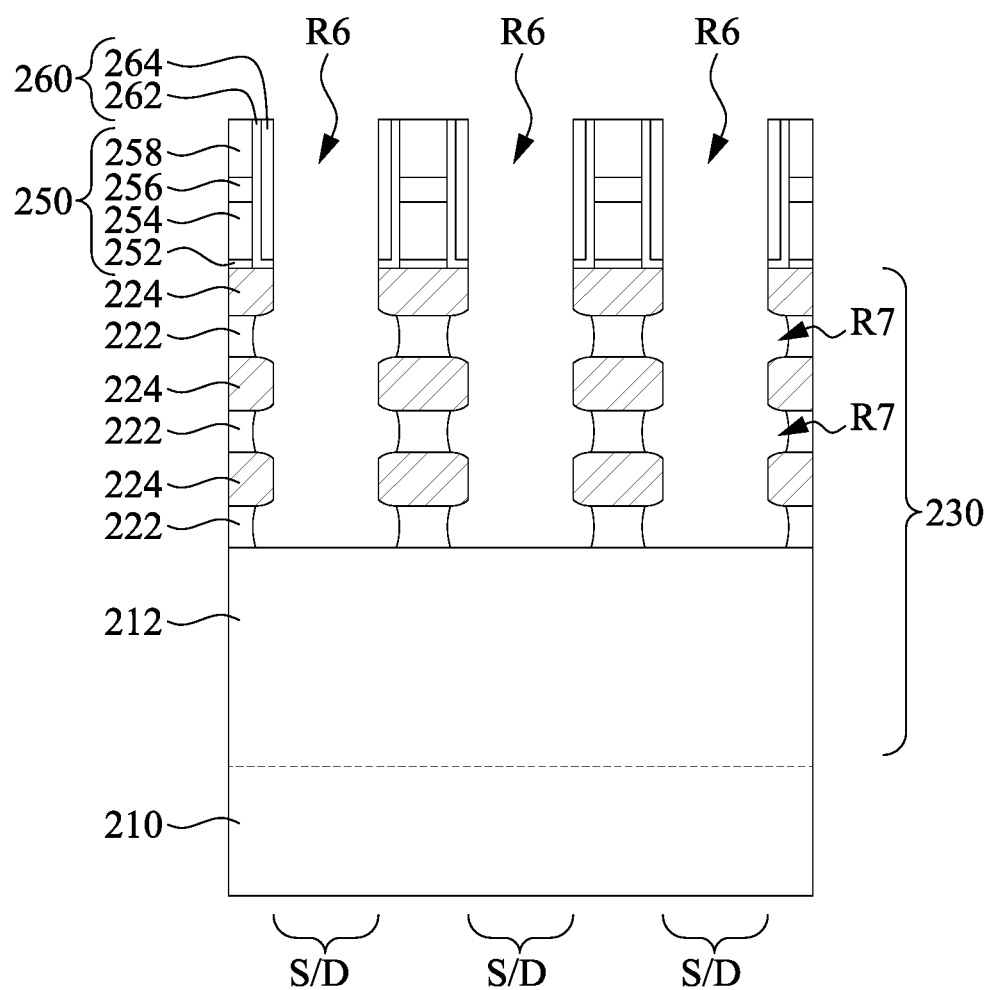

Next, in FIGS. 31A and 31B, the sacrificial layers 222 are laterally or horizontally recessed by using suitable etch techniques, resulting in lateral recesses R7 each vertically between corresponding channel layers 224. This step may be performed by using a selective etching process. By way of example and not limitation, the sacrificial layers 222 are SiGe and the channel layers 224 are silicon allowing for the selective etching of the sacrificial layers 222. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 is not significantly etched by the process of laterally recessing the sacrificial layers 222. As a result, the channel layers 224 laterally extend past opposite end surfaces of the sacrificial layers 222.

Figure 32A:
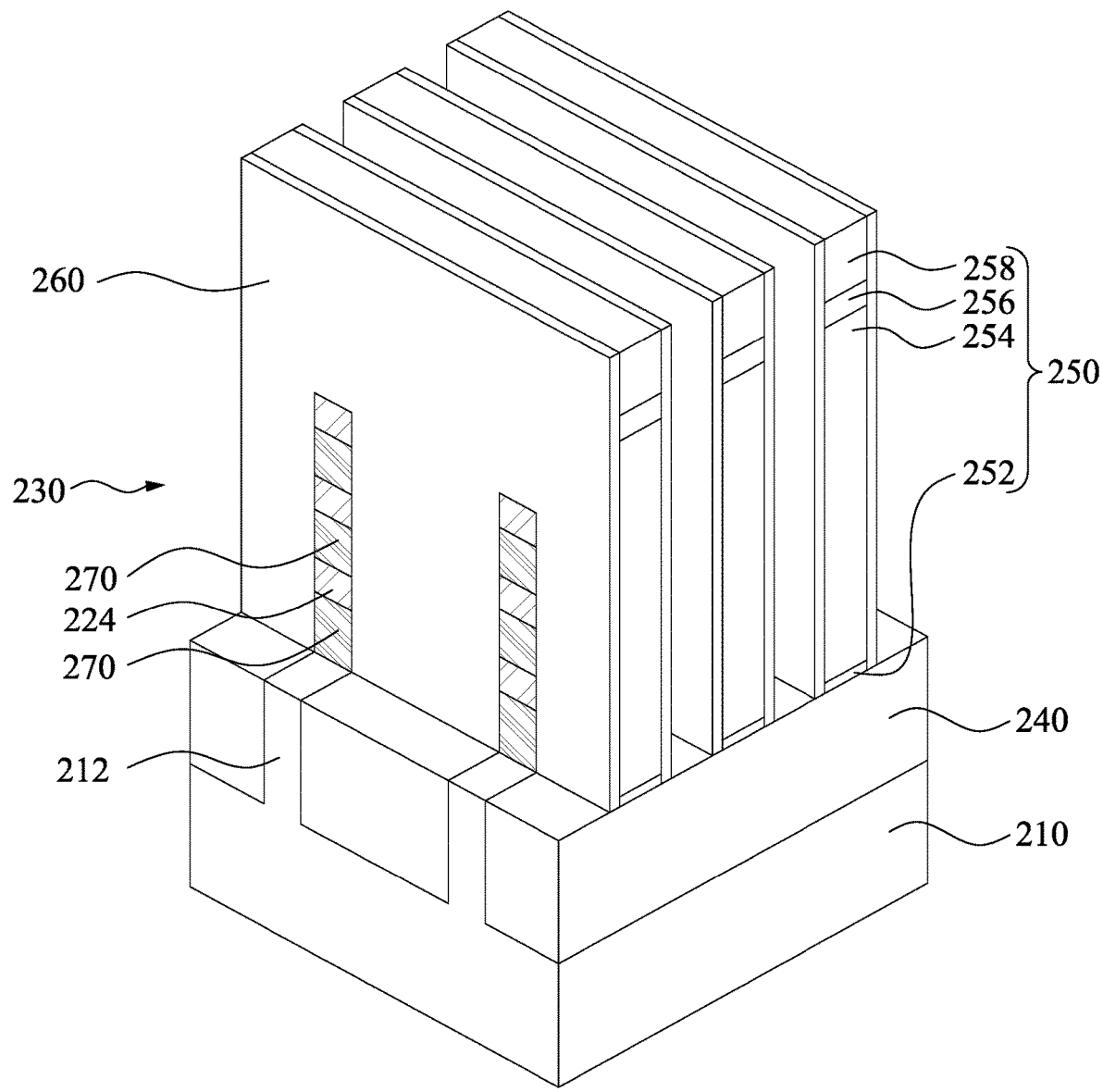
Figure 32B:
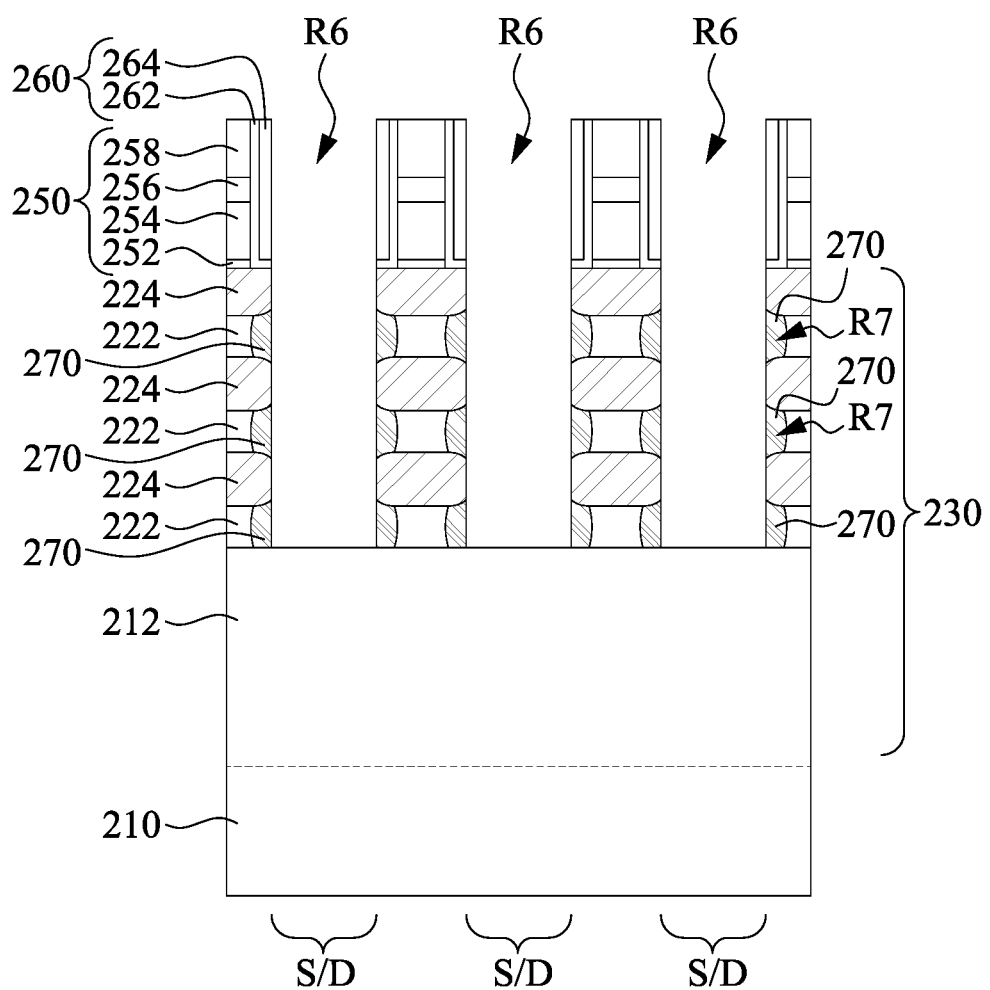

In FIGS. 32A and 32B, an inner spacer material layer 270 is formed to fill the recesses R7 left by the lateral etching of the sacrificial layers 222 discussed above with reference to FIGS. 31A and 31B. The inner spacer material layer 270 may be a low-k dielectric material, such as $SiO_2$, SiN, SiCN, or SiOCN, and may be formed by a suitable deposition method, such as ALD. After the deposition of the inner spacer material layer 270, an anisotropic etching process may be performed to trim the deposited inner spacer material 270, such that only portions of the deposited inner spacer material 270 that fill the recesses R7 left by the lateral etching of the sacrificial layers 222 are left. After the trimming process, the remaining portions of the deposited inner spacer material are denoted as inner spacers 270, for the sake of simplicity. The inner spacers 270 serve to isolate metal gates from source/drain regions formed in subsequent processing. In the example of FIGS. 32A and 32B, sidewalls of the inner spacers 270 are aligned with sidewalls of the channel layers 224.

Figure 33:
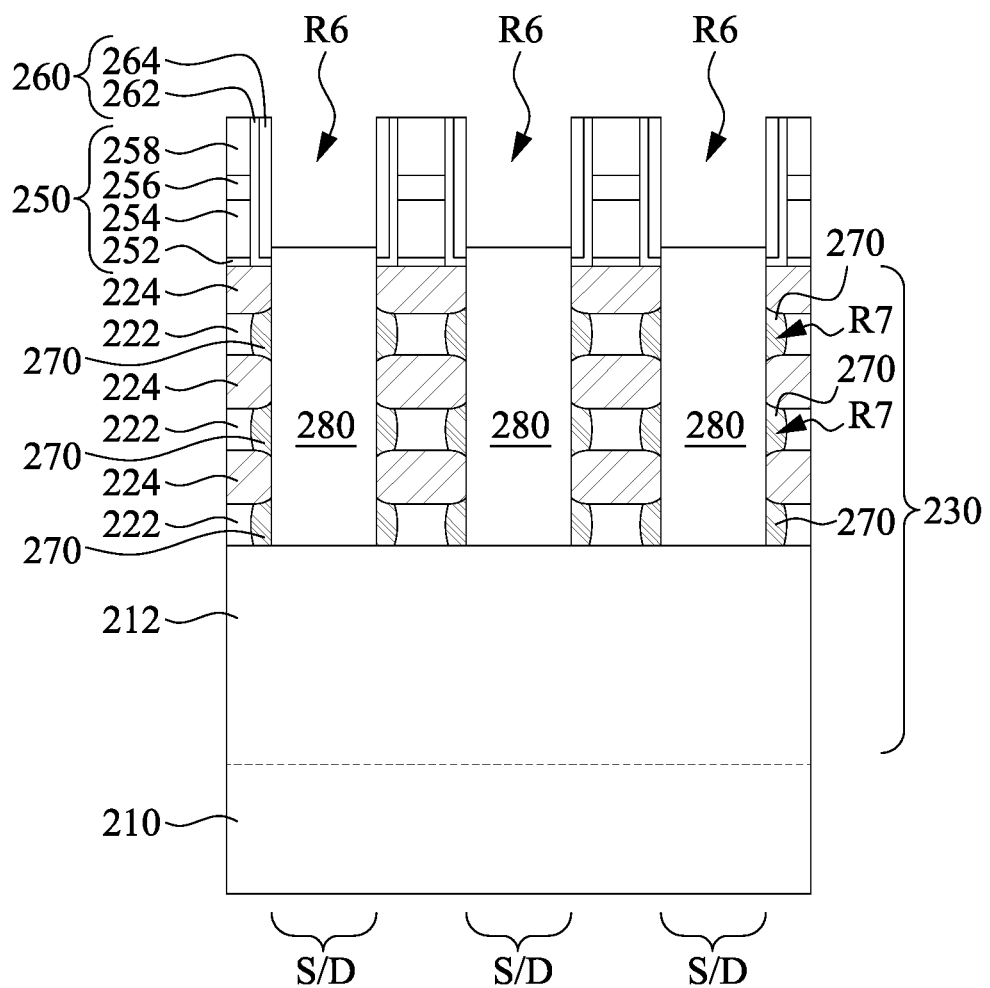

In FIG. 33, source/drain epitaxial structures 280 are formed over the source/drain regions S/D of the semiconductor fins 230. The source/drain epitaxial structures 280 may be formed by performing an epitaxial growth process that provides an epitaxial material on the fins 230. During the epitaxial growth process, the dummy gate structures 250, gate sidewall spacers 260 and the inner spacers 270 limit the source/drain epitaxial structures 280 to the source/drain regions S/D. Materials and process details about the source/drain epitaxial structures 280 of GAA FETs are similar to that of the source/drain epitaxial structures 122 of FinFETs discussed previously, and thus they are not repeated for the sake of brevity.

Figure 34:
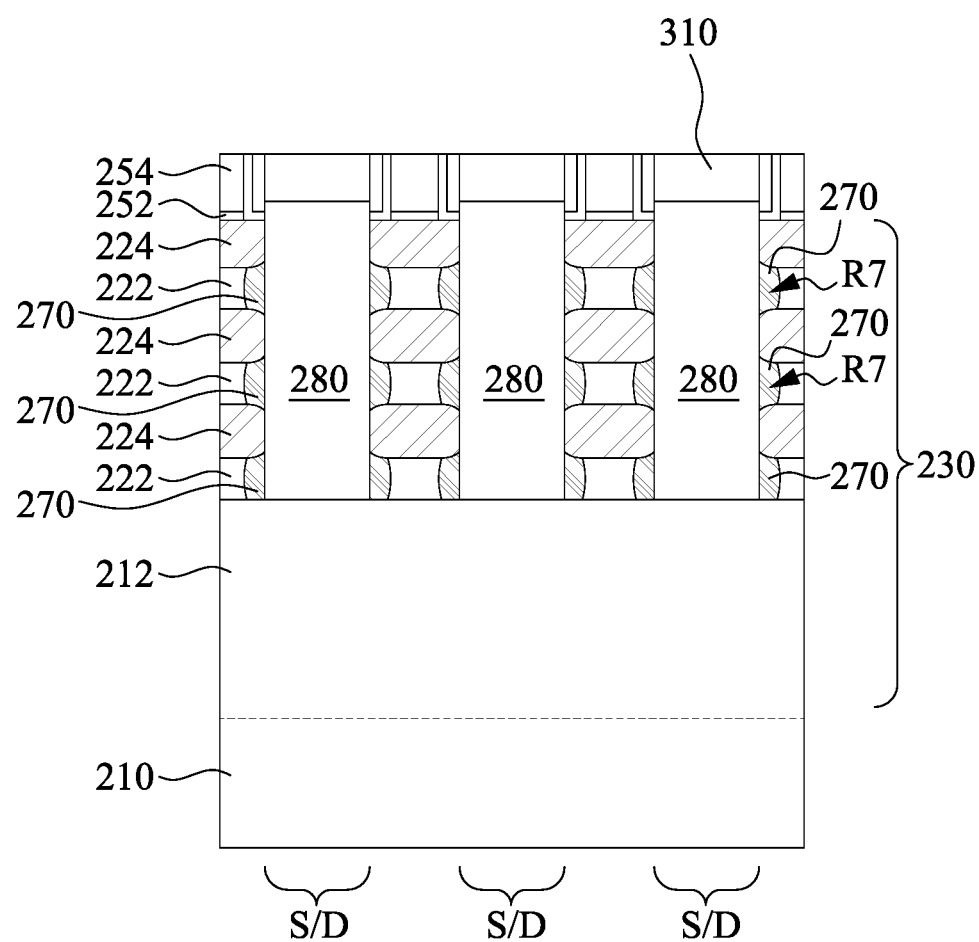
Figure 34:
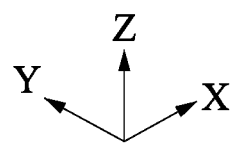
Figure 35:
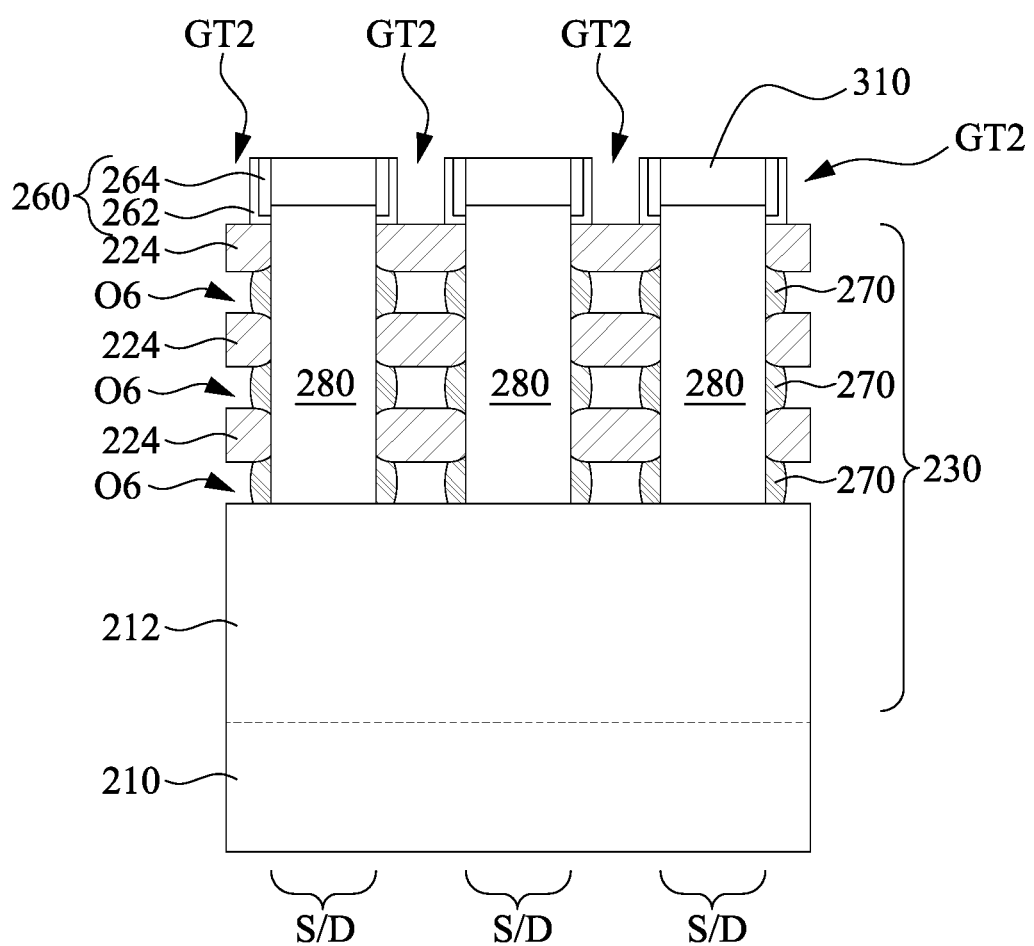

In FIG. 34, an interlayer dielectric (ILD) layer 310 is formed on the substrate 210. In some embodiments, a contact etch stop layer (CESL) is also formed prior to forming the ILD layer 310. Materials and process details about the ILD layer 310 is similar to that of the ILD layer 126, and thus they are not repeated for the sake of brevity. In some examples, after depositing the ILD layer 310, a planarization process may be performed to remove excessive materials of the ILD layer 310. For example, a planarization process includes a chemical mechanical planarization (CMP) process which removes portions of the ILD layer 310 (and CESL layer, if present) overlying the dummy gate structures 250 and planarizes a top surface of the integrated circuit structure 200. In some embodiments, the CMP process also removes hard mask layers 256, 258 (as shown in FIG. 33) and exposes the dummy gate electrode layer 254.

Thereafter, dummy gate structures 250 (as shown in FIG. 34) are removed first, and then the sacrificial layers 222 are removed. The resulting structure is illustrated in FIG. 35. In some embodiments, the dummy gate structures 250 are removed by using a selective etching process (e.g., selective dry etching, selective wet etching, or a combination thereof) that etches the materials in dummy gate structures 250 at a faster etch rate than it etches other materials (e.g., gate sidewall spacers 260 and/or ILD layer 310), thus resulting in gate trenches GT2 between corresponding gate sidewall spacers 260, with the sacrificial layers 222 exposed in the gate trenches GT2. Subsequently, the sacrificial layers 222 in the gate trenches GT2 are removed by using another selective etching process that etches the sacrificial layers 222 at a faster etch rate than it etches the channel layers 224, thus forming openings O6 between neighboring channel layers 224. In this way, the channel layers 224 become nanosheets suspended over the substrate 210 and between the source/drain epitaxial structures 280. This step is also called a channel release process. At this interim processing step, the openings O6 between nanosheets 224 may be filled with ambient environment conditions (e.g., air, nitrogen, etc). In some embodiments, the nanosheets 224 can be interchangeably referred to as nanowires, nanoslabs and nanorings, depending on their geometry. For example, in some other embodiments the channel layers 224 may be trimmed to have a substantial rounded shape (i.e., cylindrical) due to the selective etching process for completely removing the sacrificial layers 222. In that case, the resultant channel layers 224 can be called nanowires.

In some embodiments, the sacrificial layers 222 are removed by using a selective wet etching process. In some embodiments, the sacrificial layers 222 are SiGe and the channel layers 224 are silicon allowing for the selective removal of the sacrificial layers 222. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 224 may not be significantly etched by the channel release process. It can be noted that both the channel release step and the previous step of laterally recessing sacrificial layers (the step as shown in FIGS. 31A and 31B) use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Figure 36A:
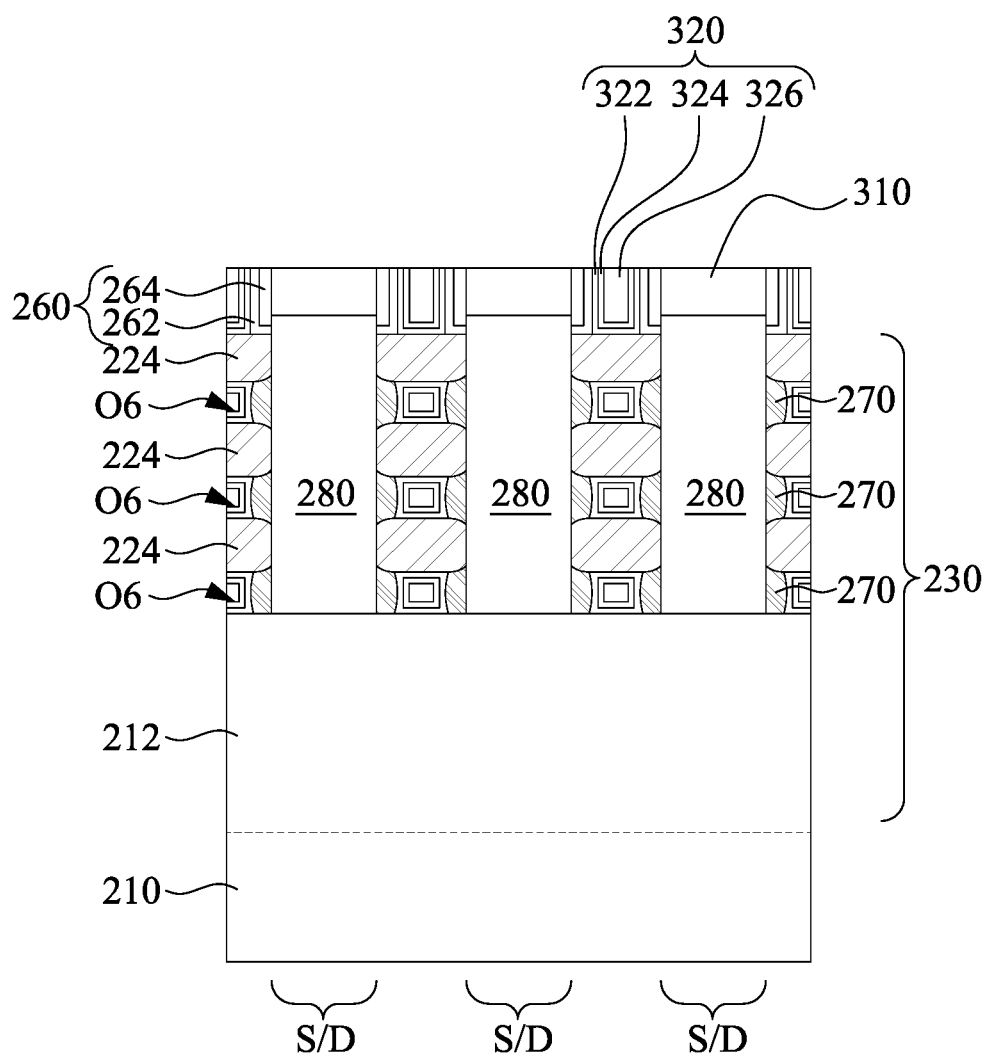
Figure 36B:
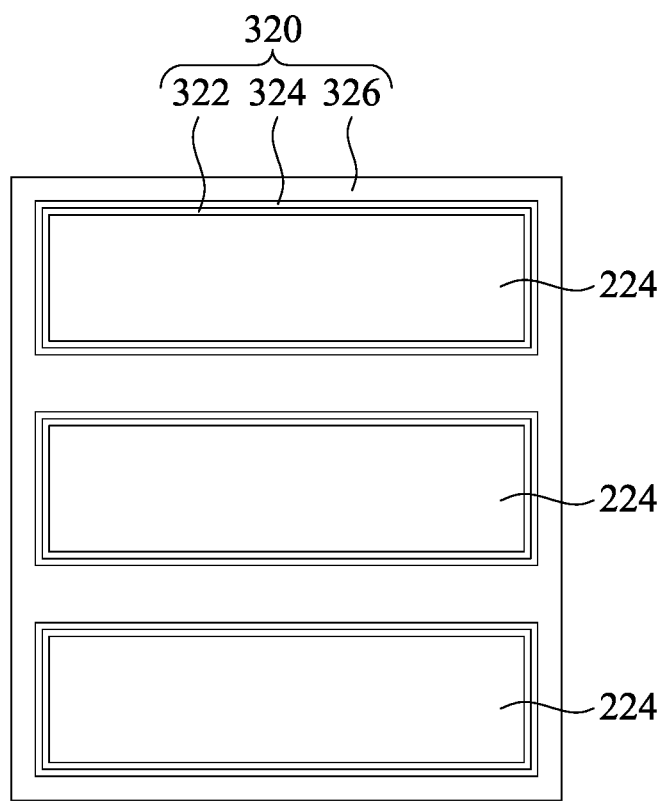

In FIGS. 36A and 36B, replacement gate structures 320 are respectively formed in the gate trenches GT2 to surround each of the nanosheets 224 suspended in the gate trenches GT2. The gate structure 320 may be the final gate of a GAA FET. The final gate structure may be a high-k/metal gate stack, however other compositions are possible. In some embodiments, each of the gate structures 320 forms the gate associated with the multi-channels provided by the plurality of nanosheets 224. For example, high-k/metal gate structures 320 are formed within the openings O6 (as illustrated in FIG. 35) provided by the release of nanosheets 224. In various embodiments, the high-k/metal gate structure 320 includes a gate dielectric layer 322 formed around the nanosheets 224, a work function metal layer 324 formed around the gate dielectric layer 322, and a fill metal 326 formed around the work function metal layer 324 and filling a remainder of gate trenches GT2. The gate dielectric layer 322 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 324 and/or fill metal layer 326 used within high-k/metal gate structures 320 may include a metal, metal alloy, or metal silicide. Formation of the high-k/metal gate structures 320 may include depositions to form various gate materials, one or more liner layers, and one or more CMP processes to remove excessive gate materials. As illustrated in a cross-sectional view of FIG. 36B that is taken along a longitudinal axis of a high-k/metal gate structure 320, the high-k/metal gate structure 320 surrounds each of the nanosheets 224, and thus is referred to as a gate of a GAA FET. Materials and process details about the gate structures 320 of GAA FETs are similar to the gate structures 130 of FinFETs, and thus they are not repeated for the sake of brevity.

Figure 37:
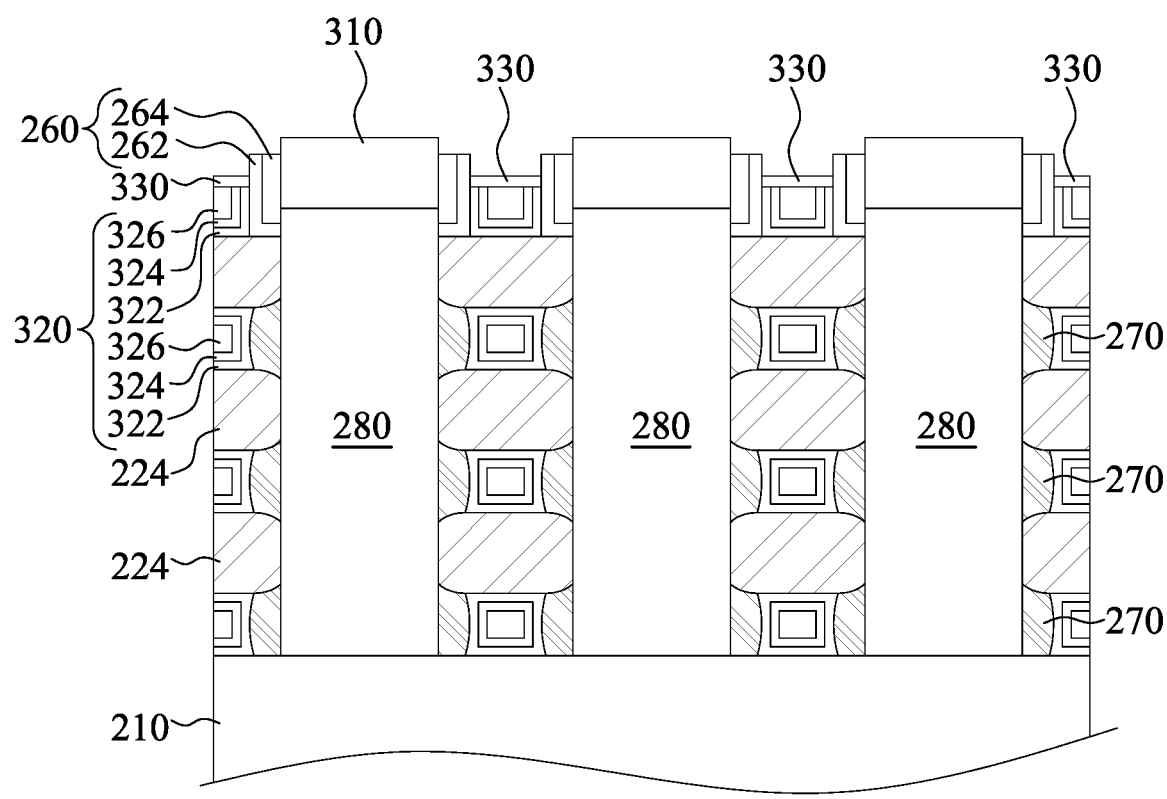

In FIG. 37, an etching back process is performed to etch back the replacement gate structures 320 and the gate spacers 260, resulting in recesses over the etched-back gate structures 320 and the etched-back gate spacers 260. In some embodiments, because the materials of the replacement gate structures 320 have a different etch selectivity than the gate spacers 260, the top surfaces of the replacement gate structures 320 may be at a different level than the top surfaces of the gate spacers 260. For example, in the depicted embodiment as illustrated in FIG. 37, the replacement gate structures 320's top surfaces are lower than the top surfaces of the gate spacers 260. However, in some other embodiments, the top surfaces of the replacement gate structures 320 may be level with or higher than the top surfaces of the gate spacers 260.

Then, metal caps 330 are formed respectively atop the replacement gate structures 320 by suitable process, such as CVD or ALD. The metal caps 330 may be, by way of example and not limitation, substantially fluorine-free tungsten (FFW) films having an amount of fluorine contaminants less than 5 atomic percent and an amount of chlorine contaminants greater than 3 atomic percent. Process Detail about FFW formation is discussed previously with respect to the metal caps 138, and thus they are not repeated for the sake of brevity.

Figure 38:
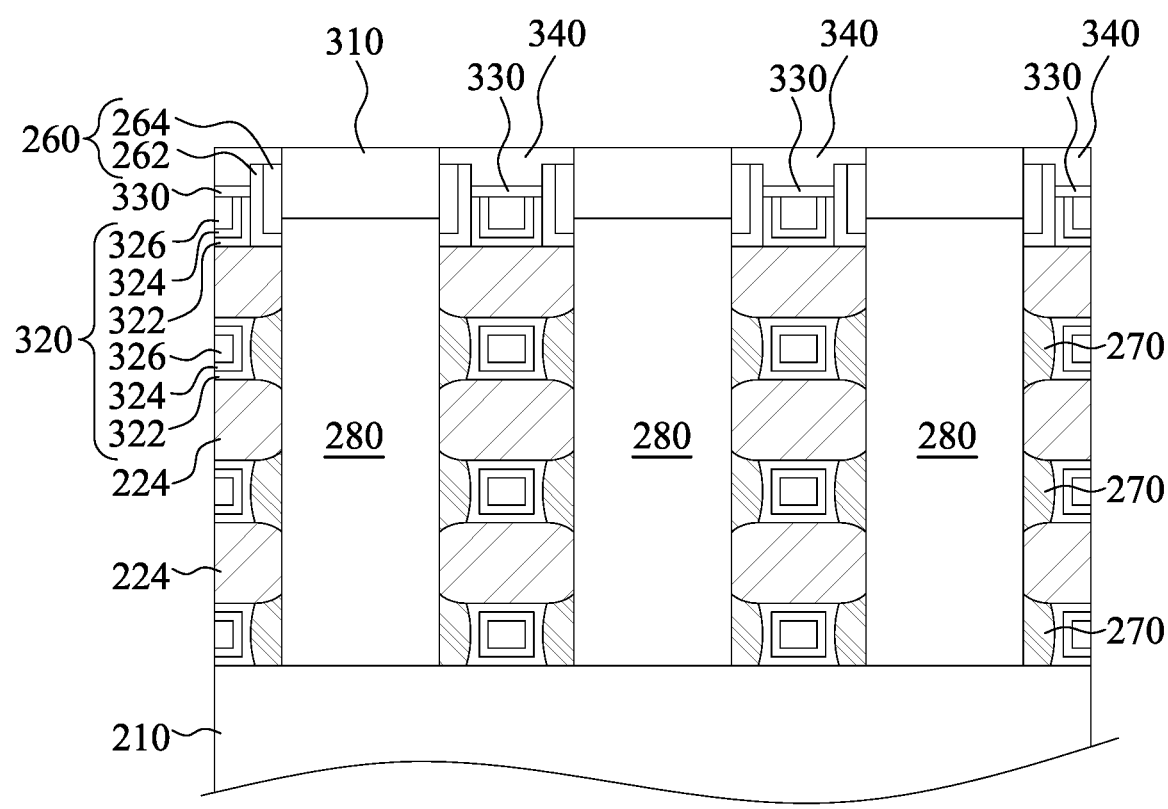

In FIG. 38, gate dielectric caps 340 are formed over the metal caps 330 and the gate spacers 260. Because the metal caps 330 have top surfaces lower than top surfaces of the gate spacers 260, each of the dielectric caps 340 has a stepped bottom surface with a lower step contacting a top surface of a metal cap 330 and an upper step contacting a top surface of the gate spacer 260. Materials and process details about the dielectric caps 340 are similar to that of the dielectric caps 142 discussed previously, and thus they are not repeated for the sake of brevity.

Figure 39:
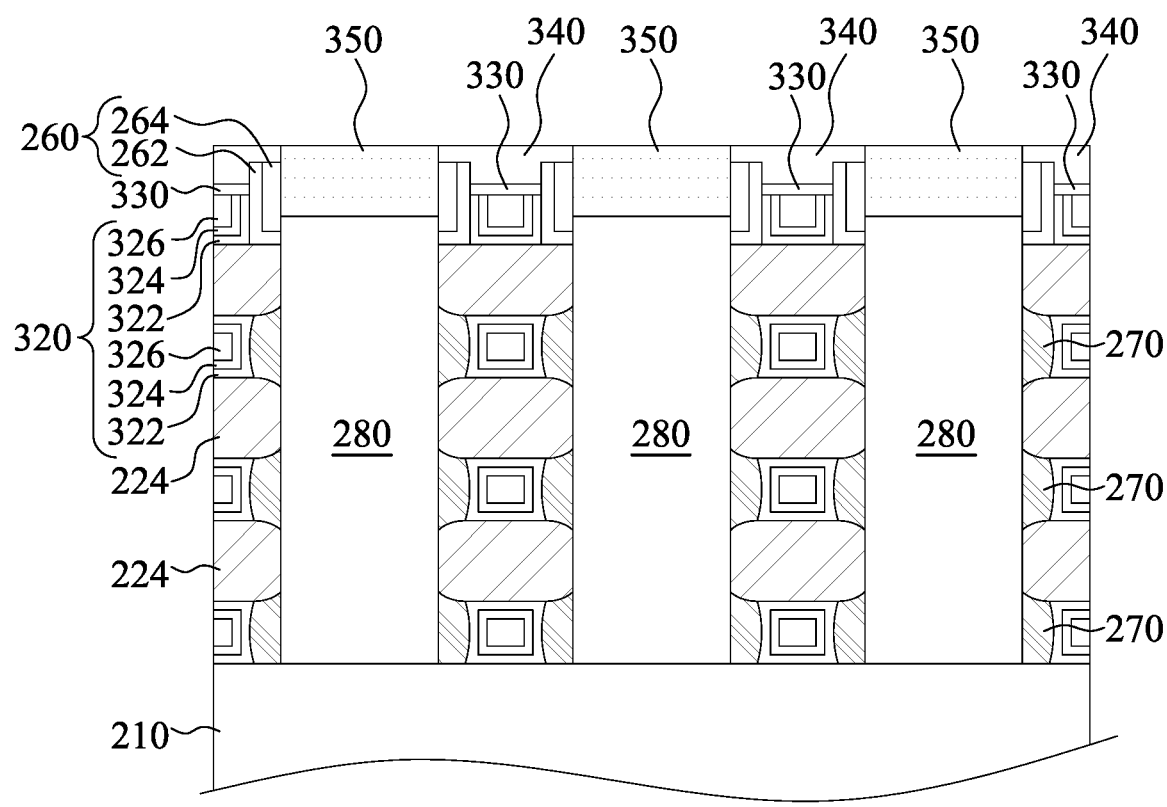

In FIG. 39, source/drain contacts 350 are formed extending through the ILD layer 310. Formation of the source/drain contacts 350 includes, by way of example and not limitation, performing one or more etching processes to form contact openings extending though the ILD layer 310 to expose the source/drain epitaxial structures 280, depositing one or more metal materials overfilling the contact openings, and then performing a CMP process to remove excessive metal materials outside the contact openings. In some embodiments, the one or more etching processes are selective etching that etches the ILD layer 310 at a faster etch rate than etching the dielectric caps 340 and the gate spacers 260. As a result, the selective etching is performed using the dielectric caps 340 and the gate spacers 260 as an etch mask, such that the contact openings and hence source/drain contacts 350 are formed self-aligned to the source/drain epitaxial structures 280 without using an additional photolithography process. In that case, dielectric caps 340 allowing for forming the self-aligned contacts 350 can be called SAC caps 340.

Figure 40:
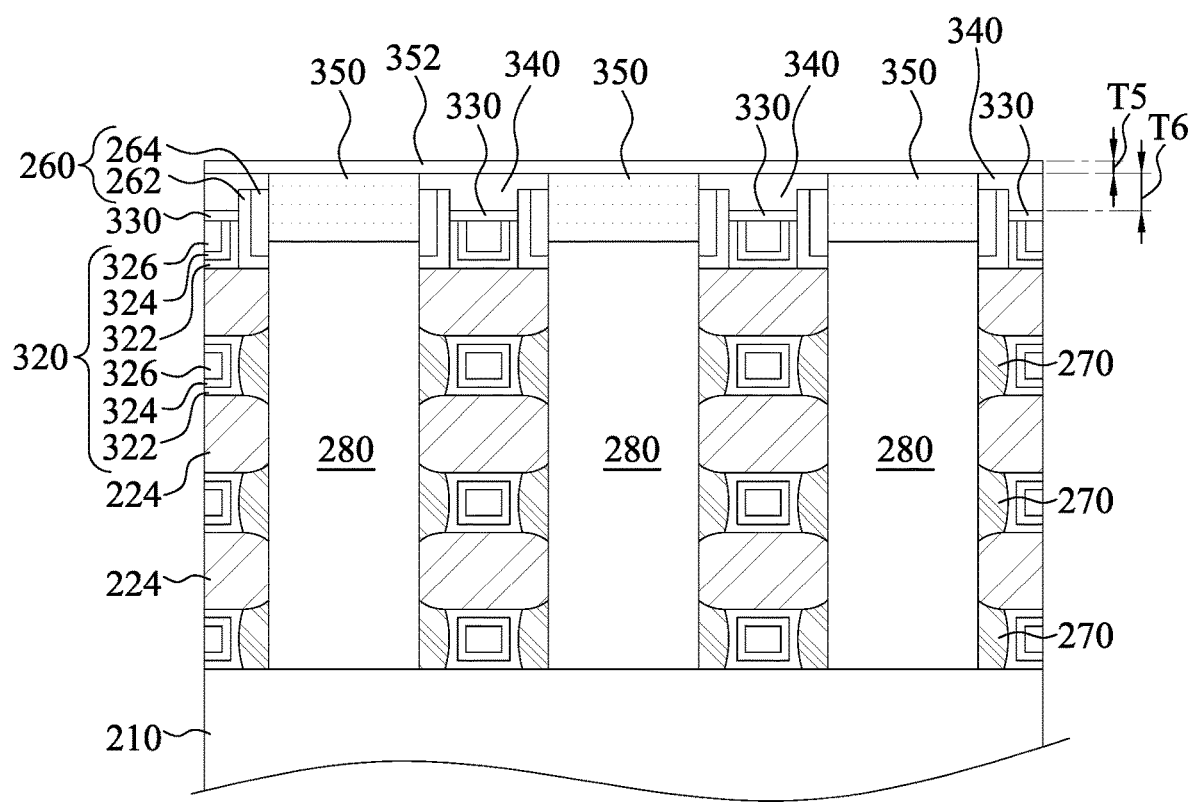

In FIG. 40, an etch-resistant layer 352 is formed over the gate dielectric caps 340 and the source/drain contacts 350, by using an ALD process, a PECVD process, and/or other suitable deposition processes. In some embodiments, the etch-resistant layer 352 is made of a material different from a material of the gate dielectric caps 340 and a material of a subsequently formed MCESL. For example, when the gate dielectric caps 340 and the subsequently formed MCESL are made of nitride-based material(s) (e.g. silicon nitride), the etch-resistant layer 352 is made of an oxide-based material, such as silicon oxide, TEOS oxide, a silicon-rich silicon oxide, or another suitable oxide-based dielectric materials. Because of the material difference, the etch-resistant layer 352 has a different etch selectivity than the subsequently formed MCESL and the gate dielectric caps 340. As a result, the etch-resistant layer 352 can have a slower etch rate in a following LRM etching process than both the gate dielectric caps 340 and the MCESL, which allows for slowing down the LRM etching process, as will be discussed in greater detail below.

In some embodiments, the etch-resistant layer 352 has a thickness T5. In some embodiments, for 3 nm technology node the thickness T5 is in a range from about 1 Angstroms to about 50 Angstroms. In some further embodiments, a ratio of the thickness T5 to a maximal thickness T6 of the gate dielectric caps 340 is in a range from about 3:100 to about 60:100. If the thickness ratio T5/T6 is excessively small, the etch-resistant layer 352 may be too thin to slow down the subsequent LRM etching process. If the thickness ratio T5/T6 is excessively large, the etch-resistant layer 352 may be too thick to be punched through within an expected duration time. For other technology nodes, such as 20 nm node, 16 nm node, 10 nm node, 7 nm node, and/or 5 nm node, the thickness T5 of the etch-resistant layer 352 may be in a range from about 1 nm to about 20 nm.

Figure 41:
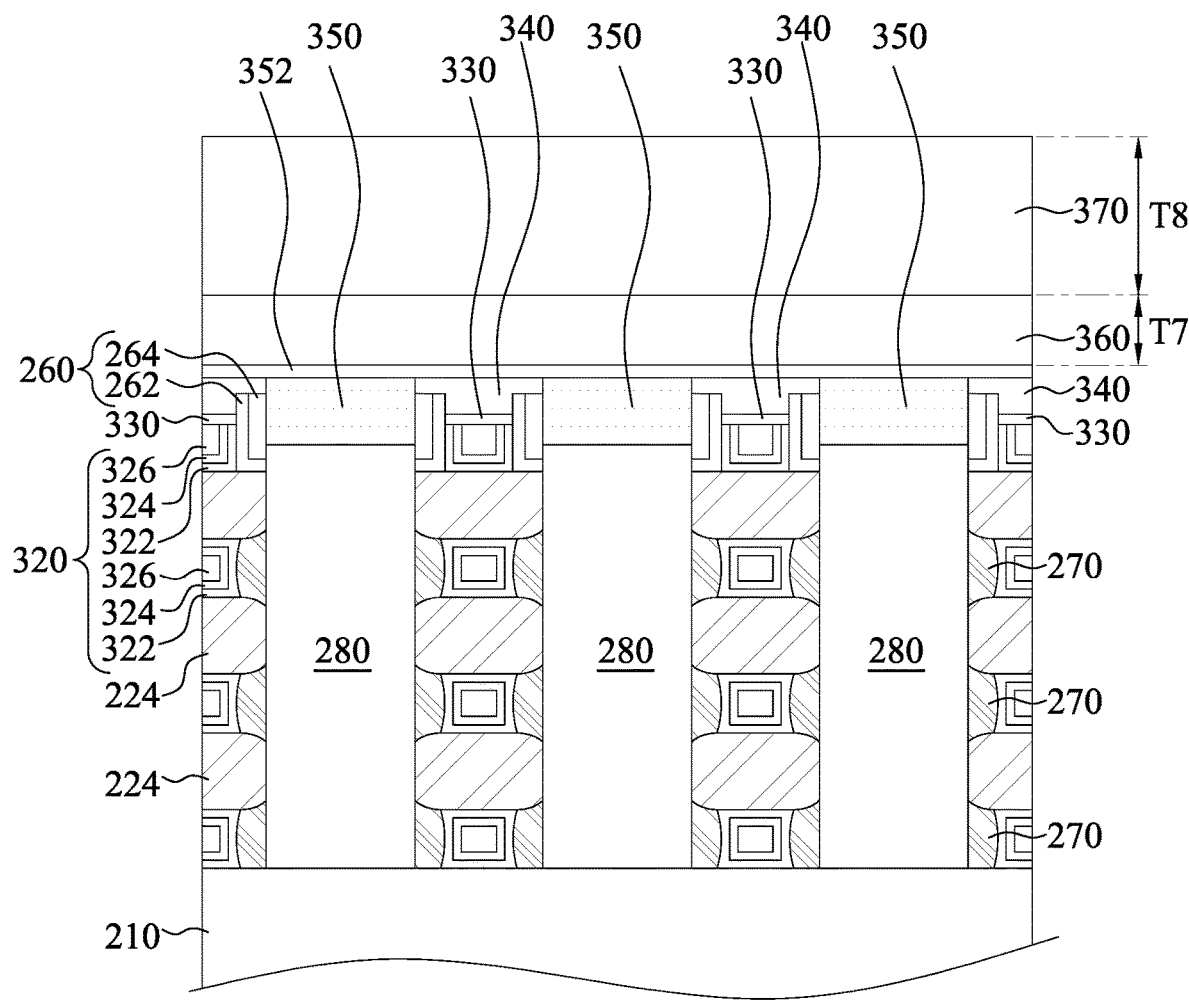

In FIG. 41, after the etch-resistant layer 352 has been formed over the gate dielectric caps 340, a MCESL 360 is then deposited over the etch-resistant layer 352. Subsequently, another ILD layer 370 is deposited over the MCESL 360. In some embodiments, the gate dielectric caps 340 and the MCESL 360 are both nitride-based materials (e.g., silicon nitride), and the etch-resistant layer 352 and the ILD layer 370 are both oxide-based materials (e.g., silicon oxide), and thus the ILD layer 370 and the etch-resistant layer 352 have a different etch selectivity than both the gate dielectric caps 340 and the MCESL 360. In some embodiments, the MCESL 360 has a thickness T7 greater than the thickness T5 of the etch-resistant layer 352. For example, the thickness T7 of the MCESL 360 is in a range from about 3 nm to about 20 nm. In some embodiments, the ILD layer 370 has a thickness T8 greater than the thickness T7 of the MCESL 360 and the thickness T5 of the etch-resistant layer 352. In some further embodiments, the thickness T8 of the ILD layer 370 is greater than a total thickness of the MCESL 360 and the etch-resistant layer 352. For example, the thickness T8 of the ILD layer 370 in a range from about 3 nm to about 100 nm.

Figure 42:
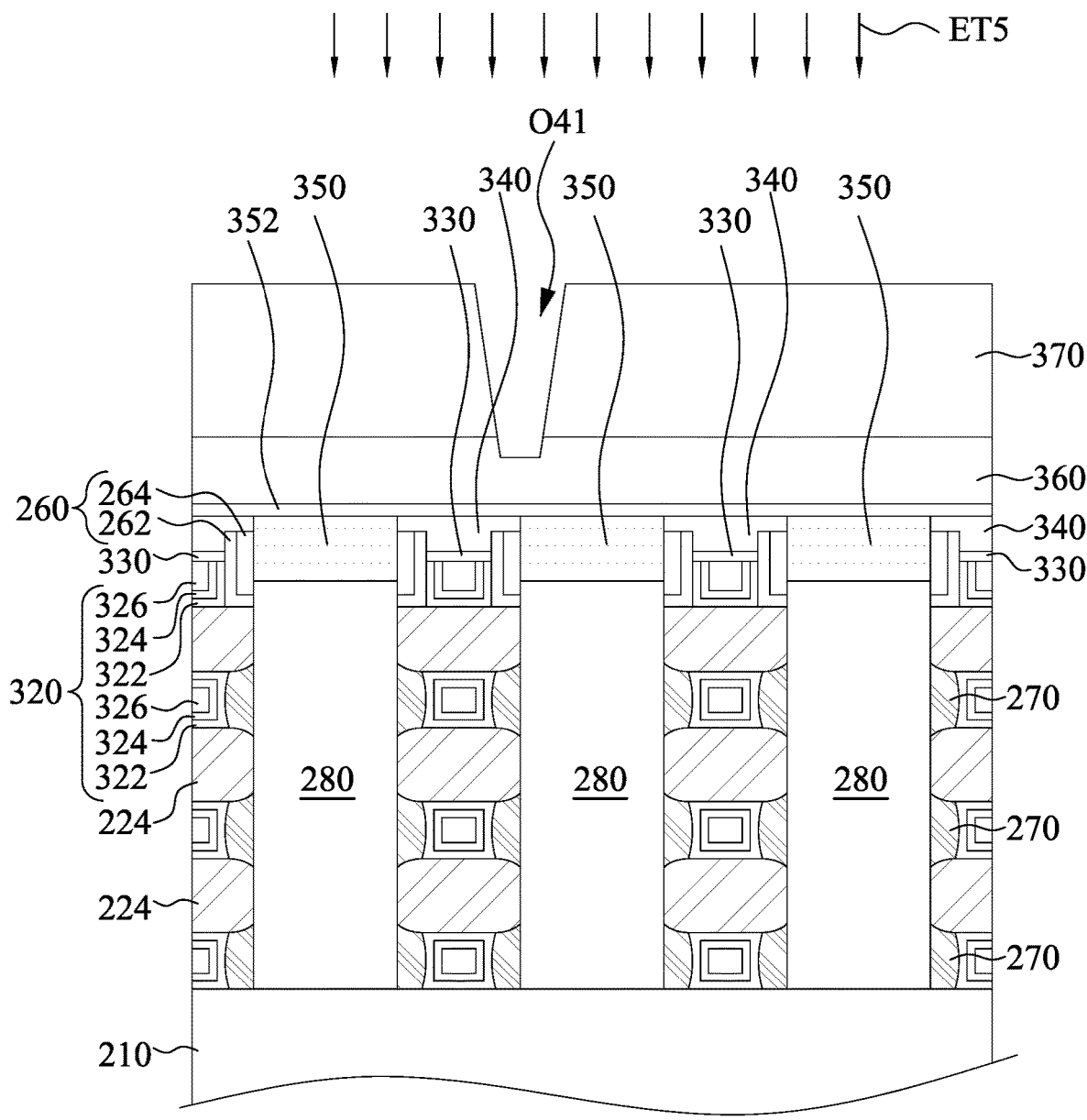

In FIG. 42, the ILD layer 370 is patterned to form a via opening O41 extending through the ILD layer 370 by using a via etching process ET5. In some embodiments, the via etching process ET5 is an anisotropic etching process, such as a plasma etching. Process details about the via etching process ET5 is similar to that of the via etching process ET1 discussed previously, and thus they are not repeated for the sake of brevity.

Figure 43:
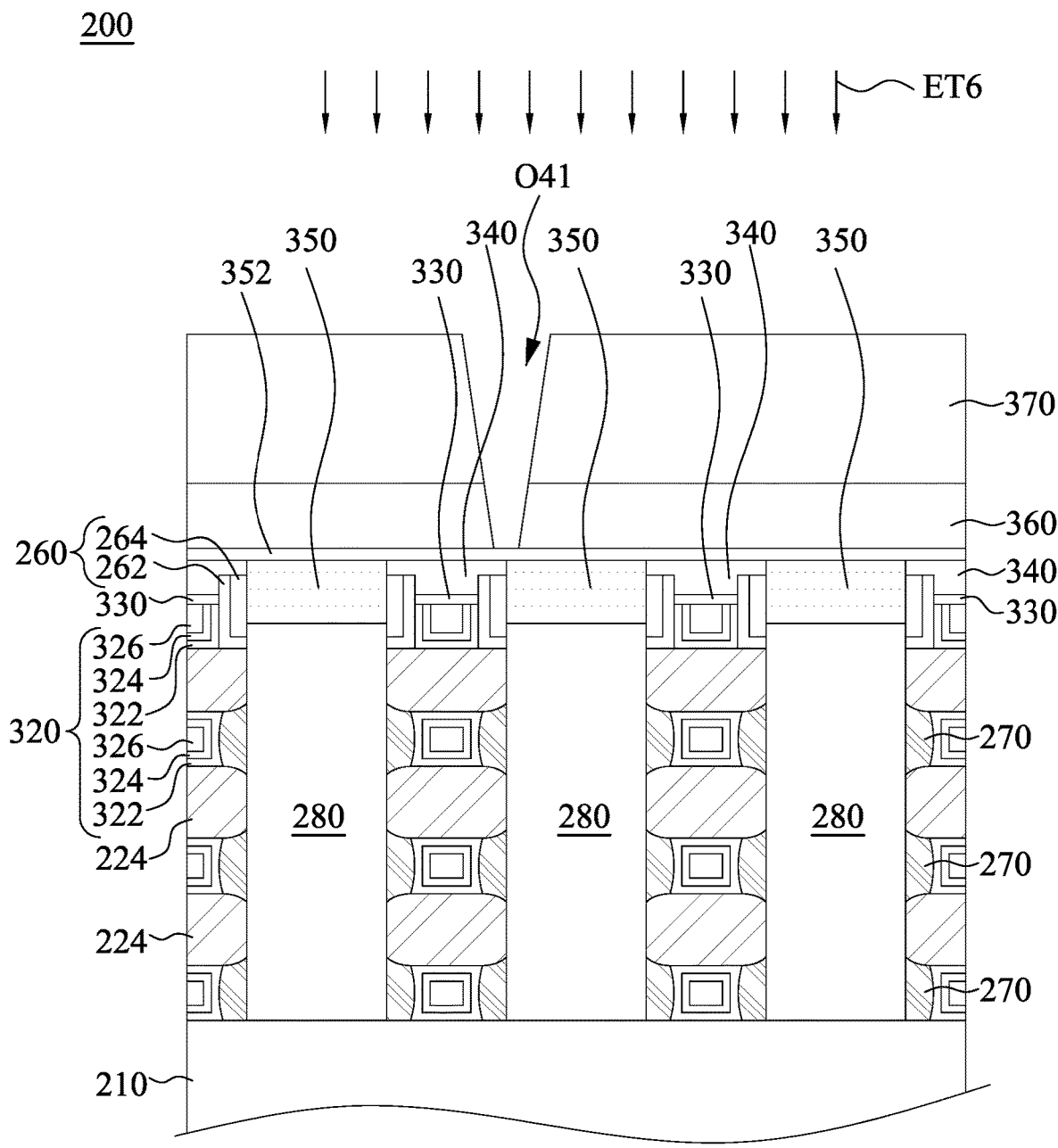
Figure 44:
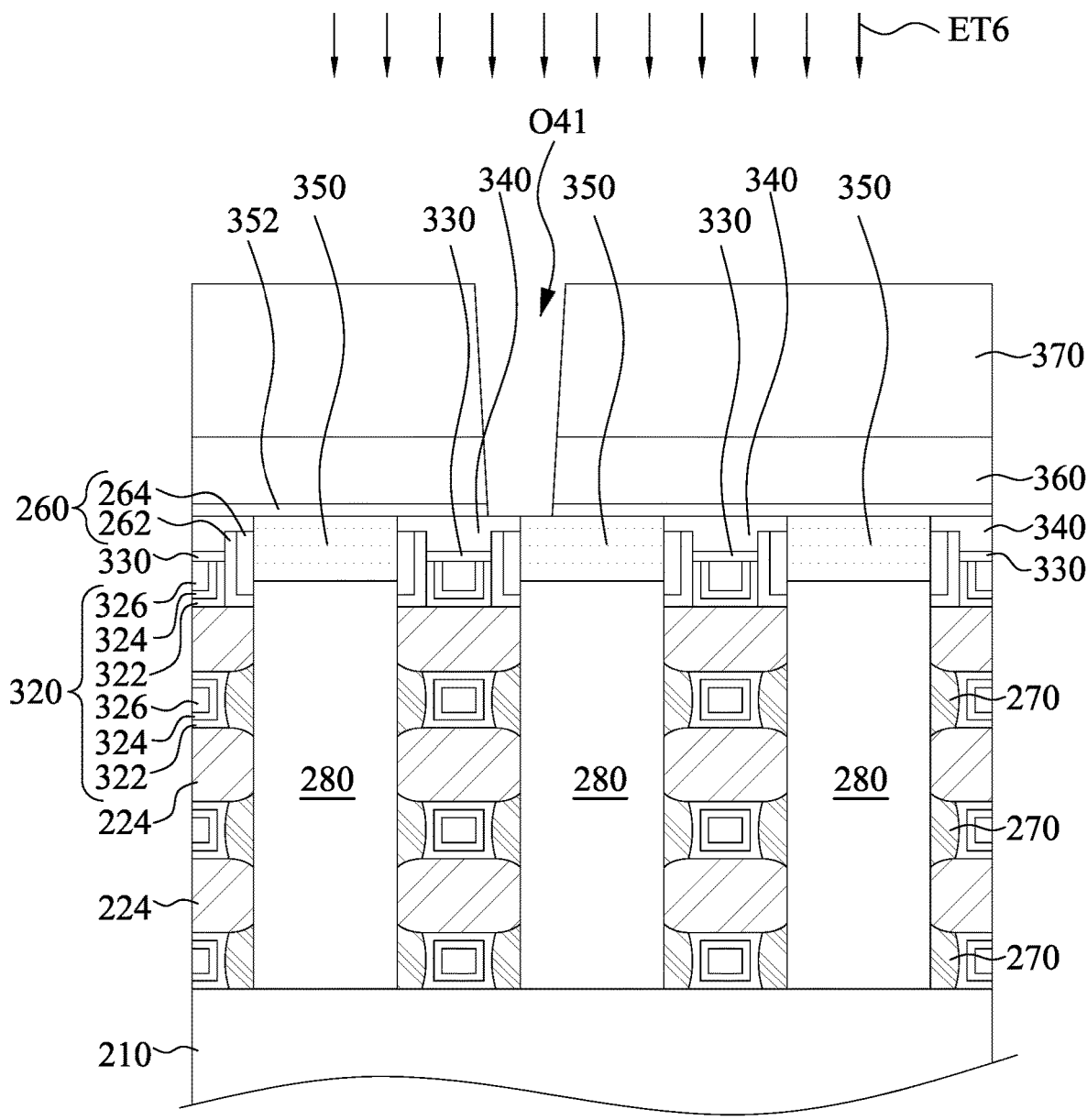

FIG. 43 illustrates a cross-sectional view of an initial stage of a LRM etching process ET6, and FIG. 44 illustrates a final stage of the LRM etching process ET6 in accordance with some embodiments of the present disclosure. The etching time duration of the LRM etching process ET6 is controlled to break through the MCESL 360 and the etch-resistant layer 352, thus deepening or extending the via opening O41 down to a target source/drain contact 350. As a result of the LRM etching process ET6, the target source/drain contact 350 gets exposed at a bottom of the deepened via opening O41. Process details about the LRM etching process ET6 are discussed previously with respect to the LRM etching process ET2, and thus they are not repeated herein for the sake of brevity.

Because the etch selectivity between the etch-resistant layer 352 and the MCESL 360, the etch-resistant layer 352 can slow down LRM etching process ET6 when the MCESL 360 is punched through, which in turn will slow down the vertical etch rate and the depth increasing in the via opening O41 when the via opening O41 reaches the etch-resistant layer 352. The slowed-down depth increasing can thus prevent the tiger tooth-like pattern formed in the via opening O41, which in turn reduces the risk of leakage current. Moreover, because the etch-resistant layer 352 slows down the vertical etch rate but not the lateral etch rate when the via opening O41 reaches the etch-resistant layer 352, the LRM etching process ET6 can laterally expand the lower portion of the via opening O41 during etching the etch-resistant layer 352, such that the bottom width of the via opening O41 can be increased, and the sidewall profiled of via opening O41 can become more vertical or steeper than before etch-resistant layer 352 is punched through, as illustrated in FIGS. 43-44.

In some embodiments as illustrated in FIG. 44, the via opening O41 may expose a partial region of a target source/drain contact 350 and a partial region of a gate dielectric cap 340 next to the target source/drain contact 350. Such misalignment between the via opening O41 and the target source/drain contact 350 may be inadvertently formed due to inaccuracies of the via etching process ET5 and/or the LRM etching process ET6 (e.g., misalignment occurring during the photolithography process that is used to define the patterns of via openings O41 in a patterned photoresist coated over the ILD layer 370). However, even in this misalignment scenario, the gate dielectric cap 340 next to the target source/drain contact 350 would not be inadvertently over-etched to form a tiger tooth-like recess, because the depth increasing in the via opening O41 is slowed down during punching through the etch-resistant layer 352 as discussed previously. Given that the via opening O41 has no or negligible tiger tooth-like recess, the risk of leakage current (e.g., leakage current between the gate structure 320 and the source/drain via subsequently formed in the via opening O41) can be reduced.

Figure 45A:
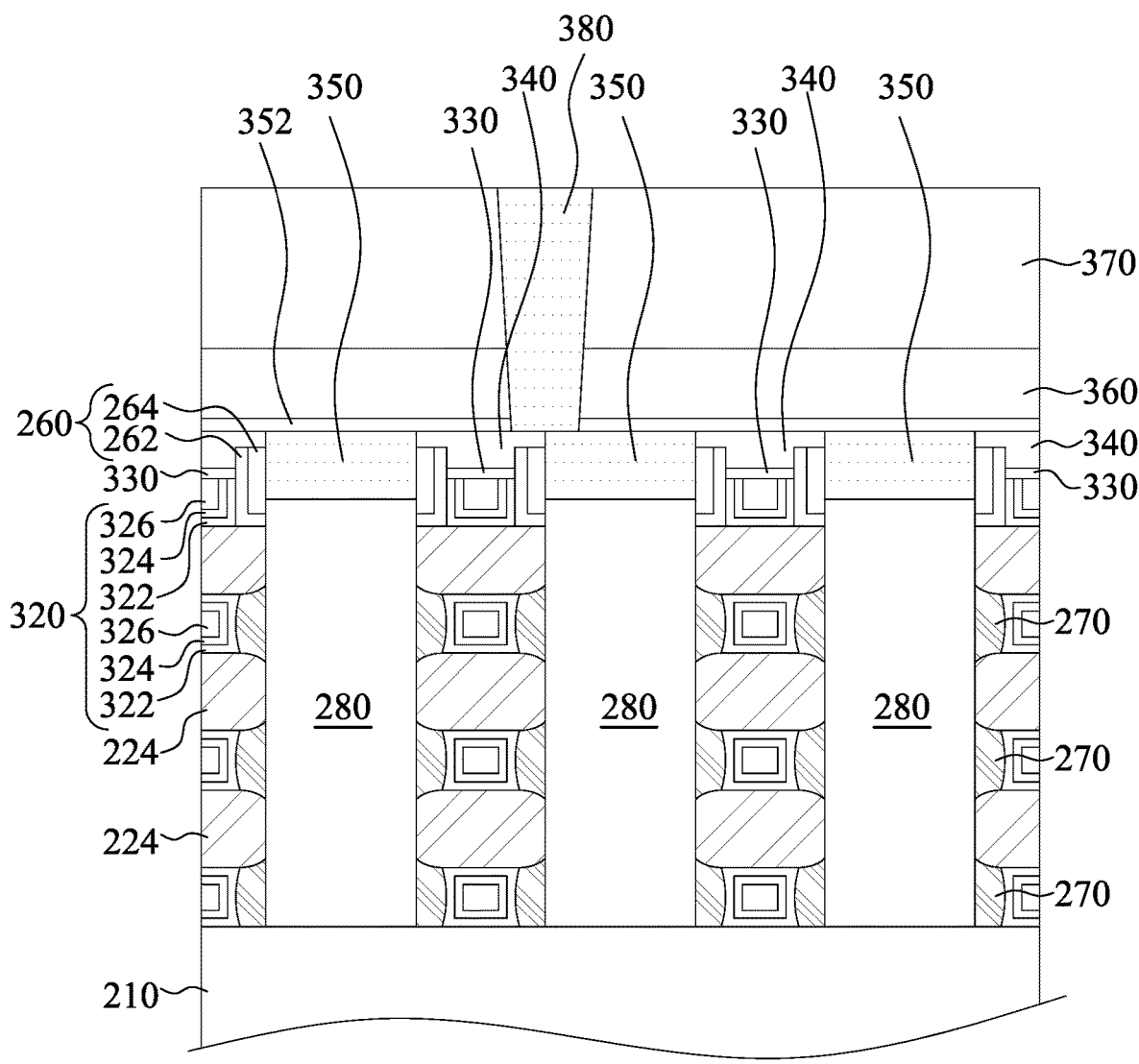

Next, in FIG. 45A, a source/drain via 380 is then formed in the via opening O41 to make physical and electrical connection to the target source/drain contact 350. Materials and process details about the source/drain via 380 are similar to that of the source/drain via 150 discussed previously, and thus they are not repeated for the sake of brevity.

The source/drain via 380 inherits the geometry of the via opening O41 with a vertical sidewall profile and no tiger tooth-like profile, and thus the source/drain via 380 also has a vertical sidewall profile and no tiger tooth-like profile. In greater detail, the sidewalls of the source/drain via 380 extend linearly through an entire thickness of the ILD layer 370, an entire thickness of the MCESL 360, and an entire thickness of the etch-resistant layer 352, without a slope change.

Figure 45B:
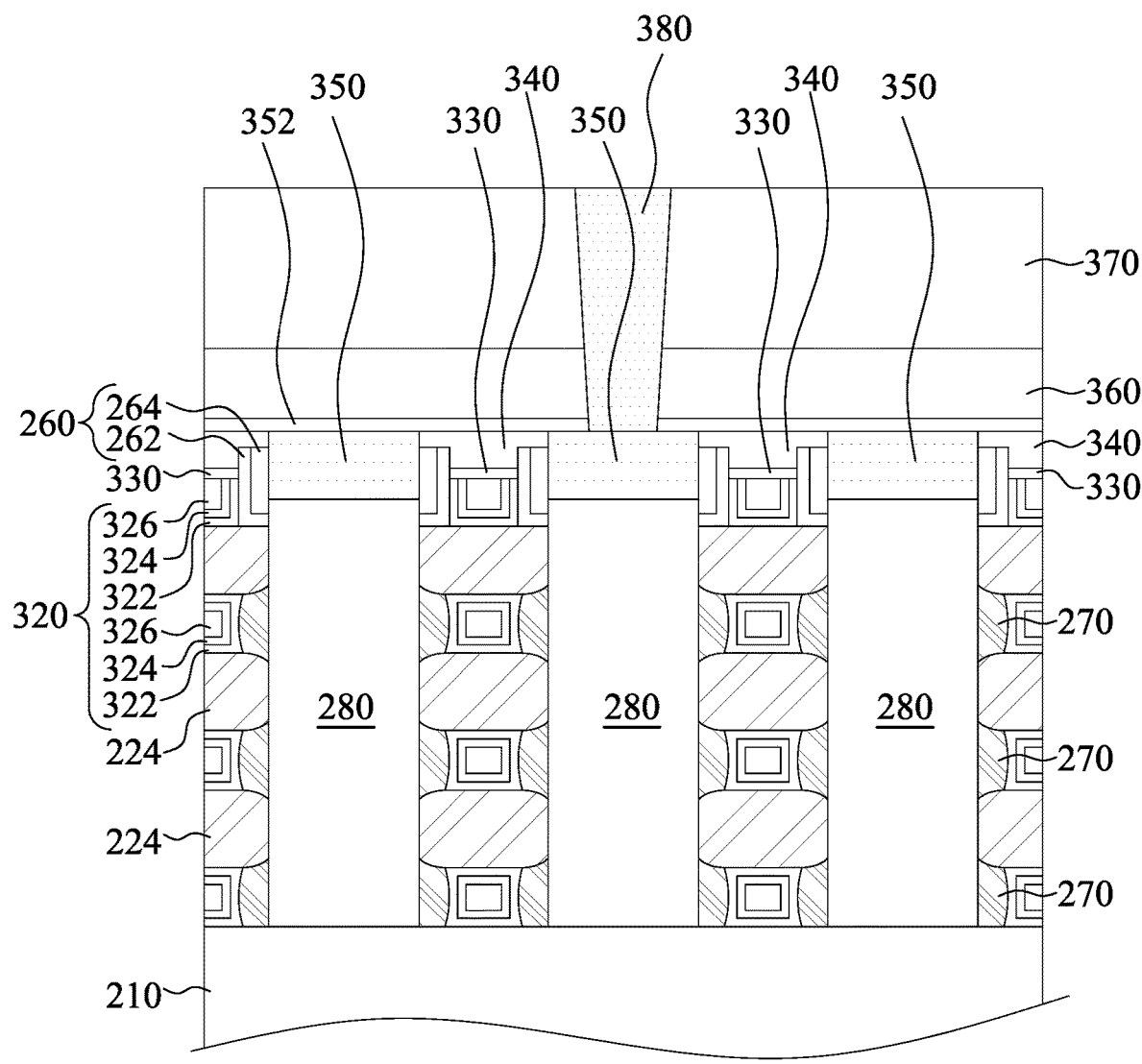

In some embodiments as illustrated in FIG. 45A, the source/drain via 380 may contact a partial region of the source/drain contact 350 and a partial region of the neighboring gate dielectric cap 340 because of inadvertent misalignment during the photolithography and etching processes of forming the source/drain via 380. However, in some other embodiments as illustrated in FIG. 45B, an entirety of the bottom surface of the source/drain via 380 can be in contact with the underlying source/drain contact 350.

FIGS. 46-51 illustrate exemplary cross sectional views of various stages for manufacturing an integrated circuit structure 200a according to some other embodiments of the present disclosure. It is understood that additional operations can be provided before, during, and after processes shown by FIGS. 46-51, and some of the operations described below can be replaced or eliminated, for additional embodiments of the method. The order of the operations/processes may be interchangeable. The same or similar configurations, materials, processes and/or operation as described with FIGS. 26-45B may be employed in the following embodiments, and the detailed explanation may be omitted.

Figure 46:
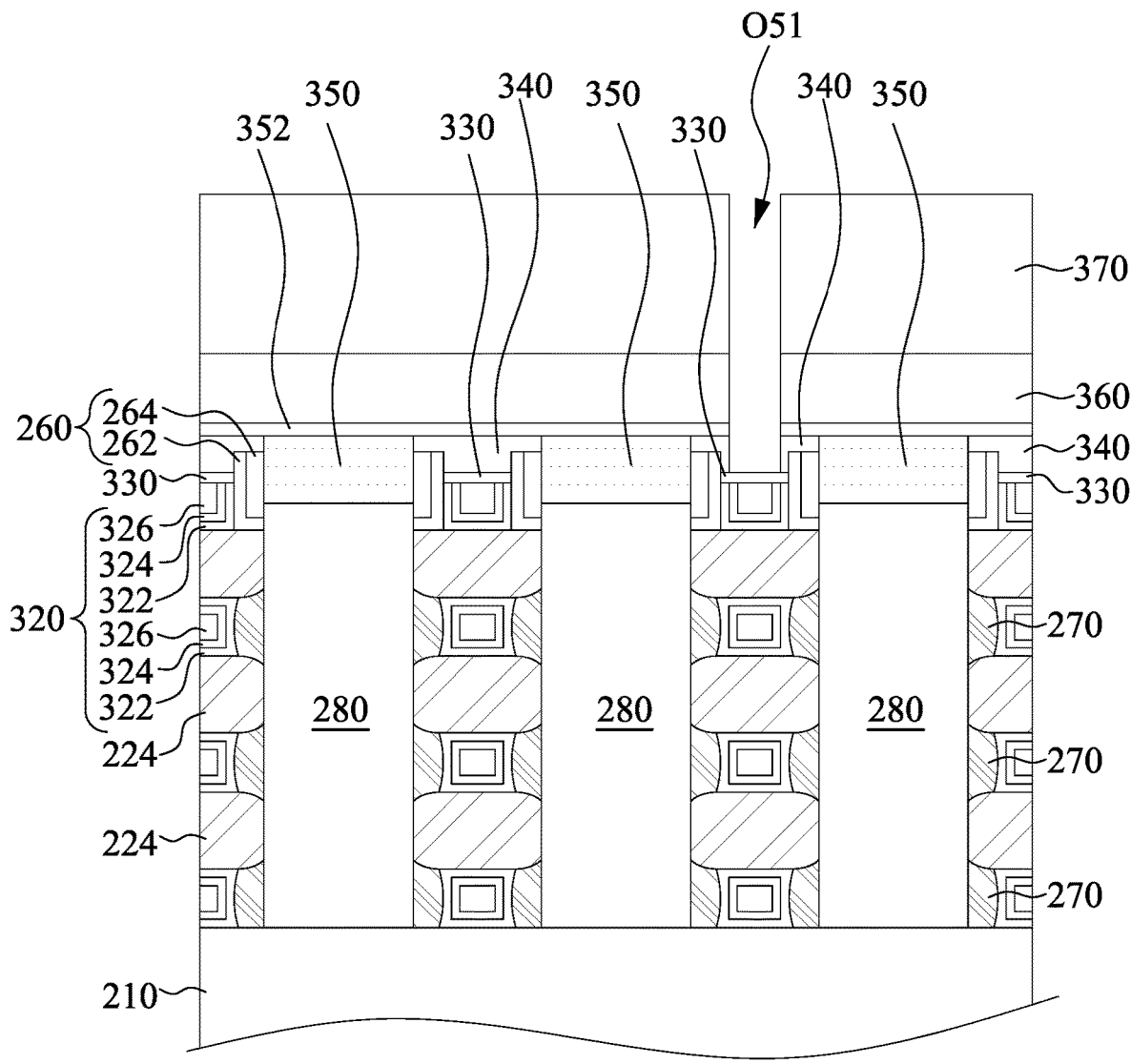
FIGS. 46-51 illustrate exemplary cross sectional views of various stages for manufacturing an integrated circuit structure according to some other embodiments of the present disclosure.

After the structure as shown in FIG. 41 is formed, the ILD layer 370 is patterned to form a gate contact opening O51 extending downward though the ILD layer 370, the MCESL 360 and the dielectric cap 340 to the metal cap 330. The resulting structure is illustrated in FIG. 46. The ILD layer 370 can be patterned by using suitable photolithography and etching techniques.

Figure 47:
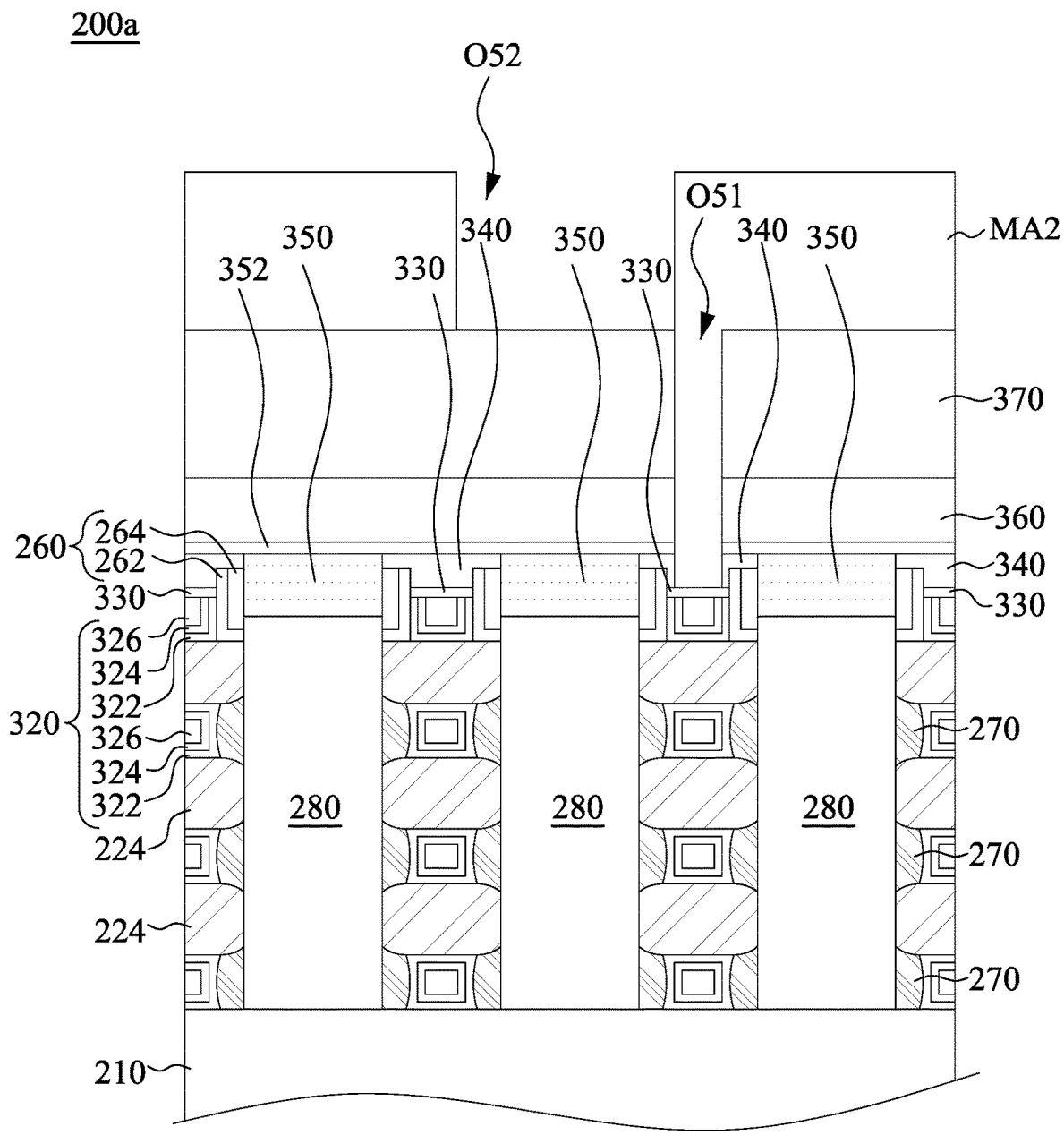

Next, as illustrated in FIG. 47, a patterned mask layer MA2 is formed over the substrate 210 to fill the gate contact opening O51. The patterned mask layer MA2 has an opening O52 directly above a target source/drain contact 350. In some embodiments, the patterned mask layer MA2 may be a photoresist mask formed by suitable photolithography process. For example, the photolithography process may include spin-on coating a photoresist layer over the structure as illustrated in FIG. 46, performing post-exposure bake processes, and developing the photoresist layer to form the patterned mask layer MA2.

Figure 48:
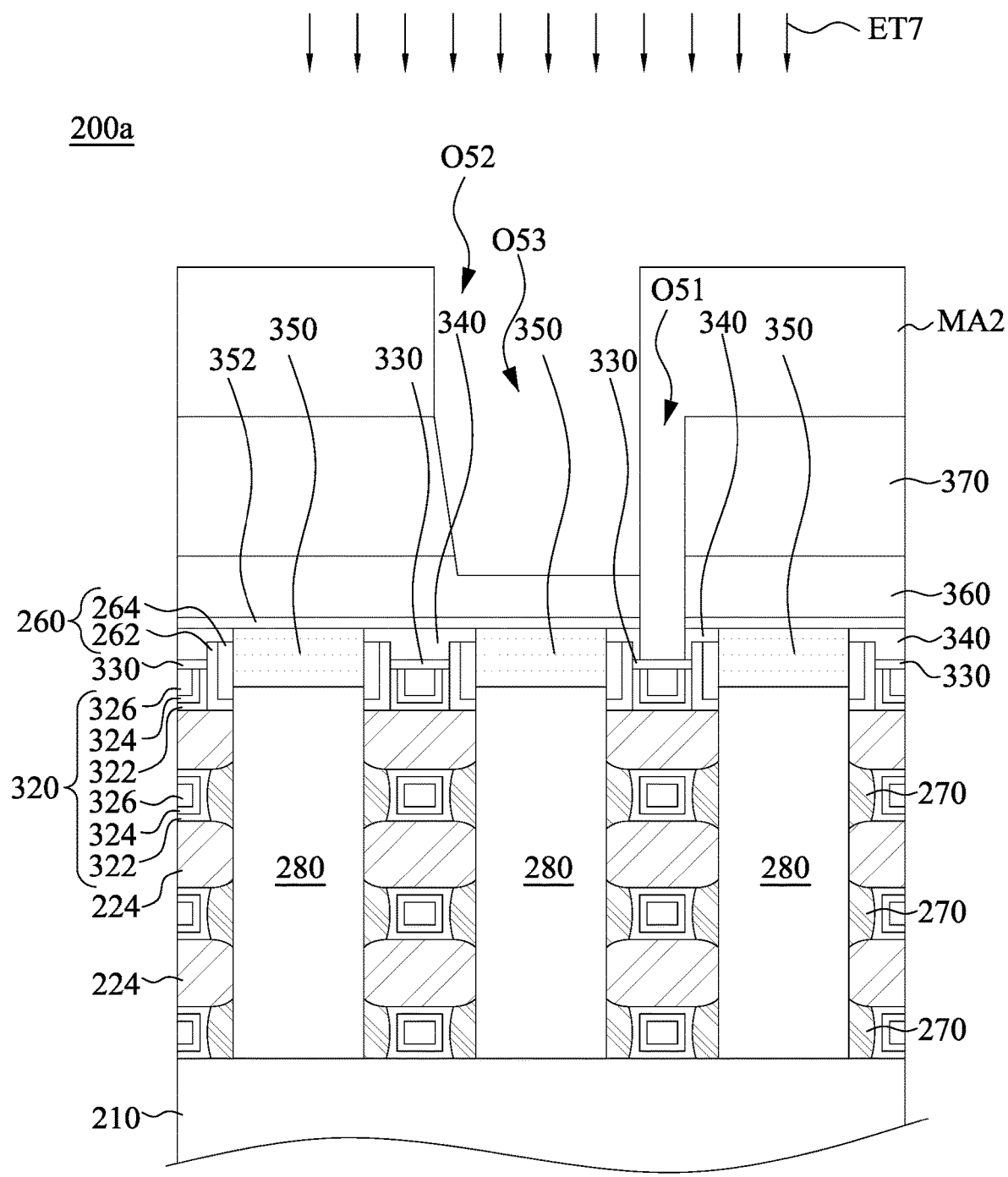

In FIG. 48, a via etching process ET7 is performed to form a via opening O53 extending through the ILD layer 370 by using the patterned mask layer MA2 as an etch mask. The etching duration time of the via etching process ET7 is controlled to stop before punching through the MCESL 360. Process details about the via etching process ET7 are discussed previously with respect to the via etching process ET1, and thus they are not repeated herein for the sake of brevity.

Figure 49:
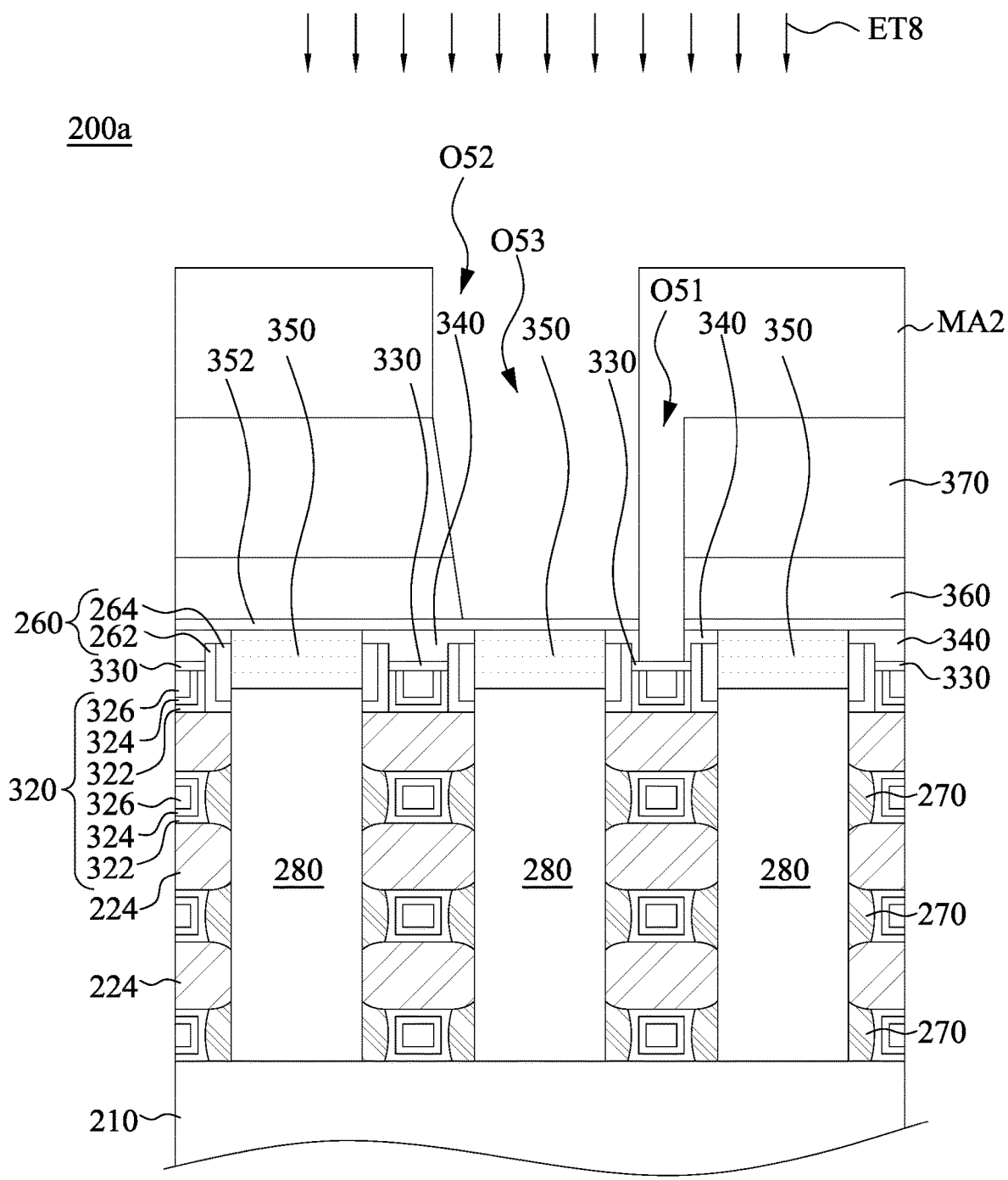
Figure 50:
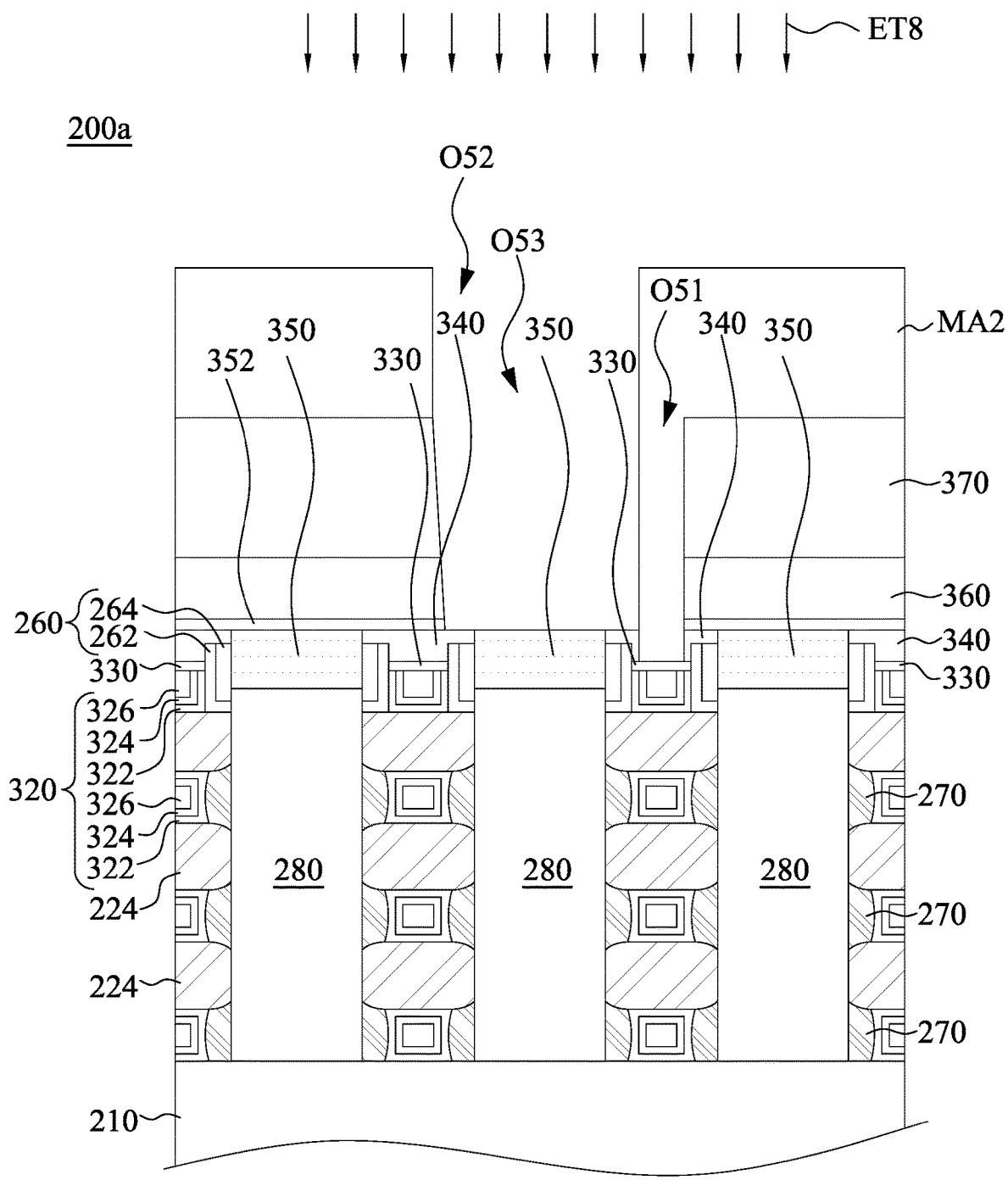

FIG. 49 illustrates a cross-sectional view of an initial stage of an LRM etching process ET8 in accordance with some embodiments of the present disclosure, and FIG. 50 illustrates a cross-sectional view of a final stage of the LRM etching process ET8 in accordance with some embodiments of the present disclosure. The etching time duration of the LRM etching process ET8 is controlled to break through the MCESL 360 and the etch-resistant layer 352, thus deepening or extending the via opening O53 down to the target source/drain contact 350. As a result of the LRM etching process ET8, the source/drain contact 350 gets exposed at a bottom of the deepened via opening O53. Process details about the LRM etching process ET8 are discussed previously with respect to the LRM etching process ET2, and thus they are not repeated herein for the sake of brevity.

The etchant and/or etching conditions of the LRM etching process ET8 are selected in such a way that the etch-resistant layer 352 (e.g., oxide-based material) exhibits a slower etch rate than the MCESL 360 and the gate dielectric caps 340 (e.g., nitride-based material). In this way, the etch-resistant layer 352 can slow down LRM etching process ET8, which in turn will slow down the vertical etch rate and hence the depth increasing in the via opening O53 when the via opening O53 reaches the etch-resistant layer 352. The slowed-down depth increasing thus prevents the tiger tooth-like pattern formed in the deepened via opening O53 (especially in the gate dielectric caps 340 on opposite sides of the target source/drain contact 350), which in turn reduces the risk of leakage current. Moreover, because the etch-resistant layer 352 slows down the vertical etch rate but not the lateral etch rate at lower portions of the via opening O53 when the via opening O53 reaches the etch-resistant layer 352, the LRM etching process ET8 can laterally expand a lower portion of the via opening O53 during etching the etch-resistant layer 352, such that the bottom width of the via opening O53 can be increased, and the sidewall profile of via opening O53 can become more vertical or steeper than before the etch-resistant layer 352 is punched through, as illustrated in FIGS. 49-50.

Figure 51:
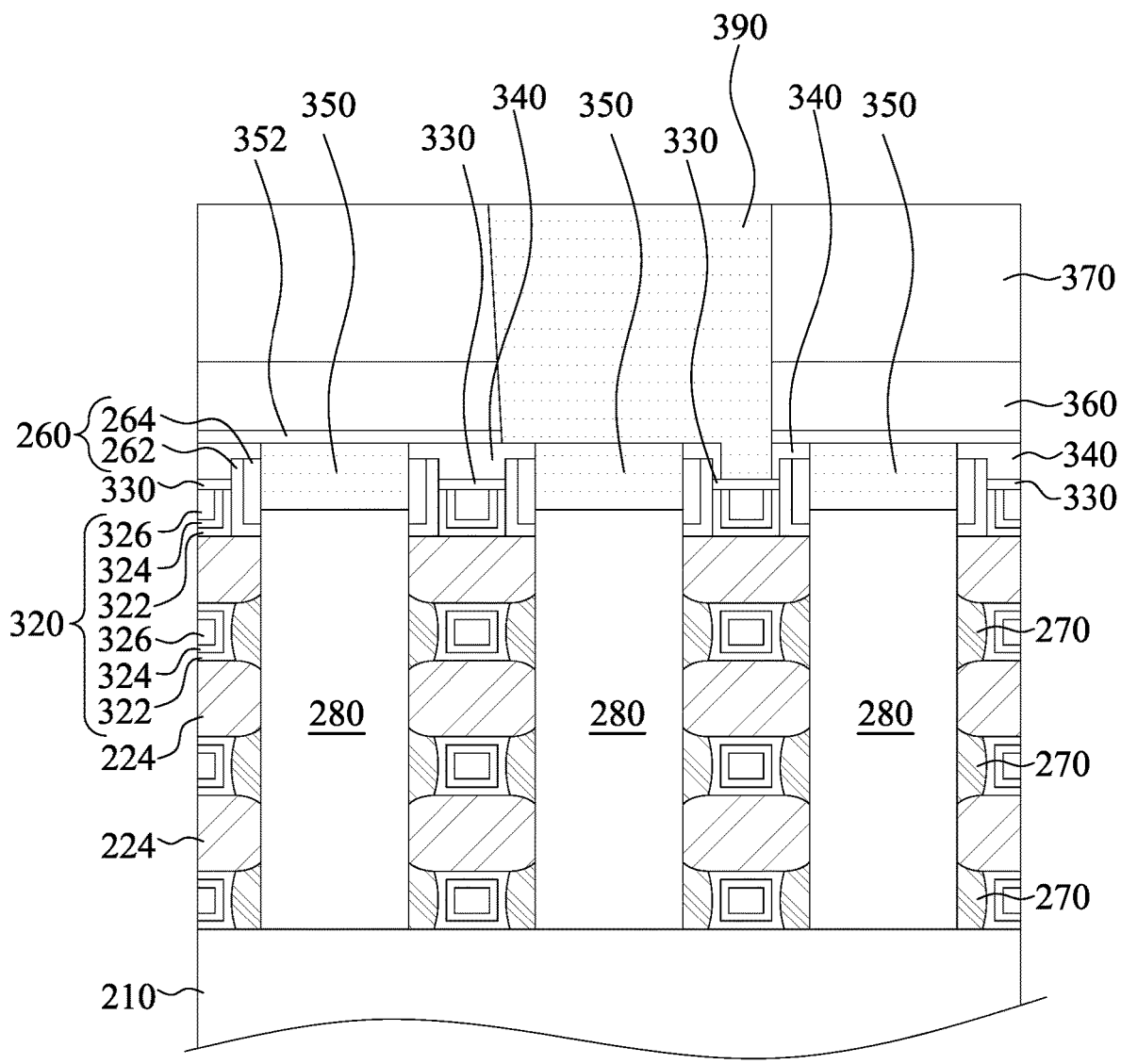

After the LRM etching process ET8 is completed, the patterned mask layer MA2 is removed from the gate contact opening O51 by ashing and/or wet stripping, and then a butted contact 390 is formed to fill both the deepened via opening O53 and the gate contact opening O51. The resulting structure is illustrated in FIG. 51. The gate structure 320 is electrically coupled to the source/drain epitaxial structure 280 through the source/drain contact 350, the butted contact 390, and the gate metal cap 330. Materials and fabrication process details about the butted contact 390 are similar to that about the source/drain vias 150, and thus they are not repeated herein for the sake of brevity.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the depth increasing in source/drain via openings can be slowed down during the LRM etching process, which in turn can result in no or negligible tiger tooth-like recess in a gate dielectric cap next to the target source/drain contact. Another advantage is that the leakage current from source/drain vias to, e.g., gate structures can be reduced because of prevention of the tiger tooth-like profile formed in source/drain vias. Another advantage is that the source/drain via openings can have a more vertical sidewall profile. Another advantage is that the contact resistance between the source/drain vias and source/drain contacts can be reduced because the bottom surface area of the source/drain via with the vertical sidewall profile can be increased as compared with a tapered source/drain via.

In some embodiments, a method comprises forming a gate structure over a semiconductor substrate; forming a gate dielectric cap over the gate structure; forming source/drain contacts over the semiconductor substrate, with the gate dielectric cap laterally between the source/drain contacts; depositing an etch-resistant layer over the gate dielectric cap; depositing a contact etch stop layer over the etch-resistant layer and an interlayer dielectric (ILD) layer over the contact etch stop layer; performing a first etching process to form a via opening extending through the ILD layer and terminating prior to reaching the etch-resistant layer; performing a second etching process to deepen the via opening such that one of the source/drain contacts is exposed, wherein the second etching process etches the etch-resistant layer at a slower etch rate than etching the contact etch stop layer; and depositing a metal material to fill the deepened via opening. In some embodiments, the gate dielectric cap and the contact etch stop layer are nitride-based. In some embodiments, the gate dielectric cap is formed of a same material as the contact etch stop layer. In some embodiments, the etch-resistant layer is oxide-based. In some embodiments, the etch-resistant layer has a thickness less than a thickness of the contact etch stop layer. In some embodiments, the etch-resistant layer has a thickness less than a maximal thickness of the gate dielectric cap. In some embodiments, the etch-resistant layer has a thickness in a range from about 1 Angstroms to about 50 Angstroms. In some embodiments, the etch-resistant layer is deposited using atomic layer deposition (ALD) or plasma enhanced chemical vapor deposition (PECVD). In some embodiments, the first etching process is a plasma etching process using a plasma generated from a hydrogen-free gaseous mixture. In some embodiments, the second etching process is a plasma etching process using a plasma generated from a hydrogen-containing gaseous mixture. In some embodiments, the hydrogen-containing gaseous mixture is a mixture of a fluorine-containing gas and a hydrogen gas. In some embodiments, the fluorine-containing gas is a $CHF_3$ gas, a $CF_4$ gas, a $C_xH_yF_z$ gas, or a combination thereof, wherein x, y and z are greater than zero. In some embodiments, the gate dielectric cap remains substantially intact after the second etching process is completed.

In some embodiments, a method comprises forming a gate structure between gate spacers and over a semiconductor substrate; etching back the gate structure to fall below top ends of the gate spacers; forming a gate dielectric cap over the etched back gate structure; forming a source/drain contact abutting a sidewall of the gate dielectric cap; depositing an etch-resistant layer over the gate dielectric cap and the source/drain contact; depositing in sequence an etch stop layer and an interlayer dielectric (ILD) layer over the etch-resistant layer; performing a first etching process to form a via opening extending through the ILD layer; after the first etching process is completed, performing a second etching process to extend the via opening down to the source/drain contact, wherein after the second etching process etches through the etch-resistant layer, a sidewall profile of the via opening becomes more vertical than before etching the etch-resistant layer; and after performing the second etching process, forming a via structure in the via opening. In some embodiments, the first etching process does not etch the etch-resistant layer. In some embodiments, the etch-resistant layer and the ILD layer are oxide-based, and the etch stop layer and the gate dielectric cap are nitride-based. In some embodiments, the second etching process uses a gas mixture with a hydrogen gas, and the first etching process is free of the hydrogen gas.

In some embodiments, a device comprises source/drain epitaxial structures over a substrate; source/drain contacts over the source/drain epitaxial structures, respectively; a gate structure laterally between the source/drain contacts; a gate dielectric cap over the gate structure and having a bottom surface below top surfaces of the source/drain contacts; an oxide-based etch-resistant layer over the gate dielectric cap; a nitride-based etch stop layer over the oxide-based etch-resistant layer; an interlayer dielectric (ILD) layer over the nitride-based etch stop layer; and a via structure extending through the ILD layer, the nitride-based etch stop layer, and the oxide-based etch-resistant layer to electrically connect with the one of the source/drain contacts. In some embodiments, the oxide-based etch-resistant layer is thinner than the nitride-based etch stop layer. In some embodiments, the oxide-based etch-resistant layer is thinner than the gate dielectric cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate structure over a semiconductor substrate;
   forming a gate dielectric cap over the gate structure;
   forming source/drain contacts over the semiconductor substrate, with the gate dielectric cap between the source/drain contacts;
   depositing an etch-resistant layer over the gate dielectric cap;
   depositing a contact etch stop layer over the etch-resistant layer and an interlayer dielectric (ILD) layer over the contact etch stop layer;
   performing a first etching process to form a via opening extending through the ILD layer and terminating prior to reaching the etch-resistant layer;
   performing a second etching process to deepen the via opening such that one of the source/drain contacts is exposed, wherein the second etching process etches the etch-resistant layer at a slower etch rate than etching the contact etch stop layer, wherein the second etching process stops when a bottom of the via opening reaches a top surface of the gate dielectric cap; and
   depositing a metal material to fill the deepened via opening.

2. The method of claim 1, wherein the gate dielectric cap and the contact etch stop layer are nitride-based.

3. The method of claim 1, wherein the gate dielectric cap is formed of a same material as the contact etch stop layer.

4. The method of claim 1, wherein the etch-resistant layer is oxide-based.

5. The method of claim 1, wherein the etch-resistant layer has a thickness less than a thickness of the contact etch stop layer.

6. The method of claim 1, wherein the etch-resistant layer has a thickness less than a maximal thickness of the gate dielectric cap.

7. The method of claim 1, wherein the etch-resistant layer has a thickness in a range from about 1 Angstroms to about 50 Angstroms.

8. The method of claim 1, wherein the etch-resistant layer is deposited using atomic layer deposition (ALD) or plasma enhanced chemical vapor deposition (PECVD).

9. The method of claim 1, wherein the first etching process is a plasma etching process using a plasma generated from a hydrogen-free gaseous mixture.

10. The method of claim 1, wherein the second etching process is a plasma etching process using a plasma generated from a hydrogen-containing gaseous mixture.

11. The method of claim 10, wherein the hydrogen-containing gaseous mixture is a mixture of a fluorine-containing gas and a hydrogen gas.

12. The method of claim 11, wherein the fluorine-containing gas is a $CHF_3$ gas, a $CF_4$ gas, a $C_xH_yF_z$ gas, or a combination thereof, wherein x, y and z are greater than zero.

13. The method of claim 1, wherein the gate dielectric cap remains substantially intact after the second etching process is completed.

14. A method, comprising:
    forming a gate structure between gate spacers and over a semiconductor substrate;
    etching back the gate structure to fall below top ends of the gate spacers;
    forming a gate dielectric cap over the etched back gate structure;
    forming a source/drain contact in contact with a sidewall of the gate dielectric cap;
    depositing an etch-resistant layer over the gate dielectric cap and the source/drain contact;
    depositing in sequence an etch stop layer and an interlayer dielectric (ILD) layer over the etch-resistant layer;
    performing a first etching process to form a via opening extending through the ILD layer;
    after the first etching process is completed, performing a second etching process to extend the via opening down to the source/drain contact, wherein after the second etching process etches through the etch-resistant layer, a sidewall profile of the via opening becomes more vertical than before etching the etch-resistant layer; and
    after performing the second etching process, forming a via structure in the via opening.

15. The method of claim 14, wherein the first etching process does not etch the etch-resistant layer.

16. The method of claim 14, wherein the etch-resistant layer and the ILD layer are oxide-based, and the etch stop layer and the gate dielectric cap are nitride-based.

17. The method of claim 14, wherein the second etching process uses a gas mixture with a hydrogen gas, and the first etching process is free of the hydrogen gas.

18. A method, comprising:
    forming source/drain regions over a substrate;
    forming a gate structure laterally between the source/drain regions;
    forming gate spacers on opposite sidewalls of the gate structure;
    forming a dielectric cap over the gate structure;
    forming source/drain contacts over the source/drain regions, the source/drain contacts having top surfaces higher than a bottom surface of the dielectric cap;
    forming an oxide-based etch-resistant layer over the dielectric cap;
    forming a nitride-based etch stop layer over the oxide-based etch-resistant layer, wherein the oxide-based etch-resistant layer is separated from a top surface of one of the gate spacers by a first distance, and the oxide-based etch-resistant layer is separated from a top surface of the gate structure by a second distance greater than the first distance;
    forming an interlayer dielectric (ILD) layer over the nitride-based etch stop layer; and
    forming a via structure extending through the ILD layer, the nitride-based etch stop layer, and the oxide-based etch-resistant layer to electrically connect with one of the source/drain contacts.

19. The method of claim 18, wherein the nitride-based etch stop layer is thicker than the oxide-based etch-resistant layer.

20. The method of claim 18, wherein the oxide-based etch-resistant layer is thinner than the dielectric cap.

* * * * *